(12) United States Patent
Oh et al.

(10) Patent No.: US 11,532,794 B2
(45) Date of Patent: Dec. 20, 2022

(54) COMPOUND AND LIGHT-EMITTING DEVICE INCLUDING THE SAME

(71) Applicant: Samsung Display Co., Ltd., Yongin-si (KR)

(72) Inventors: Chanseok Oh, Yongin-si (KR); Sunyoung Pak, Yongin-si (KR); Junha Park, Yongin-si (KR); Hankyu Pak, Yongin-si (KR); Jangyeol Baek, Yongin-si (KR); Munki Sim, Yongin-si (KR); Hyoyoung Lee, Yongin-si (KR); Minjung Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 275 days.

(21) Appl. No.: 17/013,654

(22) Filed: Sep. 7, 2020

(65) Prior Publication Data

US 2021/0126196 A1 Apr. 29, 2021

(30) Foreign Application Priority Data

Oct. 28, 2019 (KR) .......................... 10-2019-0134798

(51) Int. Cl.
| | |
|---|---|
| *H01L 51/00* | (2006.01) |
| *H01L 51/50* | (2006.01) |
| *H01L 51/05* | (2006.01) |
| *H01L 51/52* | (2006.01) |
| *C09K 11/06* | (2006.01) |
| *H01L 51/42* | (2006.01) |

(52) U.S. Cl.
CPC ............ *H01L 51/008* (2013.01); *C09K 11/06* (2013.01); *H01L 51/055* (2013.01); *H01L 51/5024* (2013.01); *H01L 51/5206* (2013.01); *H01L 51/5221* (2013.01); *C09K 2211/1014* (2013.01); *H01L 51/4273* (2013.01); *H01L 51/5056* (2013.01); *H01L 51/5092* (2013.01)

(58) Field of Classification Search
CPC ...... H01L 51/008; H01L 51/0071; C07F 5/02; C09K 2211/1014; C09K 2211/1096
See application file for complete search history.

(56) References Cited

U.S. PATENT DOCUMENTS

| | | |
|---|---|---|
| 8,785,636 B2 | 7/2014 | Parham et al. |
| 9,093,650 B2 | 7/2015 | Kim et al. |
| 10,326,111 B2 | 6/2019 | Yoo et al. |
| 10,374,166 B2 | 8/2019 | Hatakeyama et al. |
| 2017/0018600 A1 | 1/2017 | Ito et al. |
| 2017/0200899 A1 | 7/2017 | Kim et al. |

(Continued)

FOREIGN PATENT DOCUMENTS

| | | |
|---|---|---|
| KR | 10-2016-0119683 | 10/2016 |
| KR | 10-1816938 | 1/2018 |

(Continued)

OTHER PUBLICATIONS

Highly emissive excitons with reduced exchange energy in thermally activated delayed fluorescent molecules, Nature Communications. Volume 10, Article No. 597 (Feb. 5, 2019).

*Primary Examiner* — Alexander C Kollias
(74) *Attorney, Agent, or Firm* — H.C. Park & Associates, PLC

(57) ABSTRACT

A compound of Formula 1, as disclosed herein, is useful in an organic light emitting device and apparatuses including the same.

19 Claims, 1 Drawing Sheet

10

| 190 |
|---|
| 150 |
| 110 |

(56) References Cited

U.S. PATENT DOCUMENTS

| | | |
|---|---|---|
| 2018/0069182 A1 | 3/2018 | Hatakeyama et al. |
| 2019/0058124 A1 | 2/2019 | Hatakeyama et al. |
| 2019/0165279 A1 | 5/2019 | Fujita |
| 2019/0207112 A1 | 7/2019 | Hatakeyama et al. |
| 2020/0020859 A1* | 1/2020 | Hatakeyama ........... C07F 5/027 |
| 2021/0202851 A1* | 7/2021 | Nakanotani ............ C09K 11/06 |
| 2021/0351364 A1* | 11/2021 | Hatakeyama ....... H01L 51/5024 |

FOREIGN PATENT DOCUMENTS

| | | |
|---|---|---|
| KR | 10-2018-0108604 | 10/2018 |
| KR | 10-2018-0134850 | 12/2018 |
| KR | 10-2019-0062177 | 6/2019 |
| WO | 2018-212169 | 11/2018 |

\* cited by examiner

10

| 190 |
| --- |
| 150 |
| 110 |

COMPOUND AND LIGHT-EMITTING DEVICE INCLUDING THE SAME

CROSS-REFERENCE TO RELATED APPLICATION

This application claims priority from and the benefit of Korean Patent Application No. 10-2019-0134798, filed on Oct. 28, 2019, which is hereby incorporated by reference for all purposes as if fully set forth herein.

BACKGROUND

Field

Exemplary implementations of the invention relate generally to a compound and, more particularly, to a compound useful in an organic light emitting device and apparatuses including the same.

Discussion of the Background

Organic light-emitting devices are self-emission devices that have wide viewing angles, high contrast ratios, short response times, and excellent characteristics in terms of brightness, driving voltage, and response speed, compared to devices in the art.

An example of the organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state, thereby generating light.

The above information disclosed in this Background section is only for understanding of the background of the inventive concepts, and, therefore, it may contain information that does not constitute prior art.

SUMMARY

Applicant realized that many existing organic light-emitting devices suffer from luminescent inefficiencies.

Compounds for organic light-emitting devices and apparatuses including the same made according to the principles and exemplary implementations of the invention provide a luminescent material having better efficiency characteristics than known compounds.

For example, the compound of Formula 1 according to some exemplary embodiments of the invention is structurally distinct by further activating multiple resonance and has a high f value and a lower $\Delta E_{ST}$. Thus, when an emission layer of an organic light-emitting device includes the compound of Formula 1 according to at least one exemplary embodiment, efficiency is increased. The compound of Formula 1 according to some exemplary embodiments functions as a delayed fluorescence dopant.

Additional features of the inventive concepts will be set forth in the description which follows, and in part will be apparent from the description, or may be learned by practice of the inventive concepts.

According to one aspect of the invention, light-emitting device includes: a first electrode; a second electrode facing the first electrode; and an intermediate layer disposed between the first electrode and the second electrode and comprising an emission layer, wherein the first electrode and the second electrode each independently include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), indium tin oxide (ITO), zinc oxide (ZnO), tin oxide (SnO2) and indium zinc oxide (IZO), and the intermediate layer comprises the compound of Formula 1:

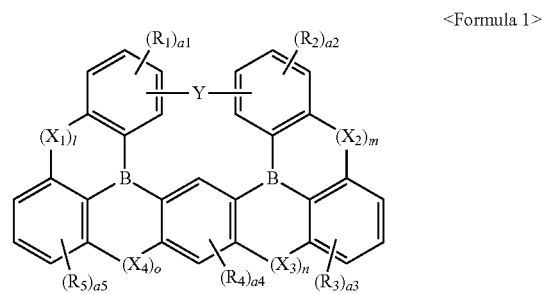

<Formula 1> wherein, in Formula 1:

Y is O, S, or Se;

$X_1$ is $NR_{11}$, O, or S, $X_2$ is $NR_{12}$, O, or S, $X_3$ is $NR_{13}$, O, or S, and $X_4$ is $NR_{14}$, O, or S;

l, m, n, and o are each, independently from one another, 0 or 1, and at least one of l, m, n, and o is 1;

$R_1$ to $R_5$ and $R_{11}$ to $R_{14}$ are each, independently from one another, hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic fused polycyclic group, a substituted or unsubstituted monovalent non-aromatic fused heteropolycyclic group, —Si($Q_1$)($Q_2$)($Q_3$), —N($Q_1$)($Q_2$), —P($Q_1$)($Q_2$), —C(=O)($Q_1$), —S(=O)$_2$($Q_1$), or —P(=O)($Q_1$)($Q_2$);

a1, a2, a3, and a5 are each, independently from one another, 1, 2, or 3;

a4 is 1 or 2;

two neighboring substituents of $R_1$ to $R_5$ and $R_{11}$ to $R_{14}$ are linked to each other to form a ring, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic fused polycyclic group, and the substituted monovalent non-aromatic fused heteropolycyclic group is:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each, independently from one another, substituted with at least one of deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{11}$)($Q_{12}$)($Q_{13}$), —N($Q_{11}$)($Q_{12}$), —C(=O)($Q_{11}$), —S(=O)$_2$($Q_{11}$), and —P(=O)($Q_{11}$)($Q_{12}$); and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, or a monovalent non-aromatic fused heteropolycyclic group, each, independently from one another, optionally substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{21}$)($Q_{22}$)($Q_{23}$), —N($Q_{21}$)($Q_{22}$), —C(=O)($Q_{21}$), —S(=O)$_2$($Q_{21}$), —P(=O)($Q_{21}$)($Q_{22}$), —Si($Q_{31}$)($Q_{32}$)($Q_{33}$), —N($Q_{31}$)($Q_{32}$), —C(=P)($Q_{31}$), —S(=O)$_2$($Q_{31}$), and —P(=O)($Q_{31}$)($Q_{32}$);

wherein $Q_1$ to $Q_3$, $Q_{11}$ to $Q_{13}$, $Q_{21}$ to $Q_{23}$, and $Q_{31}$ to $Q_{33}$ are each, independently from one another, hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, a monovalent non-aromatic fused heteropolycyclic group, a biphenyl group, or a terphenyl group.

The variables l and m may be 1.

The variables l, m, and o may be 1, and n may be 0, or l, m, and n may be 1, and o may be 0.

The variables l, m, n, and o may be 1.

The variable Y may be O, and $R_1$ to $R_5$ and $R_{11}$ to $R_{14}$ may each, independently from one another, be a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic fused polycyclic, or —N($Q_1$)($Q_2$), with $Q_1$ and $Q_2$ defined herein.

The variables $R_{11}$ to $R_{14}$ may each, independently from one another, be a substituted or unsubstituted $C_6$-$C_{60}$ aryl group, a substituted or unsubstituted $C_1$-$C_{60}$ heteroaryl group, or a substituted or unsubstituted monovalent non-aromatic fused polycyclic.

The variables $R_{11}$ to $R_{14}$ may each, independently from one another, be various groups and their substituents as defined herein.

The variables $R_1$ to $R_5$ and $R_{11}$ to $R_{14}$ may each, independently from one another, be hydrogen, deuterium, a methyl group, an ethyl group, a propyl group, an isobutyl group, a sec-butyl group, a ter-butyl group, a pentyl group, an iso-amyl group, or a hexyl group, or a group of Formula 2a or 2b, as defined herein.

The compound of Formula 1 may be a compound of Formula 2 or 3, as defined herein.

The compound of Formula 1 may be a compound of Formula 4 or 5, as defined herein.

The compound of Formula 1 may be a compound of Formula 6 or 7, as defined herein.

The compound of Formula 1 may be one of the compounds of the chemical structures 1-96, as defined herein.

The first electrode may include an anode, the second electrode may include a cathode, and the intermediate layer may include: i) a hole transport region disposed between the first electrode and the emission layer and including a hole injection layer, a hole transport layer, an emission auxiliary layer, an electron blocking layer, or any combination thereof; and ii) an electron transport region disposed between the emission layer and the second electrode and including a hole blocking layer, an electron transport layer, an electron injection layer, or any combination thereof.

The emission layer may include the compound of Formula 1, as defined herein.

The emission layer may include a fluorescent emission layer.

The emission layer may include a dopant, and the dopant may include the compound of Formula 1, as defined herein.

The compound may include a delayed fluorescence dopant of Formula 1, as defined herein.

The emission layer may include a blue emission layer.

An electronic apparatus may include a thin-film transistor and a light-emitting device including: a first electrode; a second electrode facing the first electrode; and an intermediate layer disposed between the first electrode and the second electrode and including an emission layer, wherein the intermediate layer comprises the compound of claim 1, and wherein the thin-film transistor may include a source electrode, a drain electrode, an activation layer, and a gate electrode, and the first electrode of the light-emitting device may be electrically connected to one of the source electrode and the drain electrode of the thin-film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 1 is a schematic cross-sectional diagram of an exemplary embodiment of an organic light-emitting device constructed according to principles of the invention.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A di aza boran naphtho anthracene (DABNA) based thermally activated delayed fluorescence (TADF) compound of the related art has TADF characteristics by separating highest occupied molecular orbital (HOMO) and lowest unoccupied molecular orbital (LUMO) by multiple resonance between an N atom and a B atom, has high luminescence efficiency due to a large overlap between HOMO and LUMO, and has a small full width at the half maximum (FWHM) and stokes shift due to a small change in the structure before and after transition.

However, due to a relatively large $\Delta E_{ST}$ value, an exciton lifetime (Tau) value is large, resulting in large roll-off under a high current density load.

The addition of a boron atom results in a "short-range charge transfer (CT)" phenomenon that further increases HOMO/LUMO separation in which intersecting atoms are separated from each other. When the molecular plane is fused widely, delocalization may be enlarged and polarizability may be increased, thereby further increasing an f value, resulting in high efficiency in device manufacturing.

A compound represented by Formula 1 according to an aspect is as follows.

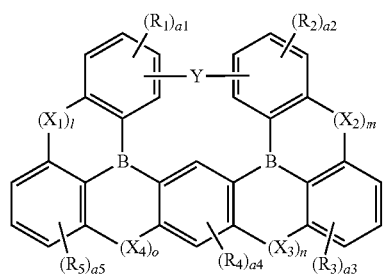

<Formula 1>

In Formula 1,

Y may be O, S, or Se, $X_1$ may be $NR_{11}$, O, or S, $X_2$ may be $NR_{12}$, O, or S, $X_3$ may be $NR_{13}$, O, or S, and $X_4$ may be $NR_{14}$, O, or S, l, m, n, and o may each independently be 0 or 1, and at least one of l, m, n, and o may be 1, $R_1$ to $R_5$ and $R_{11}$ to $R_{14}$ may each independently be selected from hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —P($Q_1$)($Q_2$), —C(=O)($Q_1$), —S(=O)$_2$($Q_1$), and —P(=O)($Q_1$)($Q_2$), a1, a2, a3, and a5 may each independently be an integer from 1 to 3, a4 may be 1 or 2, two neighboring substituents of $R_1$ to $R_5$ and $R_{11}$ to $R_{14}$ may be linked to each other to form a ring, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$—$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

Formula 1 according to an exemplary embodiment includes one or more boron atom compared to the DABNA-based compound having one boron of the related art. Also, molecular plane is widely fused and the delocalization is enlarged such that polarizability is increased and an f value is further increased. Also, due to a linker Y as a hetero atom at the center (especially, when Y is O), the delocalization is further expanded and the multiple resonance becomes greater.

In one or more exemplary embodiments, a compound of Formula 1 may have an f value of about 0.3 to about 0.8.

In one or more exemplary embodiments, when a1 is 2 or more, a plurality of $R_1$(s) may be equal to or different from each other, and adjacent $R_1$(s) may be connected to each other to form a ring. When a2 is 2 or more, a plurality of $R_2(s)$ may be equal to or different from each other, and adjacent $R_2(s)$ may be connected to each other to form a ring. When a3 is 2 or more, a plurality of $R_3(s)$ may be equal to or different from each other, and adjacent $R_3(s)$ may be connected to each other to form a ring. When a4 is 2 or more, a plurality of $R_4(s)$ may be equal to or different from each other, and adjacent $R_4(s)$ may be connected to each other to form a ring. When a5 is 2 or more, a plurality of $R_5(s)$ may be equal to or different from each other, and adjacent $R_5(s)$ may be connected to each other to form a ring. In one or more exemplary embodiments, the plurality of $R_1(s)$ is connected to each other to form a carbazole.

In one or more exemplary embodiments, in Formula 1, each of l and m may be 1.

In one or more exemplary embodiments, in Formula 1, at least one of l and o may be 1, and at least one of m and n may be 1.

In one or more exemplary embodiments, in Formula 1, Y may be O, each of l and m may be 1, $X_1$ may be $NR_{11}$ or O, and $X_2$ may be $NR_{12}$ or O.

In one or more exemplary embodiments, in Formula 1, l, m, and o may be 1, and n may be 0, or l, m, and n may be 1, and o may be 0.

In one or more exemplary embodiments, in Formula 1, Y may be O, l, m, and o may be 1, n may be 0, $X_1$ may be $NR_{11}$ or O, $X_2$ may be $NR_{12}$ or O, and $X_4$ may be $NR_{14}$ or O, or l, m, and n may be 1, o may be 0, $X_1$ may be $NR_{11}$ or O, $X_2$ may be $NR_{12}$ or O, and $X_3$ may be $NR_{13}$ or O.

In one or more exemplary embodiments, in Formula 1, each of l, m, n, and o may be 1.

In one or more exemplary embodiments, in Formula 1, each of l, m, n, and o may be 1, $X_1$ may be $NR_{11}$ or O, $X_2$ may be $NR_{12}$ or O, $X_3$ may be $NR_{13}$ or O, and $X_4$ may be $NR_{14}$ or O.

In one or more exemplary embodiments, Y may be O, and $R_1$ to $R_5$ and $R_{11}$ to $R_{14}$ may each independently be selected from a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic, and —$N(Q_1)(Q_2)$.

In one or more exemplary embodiments, $R_{11}$ to $R_{14}$ may each independently be a substituted or unsubstituted $C_6$-$C_{60}$ aryl group, a substituted or unsubstituted $C_1$-$C_{60}$ heteroaryl group, or a substituted or unsubstituted monovalent non-aromatic condensed polycyclic.

In one or more exemplary embodiments, $R_{11}$ to $R_{14}$ may each independently be selected from: a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, an imidazolyl group, a pyrazolyl group, a thiazolyl group, an isothiazolyl group, an oxazolyl group, an isoxazolyl group, a thiadiazolyl group, an oxadiazolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, an imidazolyl group, a pyrazolyl group, a thiazolyl group, an isothiazolyl group, an oxazolyl group, an isoxazolyl group, a thiadiazolyl group, an oxadiazolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, an imidazolyl group, a pyrazolyl group, a thiazolyl group, an isothiazolyl group, an oxazolyl group, an isoxazolyl group, a thiadiazolyl group, an oxadiazolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —$Si(Q_{31})(Q_{32})(Q_{33})$, —$N(Q_{31})(Q_{32})$, —$C(=O)(Q_{31})$, —$S(=O)_2(Q_{31})$, and —$P(=O)(Q_{31})(Q_{32})$.

In one or more exemplary embodiments, $R_1$ to $R_5$ and $R_{11}$ to $R_{14}$ may each independently be selected from hydrogen, deuterium, a methyl group, an ethyl group, a propyl group, an isobutyl group, a sec-butyl group, a ter-butyl group, a pentyl group, an iso-amyl group, a hexyl group, and Formulae 2a to 2b:

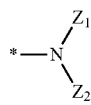

2a

-continued

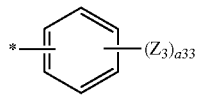
2b

In Formulae 2a to 2b, $Z_1$ to $Z_3$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, an imidazolyl group, a pyrazolyl group, a thiazolyl group, an isothiazolyl group, an oxazolyl group, an isoxazolyl group, a thiadiazolyl group, an oxadiazolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, a33 may be an integer from 1 to 5, and \* indicates a binding site to neighboring atom.

In one or more exemplary embodiments, Formula 1 may be represented by Formula 2 or 3:

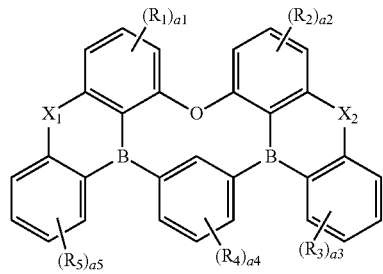
<Formula 2>

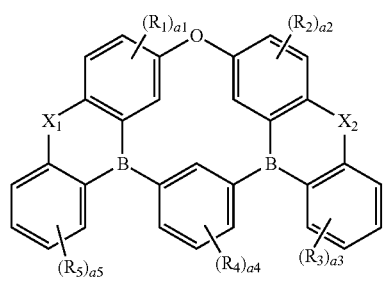
<Formula 3>

In Formulae 2 and 3, $R_1$ to $R_5$, $X_1$, $X_2$, and a1 to a5 are the same as described in connection with Formula 1.

In one or more exemplary embodiments, Formula 1 may be represented by Formula 4 or 5:

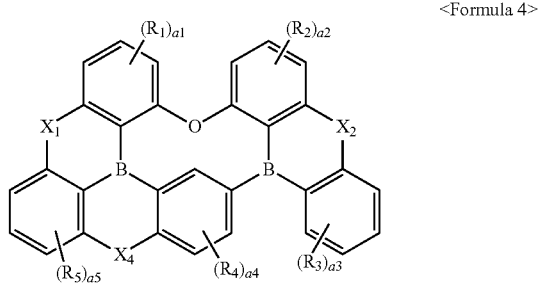
<Formula 4>

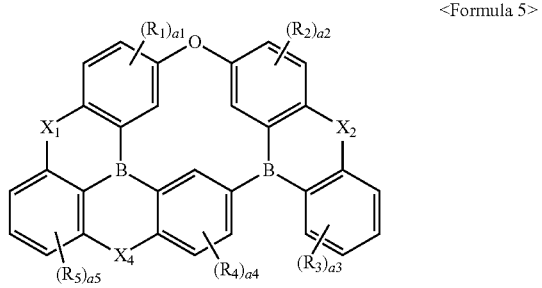
<Formula 5>

In Formulae 4 and 5, $R_1$ to $R_5$, $X_1$, $X_2$, $X_4$, and a1 to a5 are the same as described in connection with Formula 1.

In one or more exemplary embodiments, Formula 1 may be represented by Formula 6 or 7:

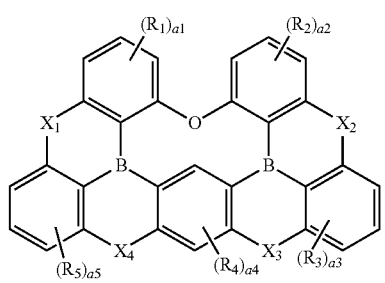
<Formula 6>

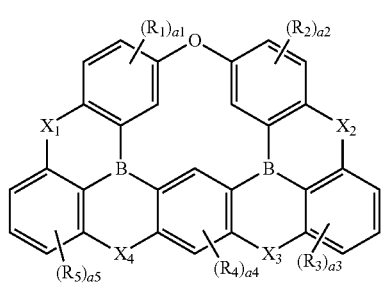
<Formula 7>

In Formulae 6 and 7, $R_1$ to $R_5$, $X_1$ to $X_4$, and a1 to a5 are the same as described in connection with Formula 1.

In one or more exemplary embodiments, a compound represented by Formula 1 may be any one of compounds below:

1
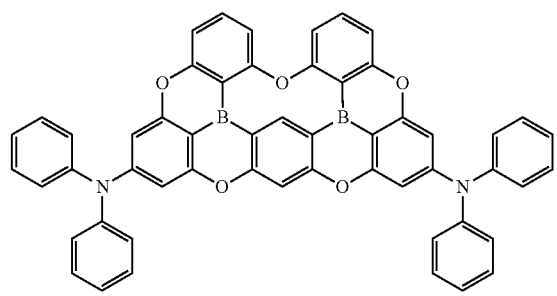
2
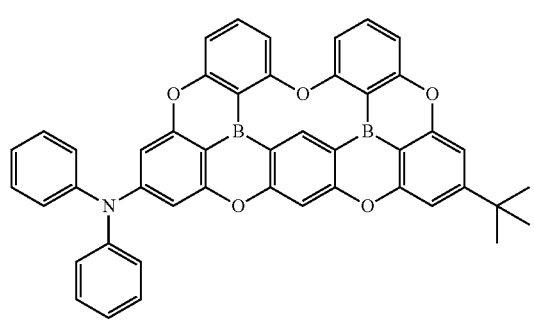
3
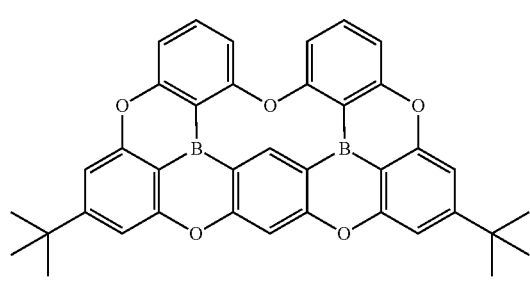
4
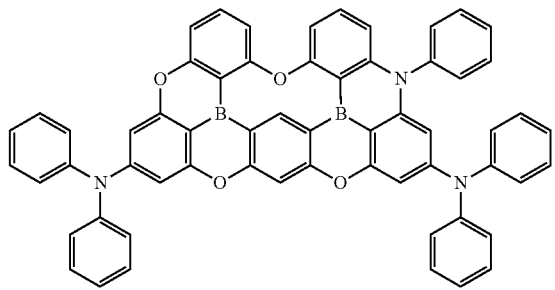
5
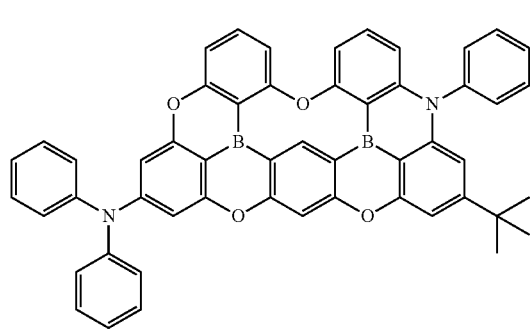
6
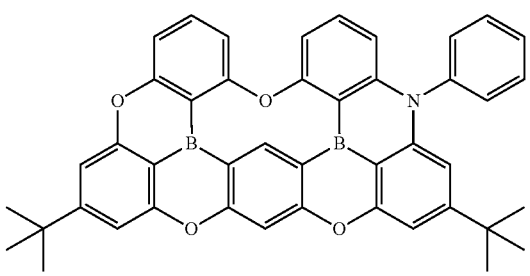
7
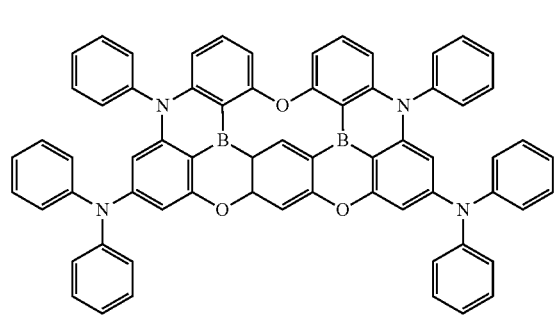
8
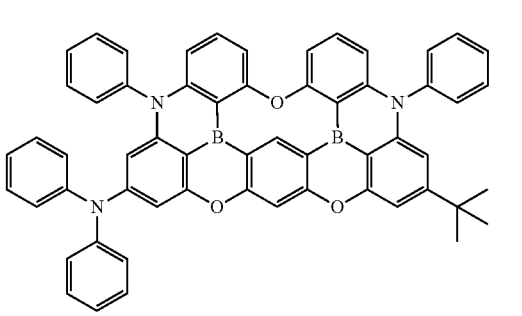
9
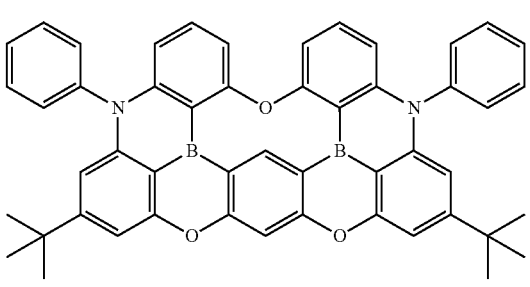
10
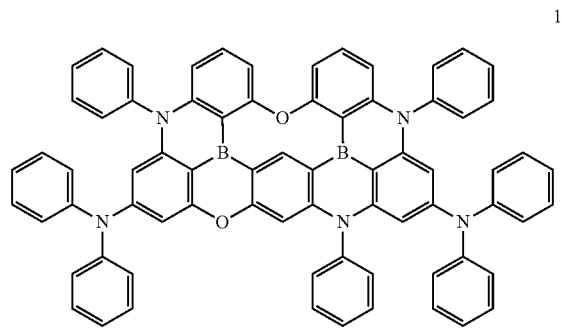

11
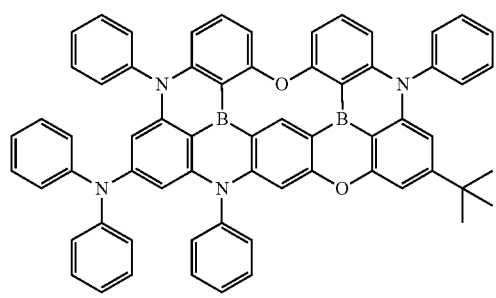
12
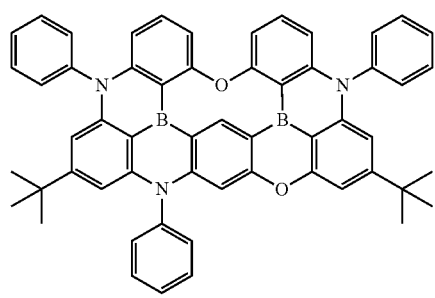
13
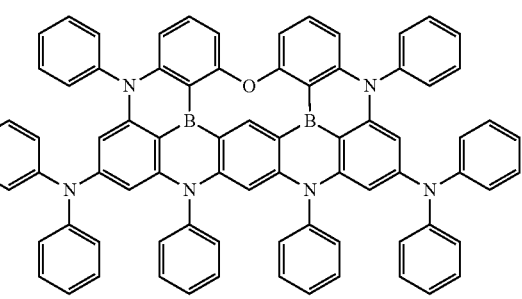
14
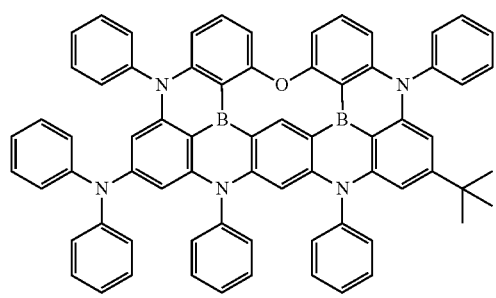
15
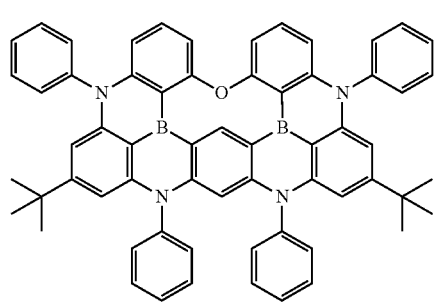
16
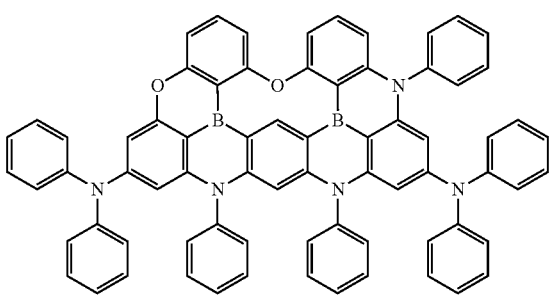
17
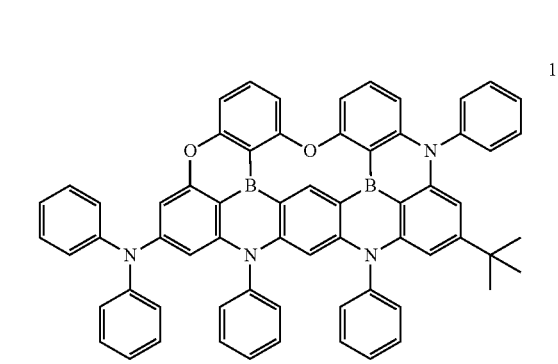
18
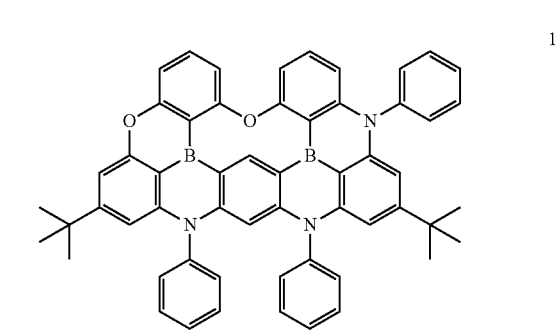
19
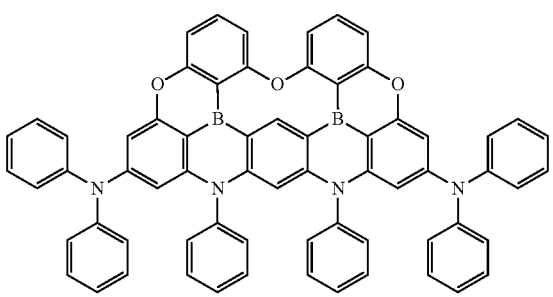
20
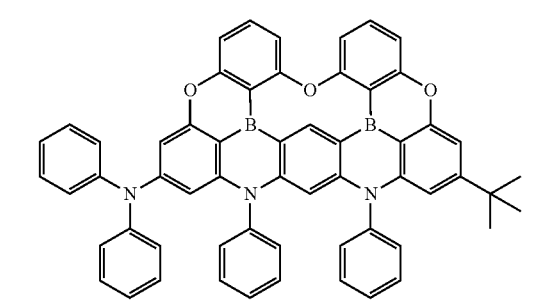

-continued
21
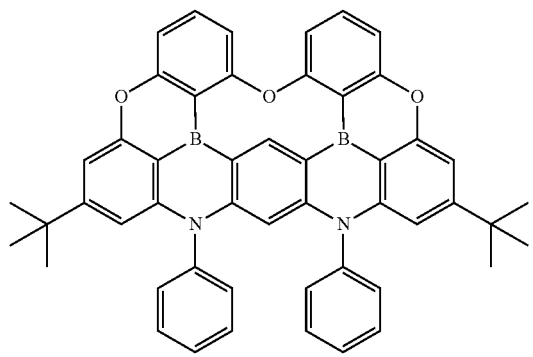
22
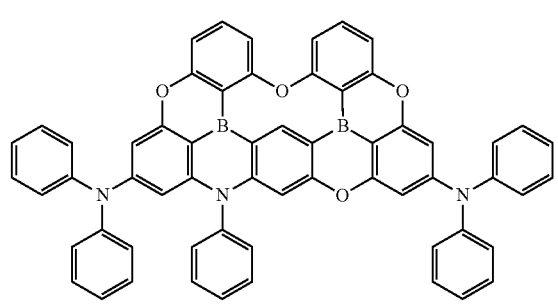
23
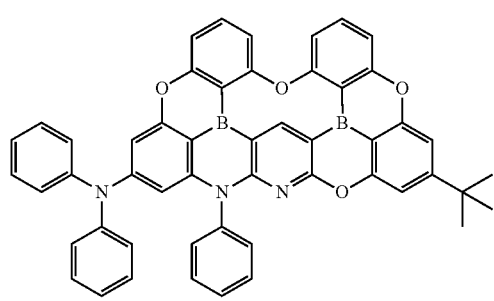
24
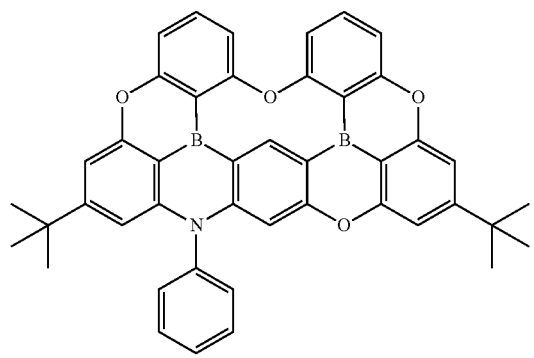
-continued
25
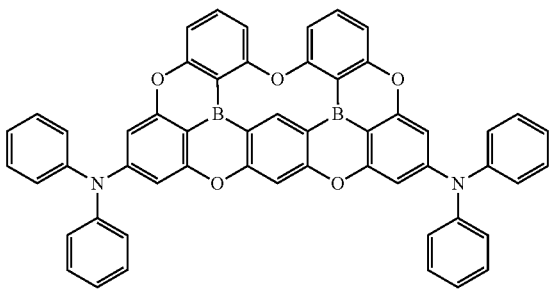
26
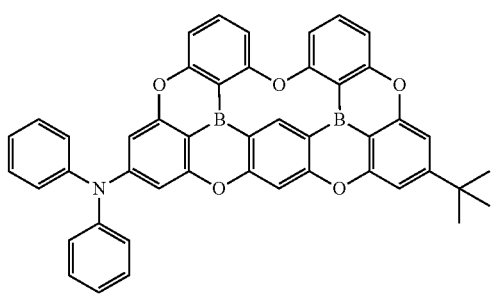
27
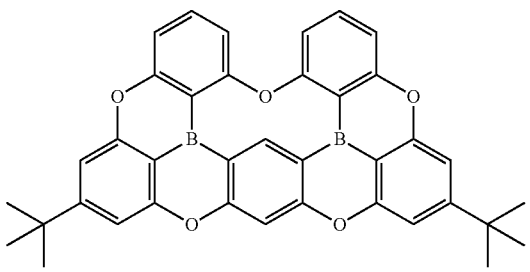
28
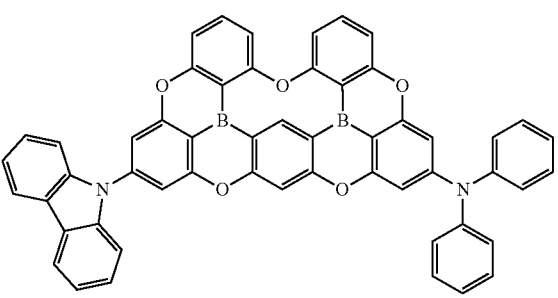
29
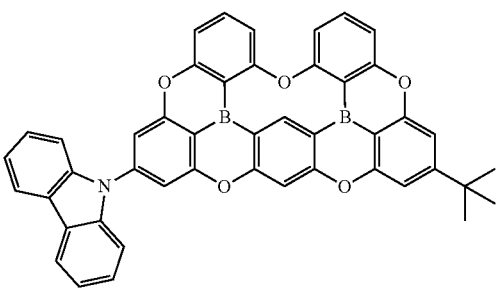

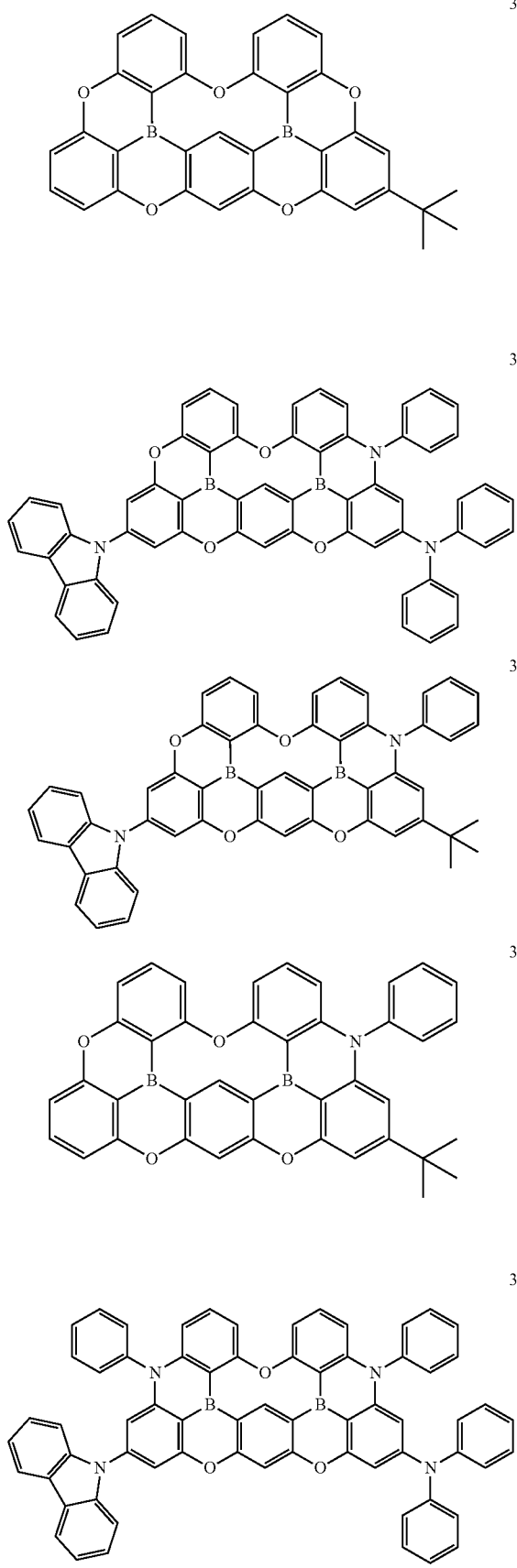
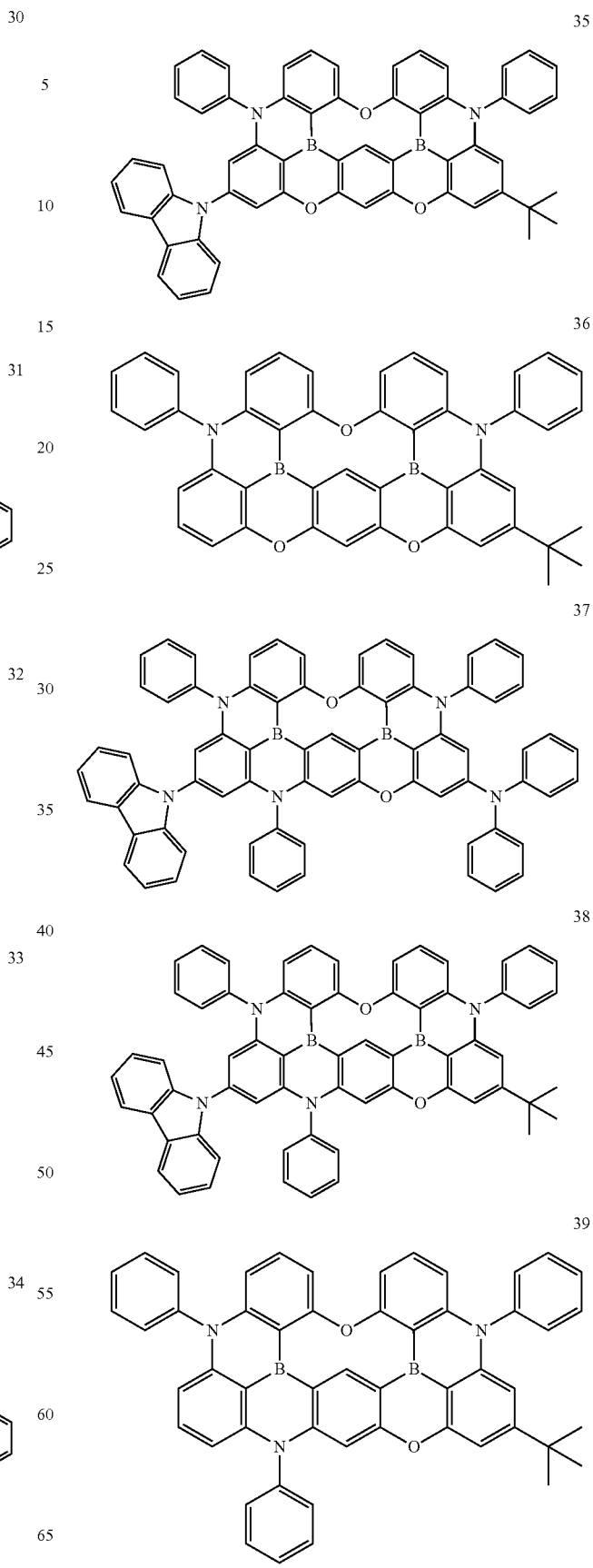

40
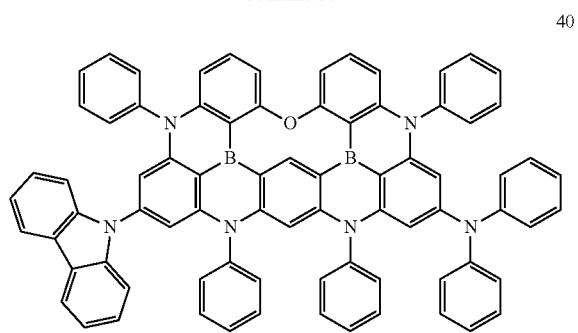
41
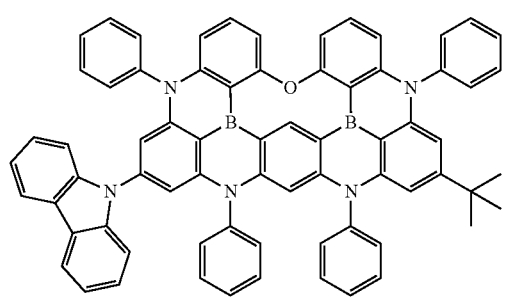
42
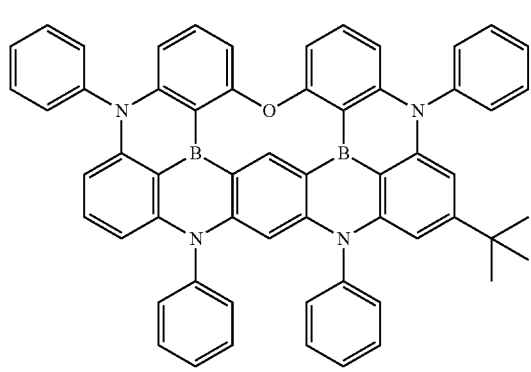
43
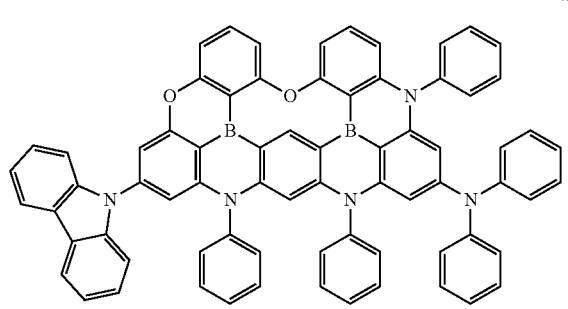
44
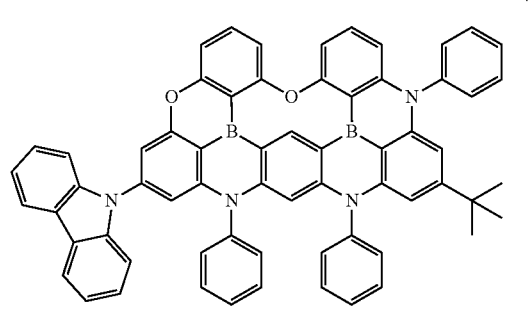
45
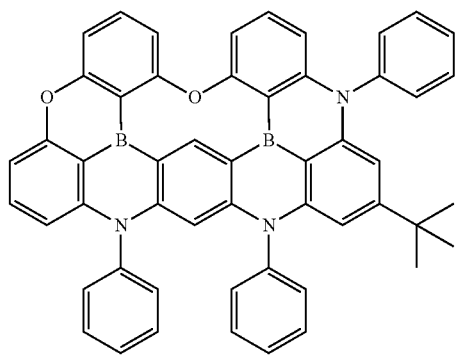
46
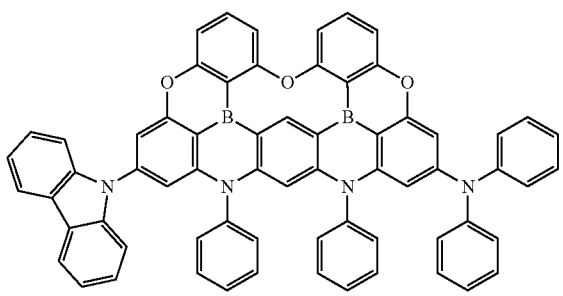
47
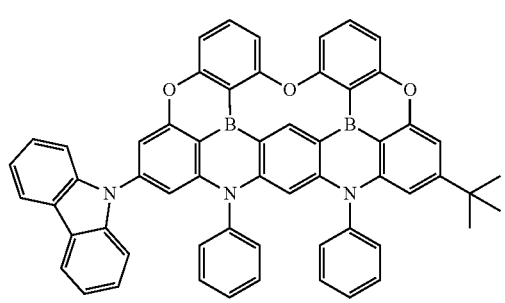
48
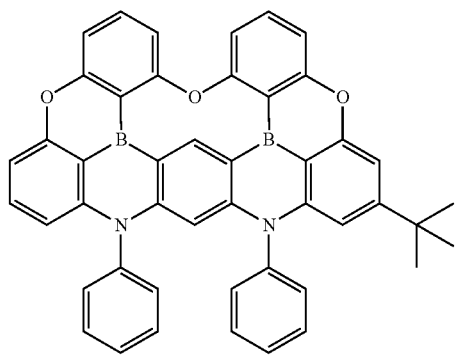

49
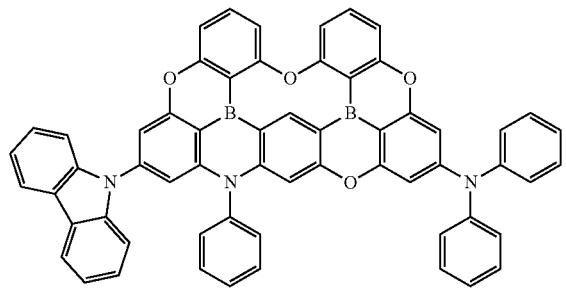
50
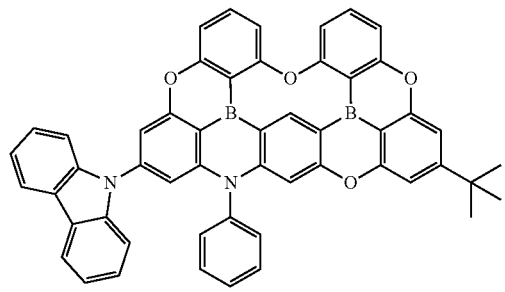
51
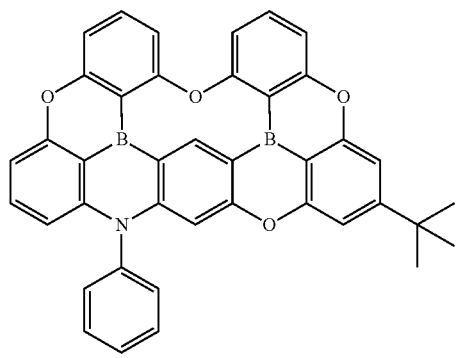
52
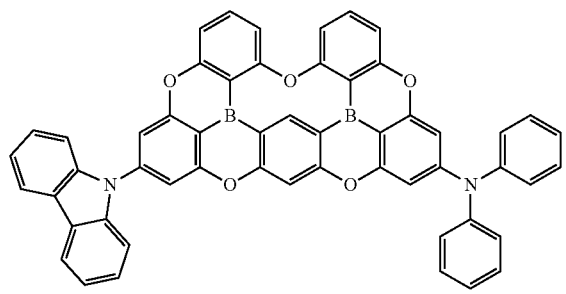
53
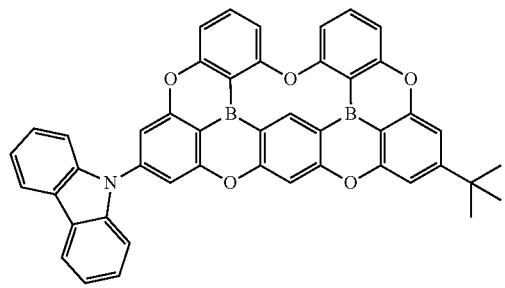
54
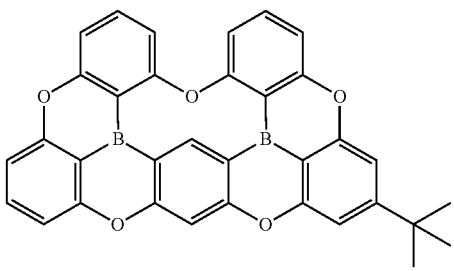
55
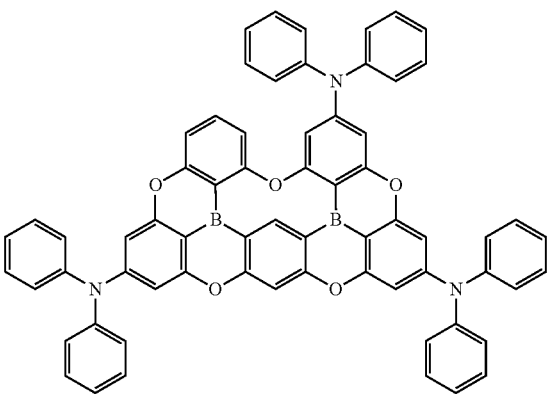
56
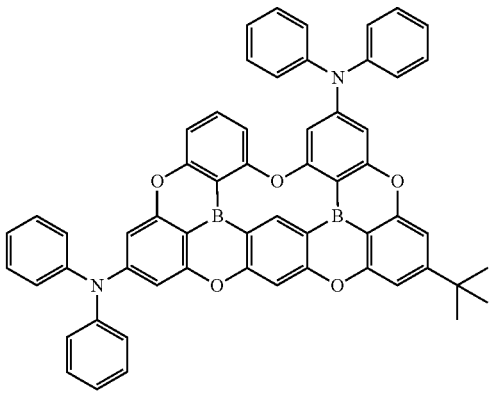
57
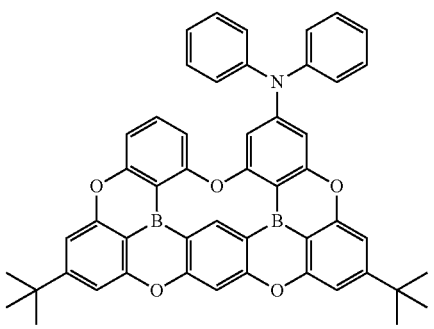

-continued
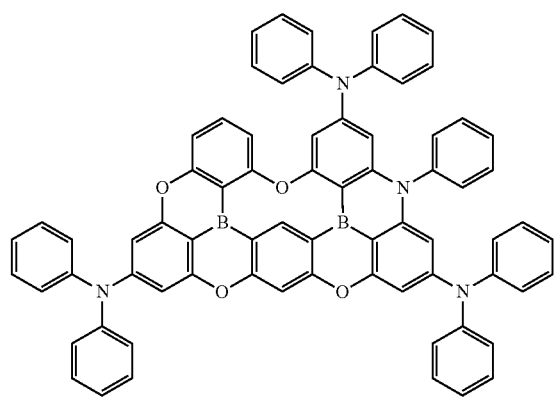
58
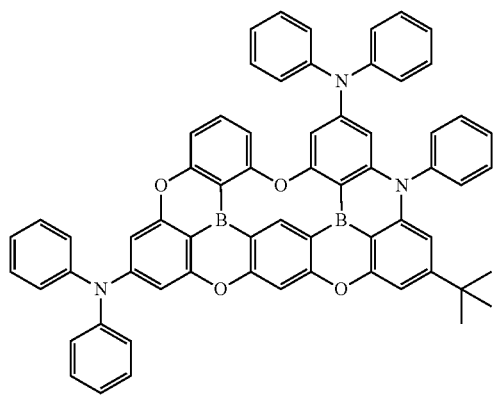
59
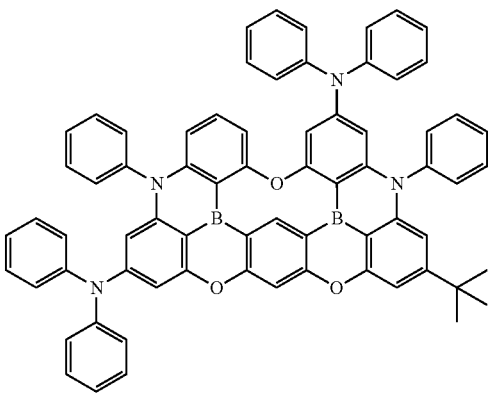
62
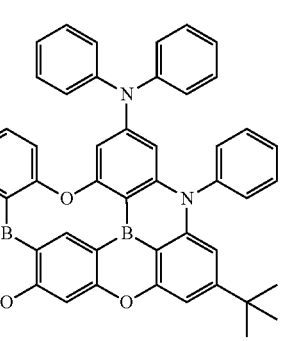
63
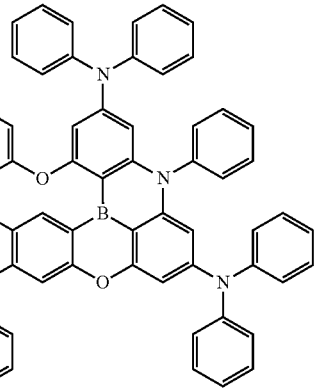
64
60
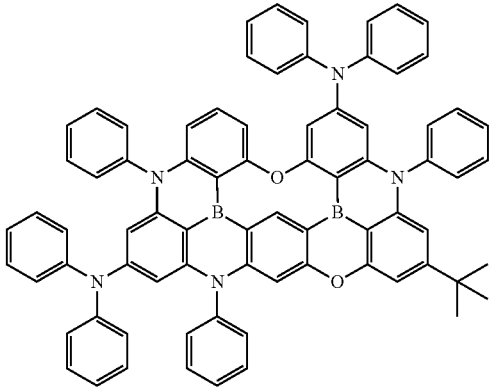
61
65

66
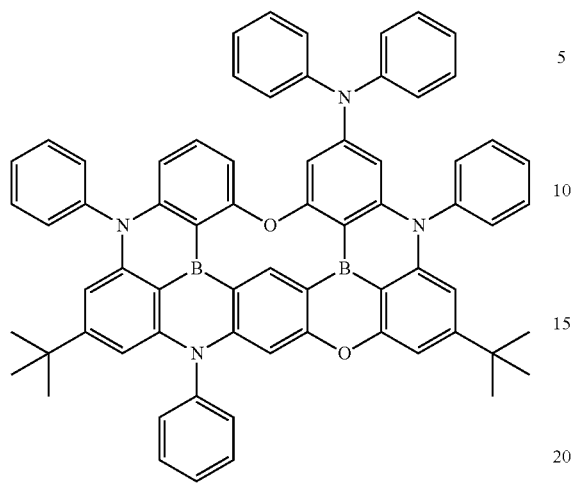
67
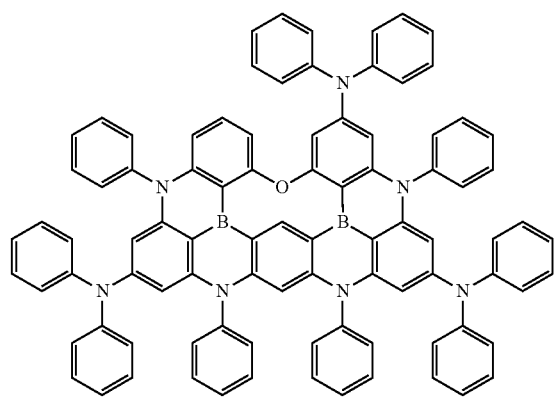
68
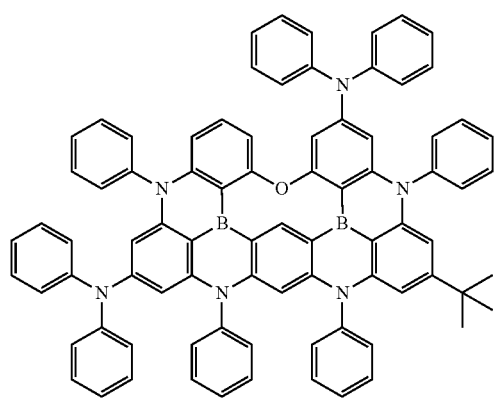
69
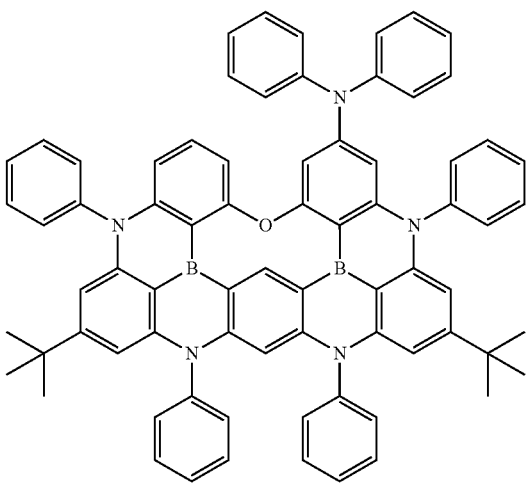
70
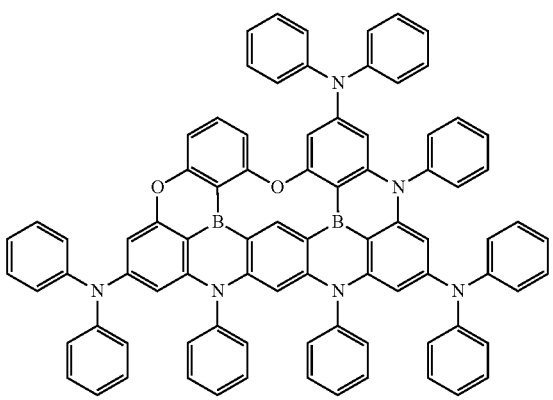
71
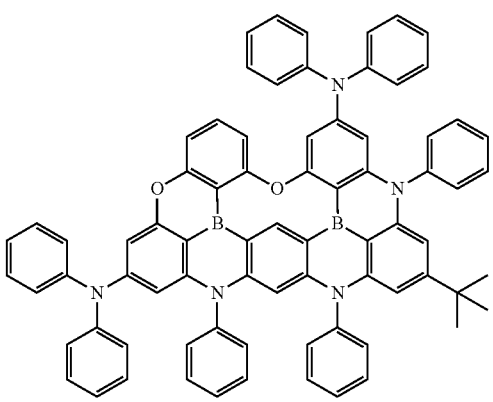

72
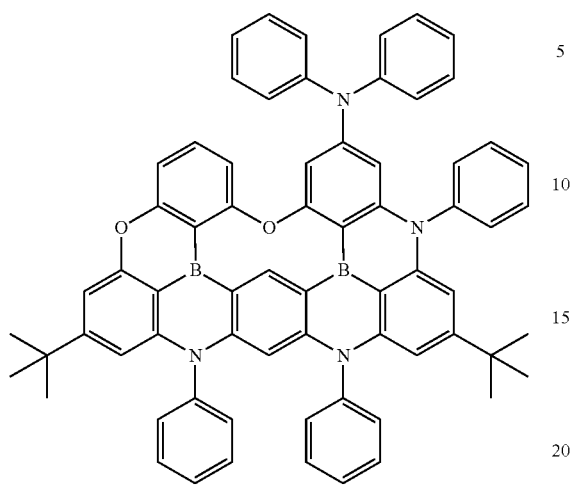
73
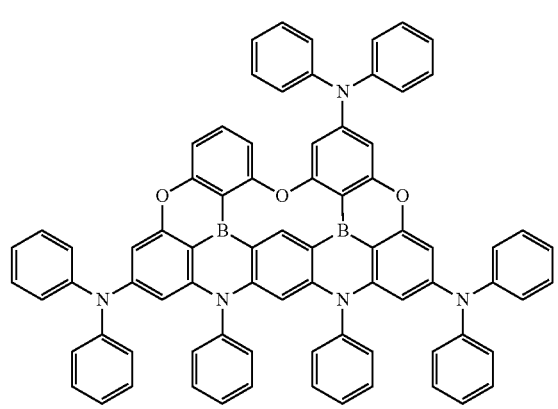
74
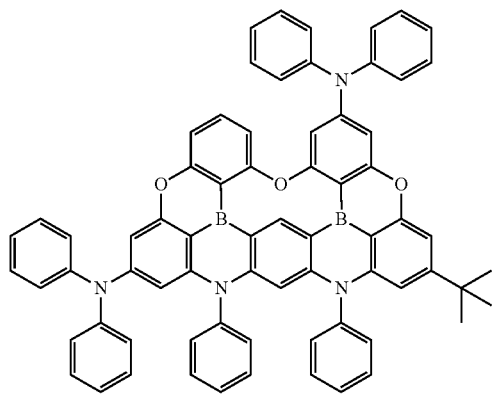
75
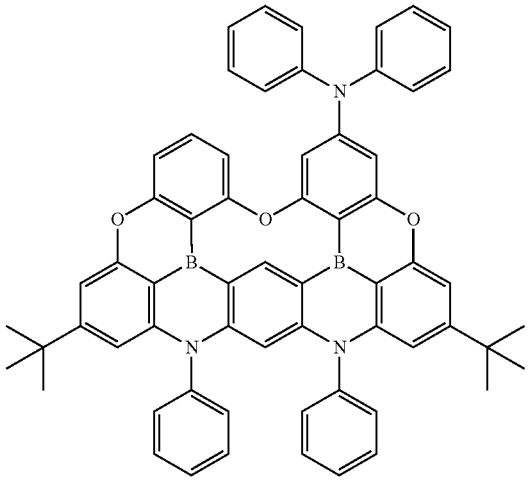
76
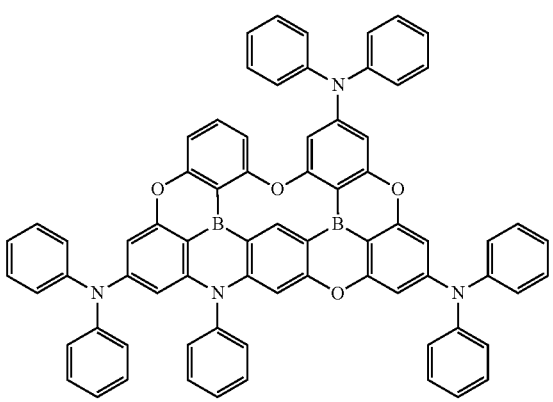
77
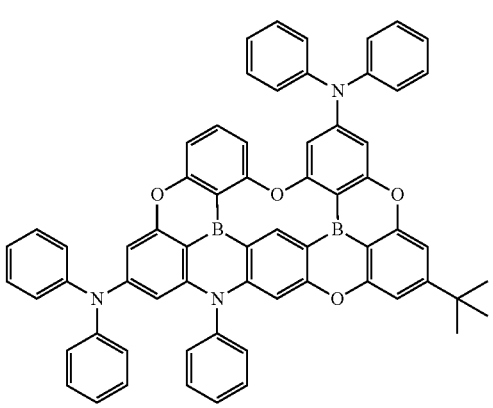

78
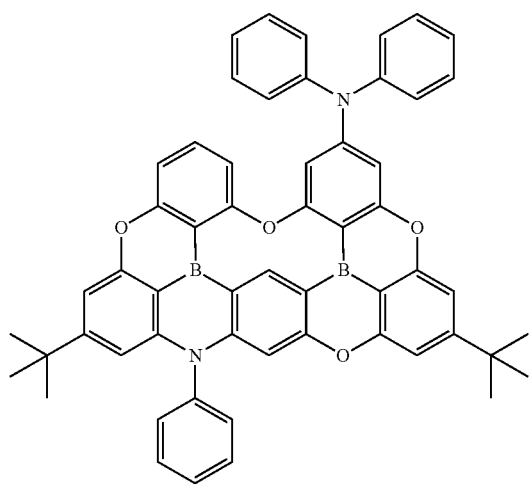
79
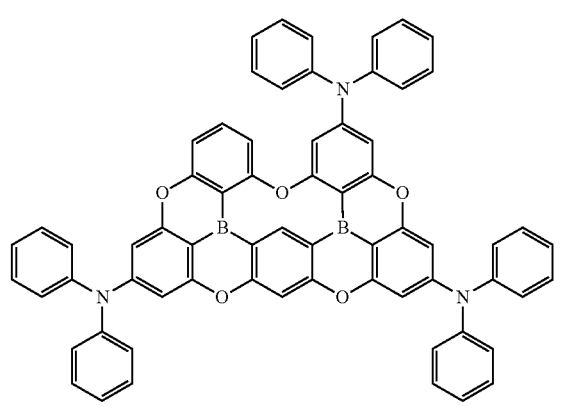
80
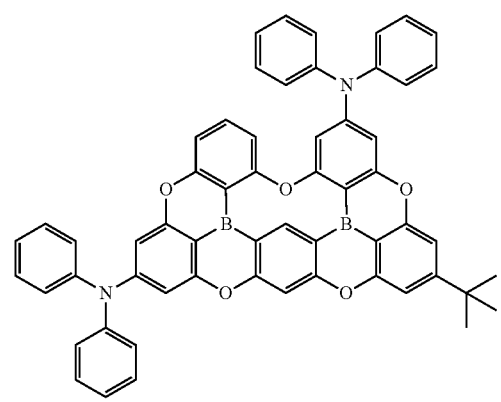
81
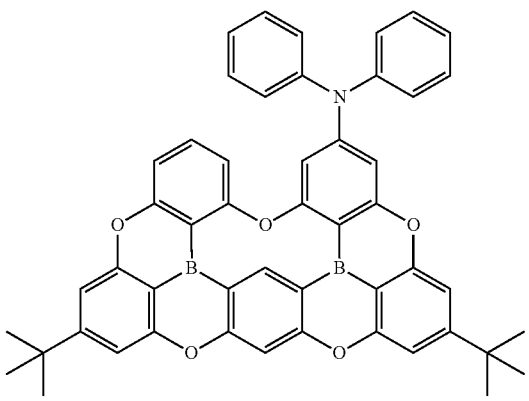
82
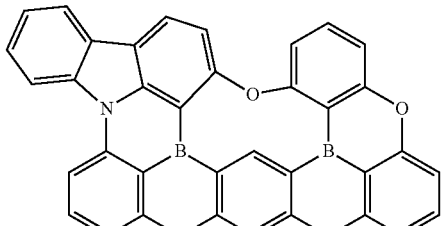
83
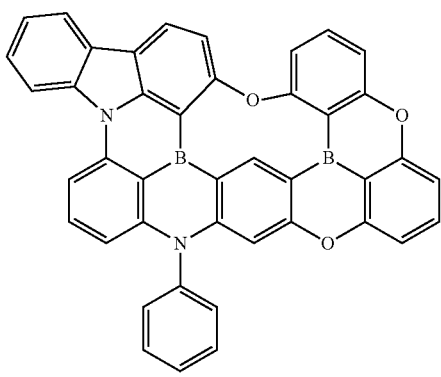
84
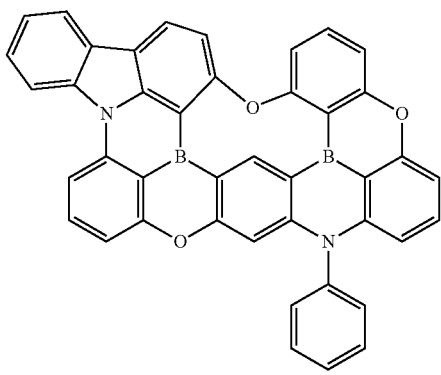

85
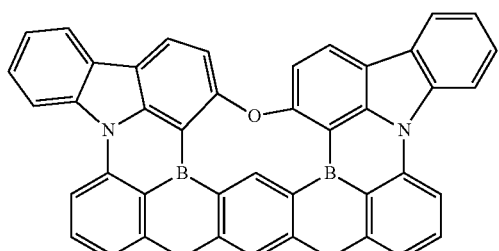
86
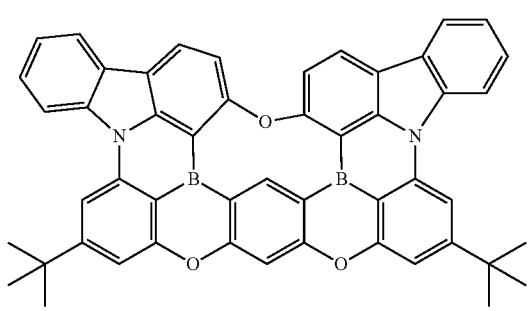
87
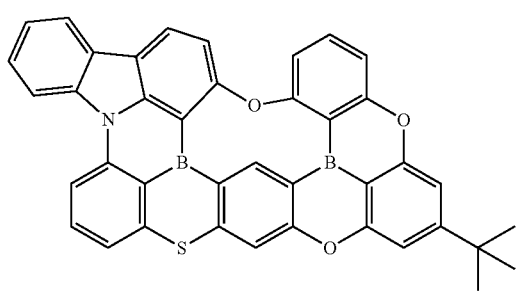
88
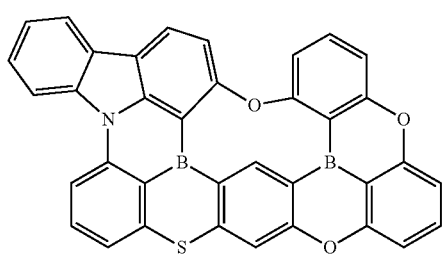
89
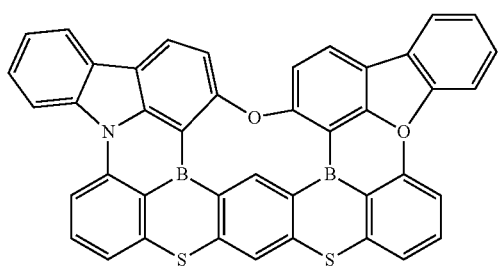
90
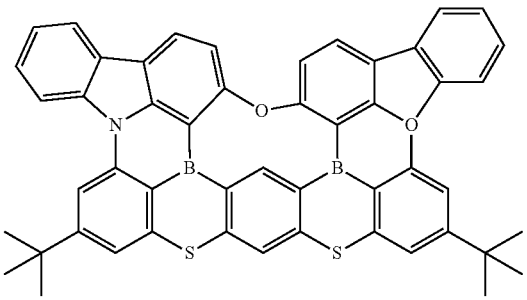
91
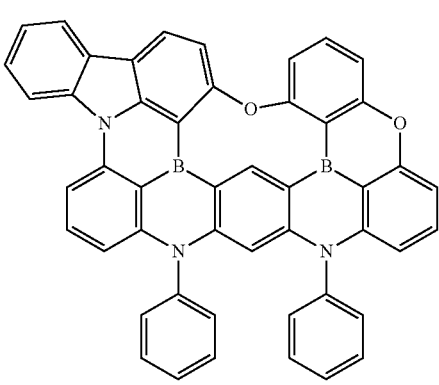
92
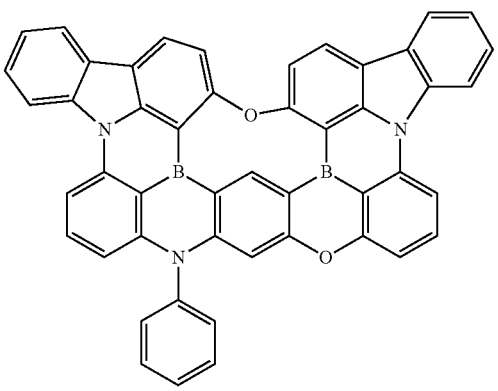
93
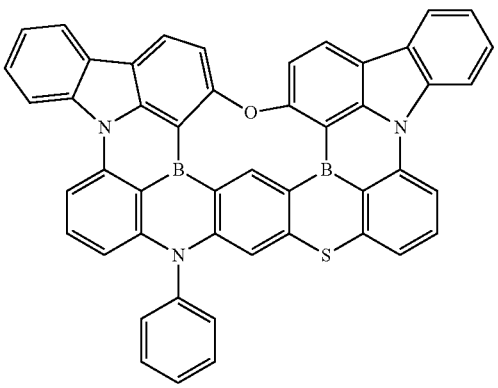

-continued

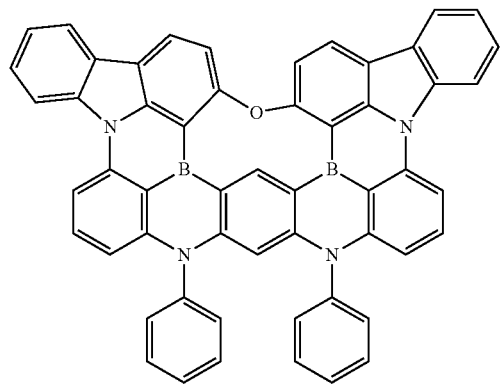

94

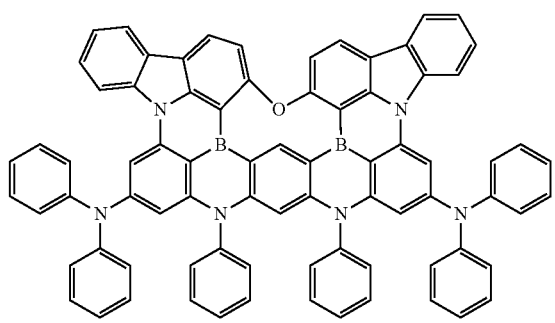

95

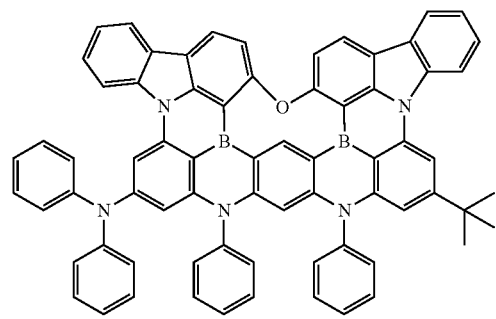

96

The expression "(an intermediate layer) includes at least one of the compounds" used herein may include an intermediate layer having identical or two or more different compounds represented by Formula 1.

In one or more exemplary embodiments, the intermediate layer may include, as the compound, only Compound 1. In this regard, Compound 1 may exist in the emission layer of the light-emitting device. In one or more exemplary embodiments, the intermediate layer may include, as the compound, Compound 1 and Compound 2. Compound 1 and Compound 2 may exist in an identical layer (for example, Compound 1 and Compound 2 may all exist in an emission layer), or different layers (for example, Compound 1 may exist in an emission layer and Compound 2 may exist in an electron transport region).

According to one or more exemplary embodiments, provided is an light-emitting device including:

a first electrode;

a second electrode facing the first electrode; and an intermediate layer disposed between the first electrode and the second electrode and including an emission layer, wherein the intermediate layer includes a compound of Formula 1. In one or more exemplary embodiments, the light-emitting device may be an organic light-emitting device.

According to one or more exemplary embodiments, the first electrode of the light-emitting device may be an anode, the second electrode of the light-emitting device may be a cathode, and the intermediate layer further includes a hole transport region interposed between the first electrode and the emission layer and an electron transport region interposed between the emission layer and the second electrode, wherein the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In one or more exemplary embodiments, the emission layer may be a fluorescent emission layer.

In one or more exemplary embodiments, a compound of Formula 1 may be used in the emission layer.

In one or more exemplary embodiments, the emission layer may be a fluorescent emission layer.

In one or more exemplary embodiments, the emission layer may include a dopant, and the dopant may include the compound. In one or more exemplary embodiments, the dopant may consist of the compound of Formula 1.

In one or more exemplary embodiments, the compound may act as a delayed fluorescence dopant. In one or more exemplary embodiments, the compound of Formula 1 may act as a delayed fluorescence dopant in the emission layer.

In one or more exemplary embodiments, the emission layer may be a blue emission layer.

An electronic apparatus according to one or more exemplary embodiments includes a thin-film transistor and the light-emitting device, wherein the thin-film transistor includes a source electrode, a drain electrode, an activation layer, and a gate electrode, and the first electrode of the light-emitting device may be in electrical connection with one of the source electrode and the drain electrode of the thin-film transistor.

The term "intermediate layer" as used herein refers to a single layer and/or a plurality of layers interposed between the first electrode and the second electrode of the light-emitting device. A material included in the "intermediate layer" may be an organic material, inorganic material, or any combination thereof.

Description of FIG. 1

FIG. 1 is a schematic cross-sectional diagram of an exemplary embodiment of an organic light-emitting device constructed according to principles of the invention.

The light-emitting device 10 may include a first electrode 110, an intermediate layer 150, and a second electrode 190. The intermediate layer 150 may include a hole transport region, an emission layer, and an electron transport region, as described in detail below.

Hereinafter, the structure of the light-emitting device 10 according to an exemplary embodiment and an exemplary method of manufacturing the light-emitting device 10 will be described in connection with FIG. 1.

First Electrode 110

In FIG. 1, a substrate may be additionally disposed under the first electrode 110 or above the second electrode 190. As the substrate, a glass substrate or a plastic substrate may be used.

The first electrode 110 may be formed by depositing or sputtering a material for forming a first electrode 110 on the substrate. When the first electrode 110 is an anode, a high work function material for easily injecting holes may be used as the material for forming the first electrode 110.

The first electrode 110 may be a reflective electrode, a semi-transmissive electrode, or a transmissive electrode. When the first electrode 110 is a transmissive electrode, an indium tin oxide (ITO), an indium zinc oxide (IZO), a tin oxide ($SnO_2$), a zinc oxide (ZnO), or any combinations thereof may be used as a material for forming the first electrode 110, but the exemplary embodiments are not limited thereto. In one or more exemplary embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode 110, but the exemplary embodiments are not limited thereto.

The first electrode 110 may have a single layer structure consisting of a single layer or a multi-layered structure including a plurality of layers. In one or more exemplary embodiments, the first electrode 110 may have a three-layered structure of ITO/Ag/ITO, but the structure of the first electrode 110 is not limited thereto.

Intermediate Layer 150

The intermediate layer 150 is disposed on the first electrode 110. The intermediate layer 150 includes the emission layer.

The intermediate layer 150 may further include the hole transport region between the first electrode 110 and the emission layer and the electron transport region between the emission layer and the second electrode 190. The emission layer may include a dopant, such as a fluorescent dopant, as hereinafter described.

The intermediate layer 150 may further include a metal-containing compound such as an organometallic compound, and an organic material such as a quantum dot, in addition to various organic materials.

Hole Transport Region in the Intermediate Layer 150

The hole transport region may have i) a single layer structure consisting of a single layer consisting of a single material, ii) a single layer structure consisting of a single layer including a plurality of different materials, or iii) a multi-layered structure including a plurality of layers including a plurality of different materials.

The hole transport region may include a hole injection layer (HIL), a hole transport layer (HTL), an emission auxiliary layer, an electron blocking layer (EBL), or any combination thereof.

In one or more exemplary embodiments, the hole transport region may have a multi-layered structure having a hole injection layer/hole transport layer, a hole injection layer/hole transport layer/emission auxiliary layer, a hole injection layer/emission auxiliary layer, a hole transport layer/emission auxiliary layer, or a hole injection layer/hole transport layer/electron blocking layer, wherein for each structure, constituting layers are sequentially stacked from the first electrode 110 in this stated order, but the structure of the hole transport region is not limited thereto.

The hole transport region may include a compound represented by Formula 201, a compound represented by Formula 202, or any combination thereof:

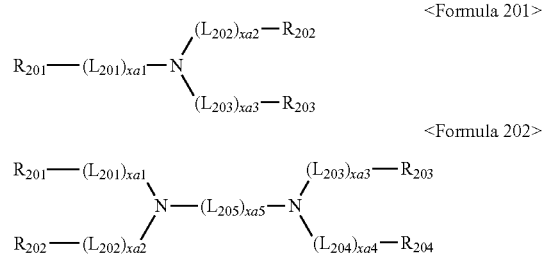

<Formula 201>

<Formula 202>

In Formulae 201 and 202, $L_{201}$ to $L_{204}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $L_{205}$ may be *—O—*', *—S—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xa1 to xa4 may each independently be 0, 1, 2, or 3 (for example, 0, 1, or 2), xa5 may be an integer from 1 to 10 (for example, 1, 2, 3, or 4), and $R_{201}$ to $R_{204}$ and $Q_{201}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more exemplary embodiments, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one or more exemplary embodiments, i) at least one of $R_{201}$ to $R_{203}$ in Formula 201 and ii) at least one of $R_{201}$ to $R_{204}$ in Formula 202 may each independently be a fluorenyl group, a spiro-bifluorenyl group, a benzofluorenyl group, an indenophenanthrenyl group, a pyridinyl group, a pyrrole group, a thiophenyl group, a furanyl group, an indolyl group, a benzoindolyl group, an isoindolyl group, a benzoisoindolyl group, a benzosilolyl group, a benzothiophenyl group, a benzofuranyl group, a carbazolyl group, a dibenzosilolyl group, a dibenzothiophenyl group, or a dibenzofuranyl group, each substituted with at least one selected from deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a phenanthrenyl group, an indenyl group, a fluorenyl group, a dimethylfluorenyl group, a diphenylfluorenyl group, a spiro-bifluorenyl group, a benzofluorenyl group, a dimethylbenzofluorenyl group, a diphenylbenzofluorenyl group, an indenophenanthrenyl group, a dimethylindenophenanthrenyl group, a diphenylindenophenanthrenyl group, a pyridinyl group, a pyrrolyl group, a thiophenyl group, a furanyl group, an indolyl group, a phenylindolyl group, a benzoindolyl group, a phenylbenzoindolyl group, an isoindolyl group, a phenylindolyl group, a benzoisoindolyl group, a phenylbenzoisoindolyl group, a benzosilolyl group, a dimethylbenzosilolyl group, a diphenylbenzosilolyl group, a benzothiophenyl group, a benzofuranyl group, a carbazolyl group, a phenylcarbazolyl group, a biphenylcarbazolyl group, a dibenzosilolyl group, a dimethyldibenzosilolyl group, a diphenyldibenzosilolyl group, a dibenzothiophenyl group, and a dibenzofuranyl group.

In one or more exemplary embodiments, the compound represented by Formula 201 or 202 may include at least one carbazole group.

In one or more exemplary embodiments, the compound represented by Formula 201 may not include a carbazole group.

In one or more exemplary embodiments, the compound represented by Formula 202 may be represented by Formula 201A-1 below:

<Formula 201A-1>

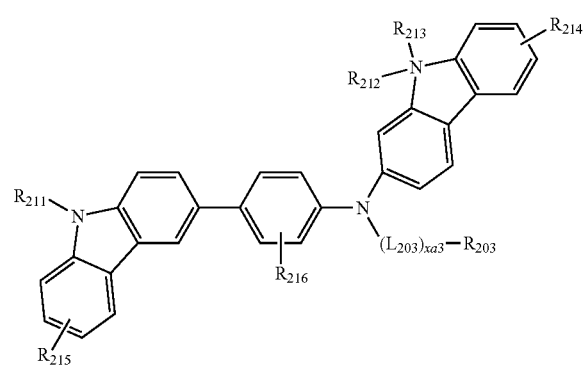

In Formula 201A-1, $L_{203}$, xa3, and $R_{203}$ are the same as described above, and $R_{211}$ to $R_{126}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a phenanthrenyl group, an indenyl group, a fluorenyl group, a dimethylfluorenyl group, a diphenylfluorenyl group, a spiro-bifluorenyl group, a benzofluorenyl group, a dimethylbenzofluorenyl group, a diphenylbenzofluorenyl group, an indenophenanthrenyl group, a dimethylindenophenanthrenyl group, a diphenylindenophenanthrenyl group, a pyridinyl group, a pyrrolyl group, a thiophenyl group, a furanyl group, an indolyl group, a phenylindolyl group, a benzoindolyl group, a phenylbenzoindolyl group, an isoindolyl group, a phenylindolyl group, a benzoisoindolyl group, a phenylbenzoisoindolyl group, a benzosilolyl group, a dimethylbenzosilolyl group, a diphenylbenzosilolyl group, a benzothiophenyl group, a benzofuranyl group, a carbazolyl group, a phenylcarbazolyl group, a biphenylcarbazolyl group, a dibenzosilolyl group, a dimethyldibenzosilolyl group, a diphenyldibenzosilolyl group, a dibenzothiophenyl group, and a dibenzofuranyl group.

The hole transport region may include one of HT1 to HT44, 4,4',4"-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4"-tris[2-naphthyl(phenyl)amino]triphenylamine (2-TNATA), N,N'-di(naphtalene-1-yl)-N,N-diphenyl-benzidine (NPB or NPD), N4,N4'-di(naphthalen-2-yl)-N4,N4'-diphenyl-[1,1'-biphenyl]-4,4'-diamine (β-NPB), N,N'-bis(3-methylphenyl)-N,N-diphenyl-[1,1-biphenyl]-4,4'-diamine (TPD), 4(N,N'-bis(3-methylphenyl)-N,N'-diphenyl-9,9-spirobifluorene-2,7-diamine (spiro-TPD), 2,7-bis[N-(1-naphthyl)anilino]-9,9'-spirobi[9H-fluorene] (spiro-NPB), 2,2'-dimethyl-N,N-di-[(1-naphthyl)-N,N-diphenyl]-1,1'-biphenyl-4,4'-diamine (methylated-NPB), 4,4'-cyclohexylidene bis[N,N-bis(4-methylphenyl)benzenamine] (TAPC), 4,4'-bis[N,N-(3-tolyl)amino]-3,3'-dimethylbiphenyl (HMTPD), 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), polyaniline/poly(4-styrenesulfonate) (PANI/PSS), or any combination thereof, but the exemplary embodiments are not limited thereto.

HT1

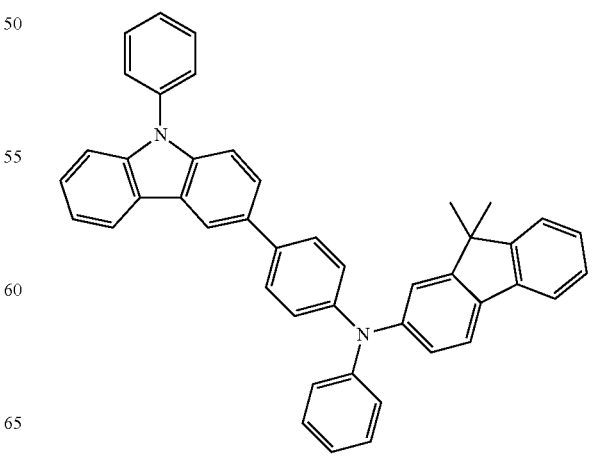

HT2
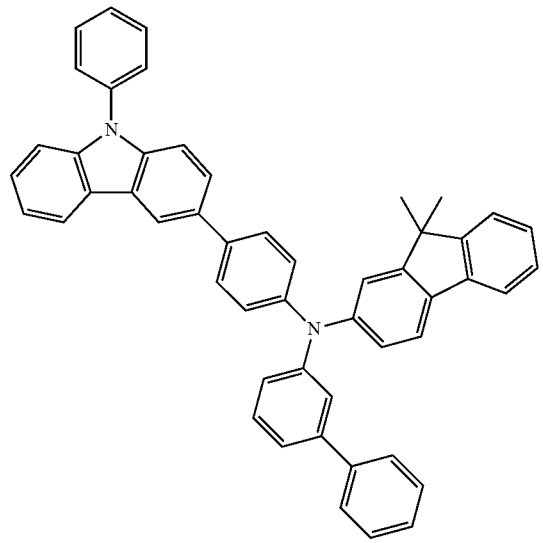
HT4
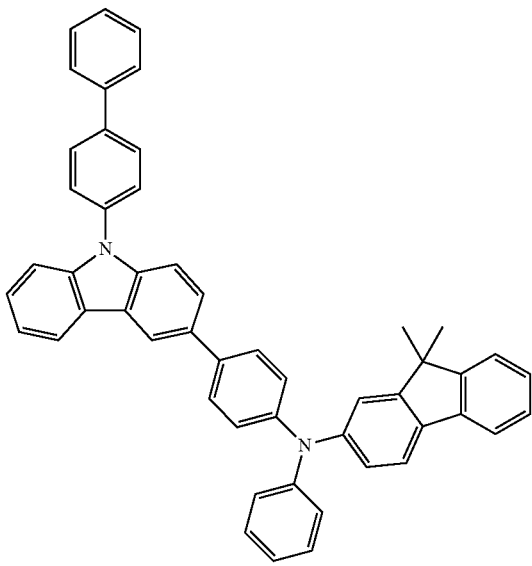
HT5
HT3
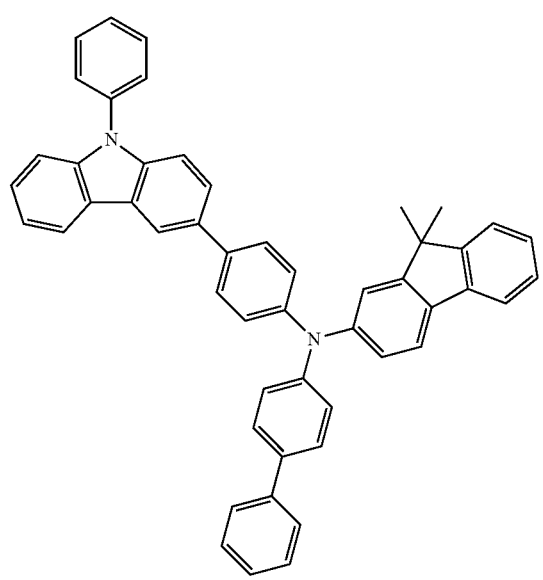
HT6
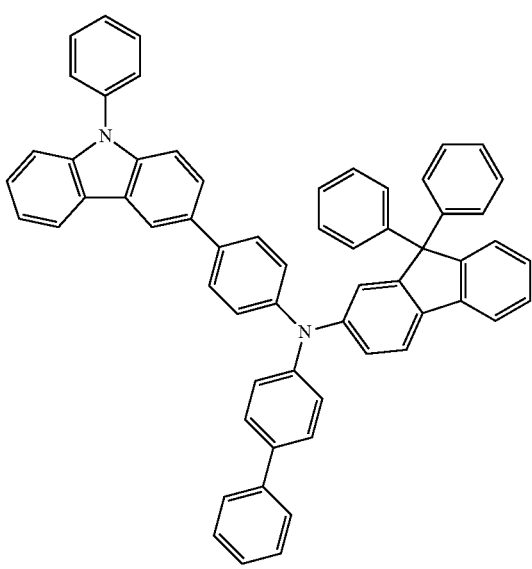

HT7
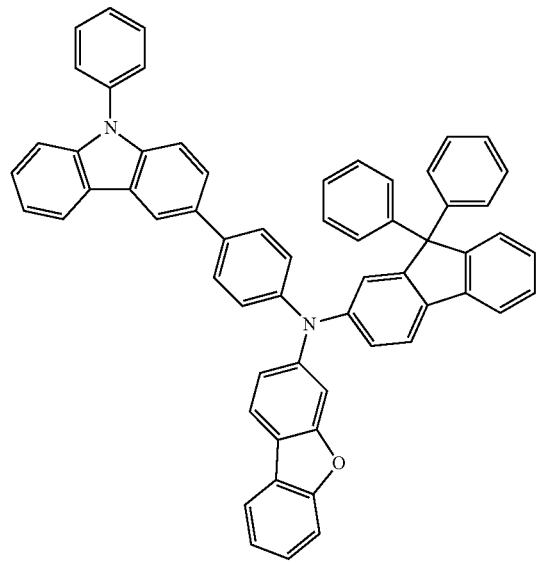
HT9
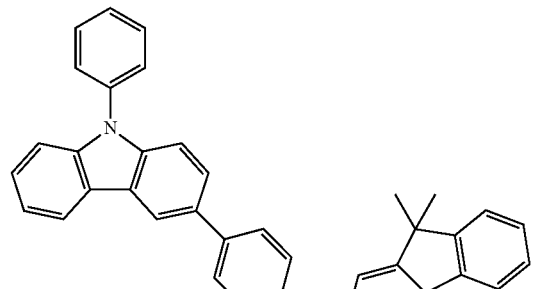
HT10
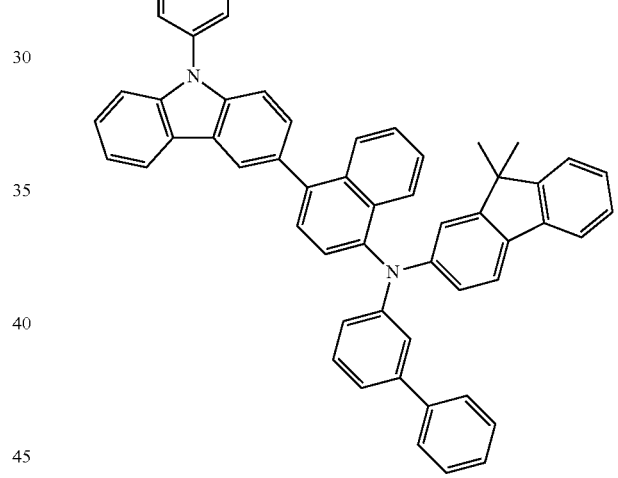
HT8
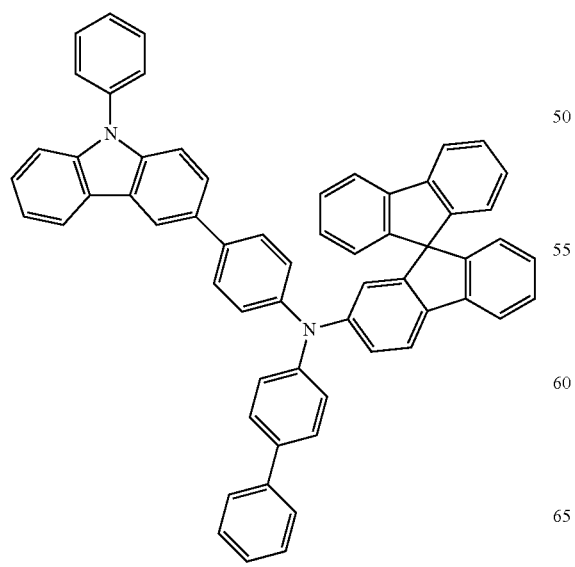
HT11
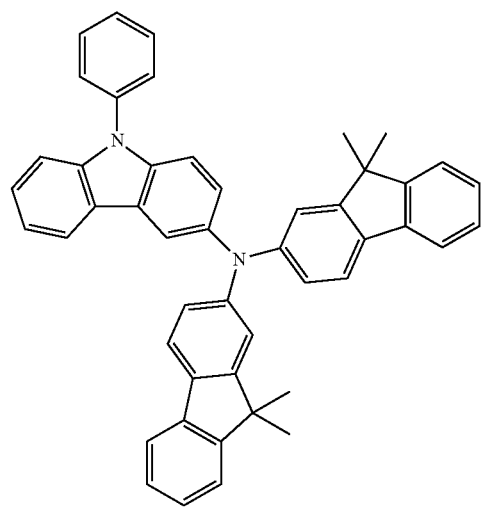

HT12
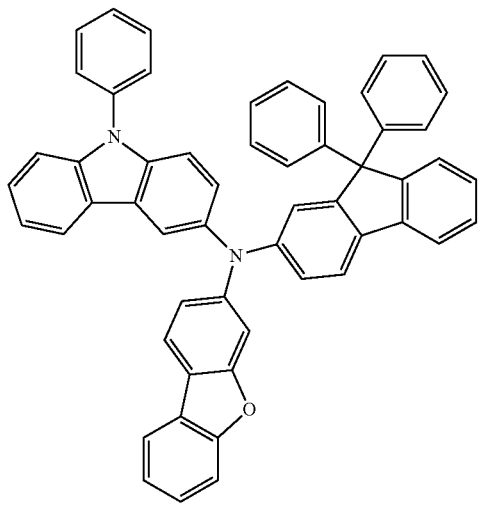
HT13
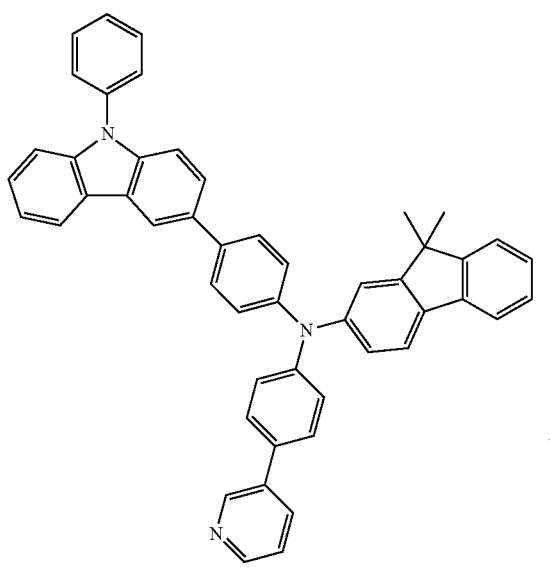
HT14
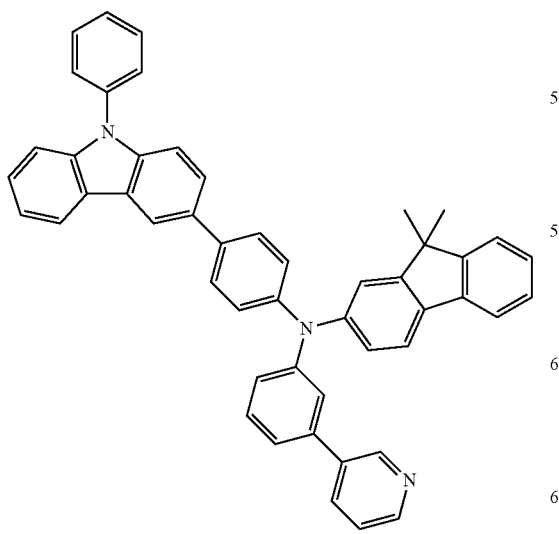
HT15
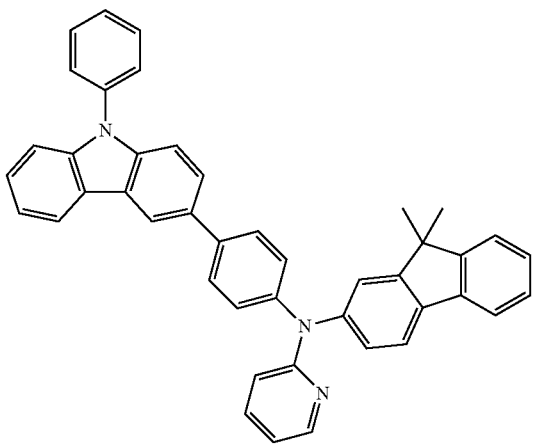
HT16
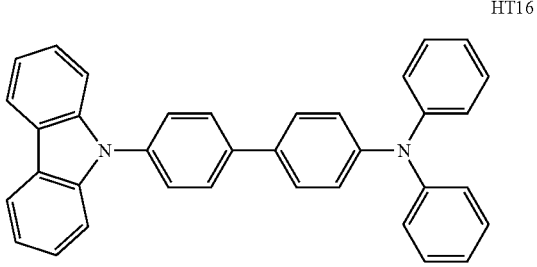
HT17
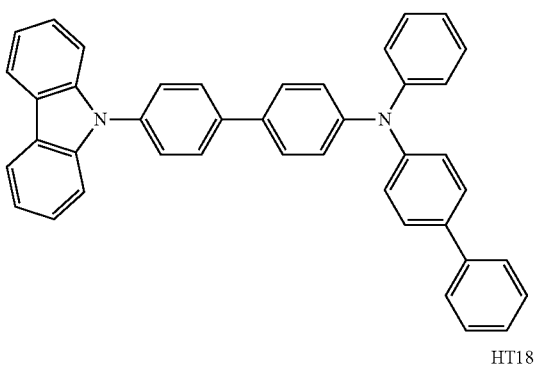
HT18
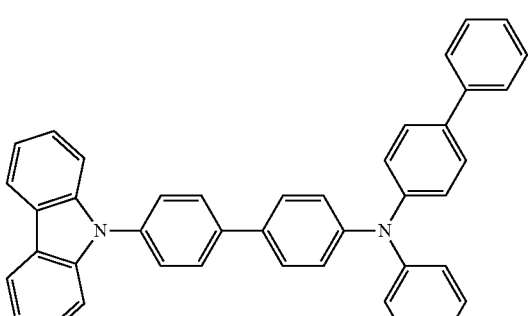

HT19
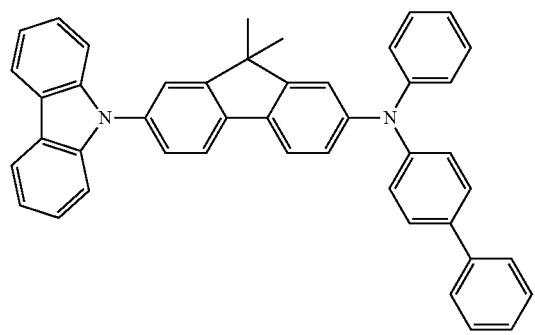
HT22
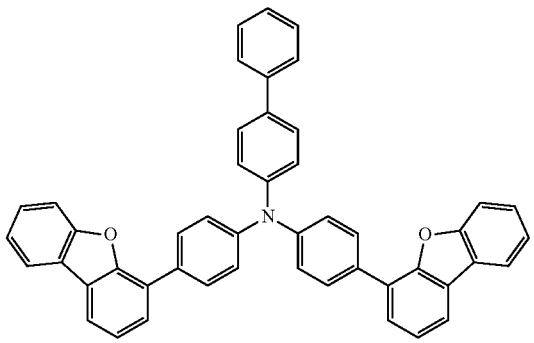
HT20
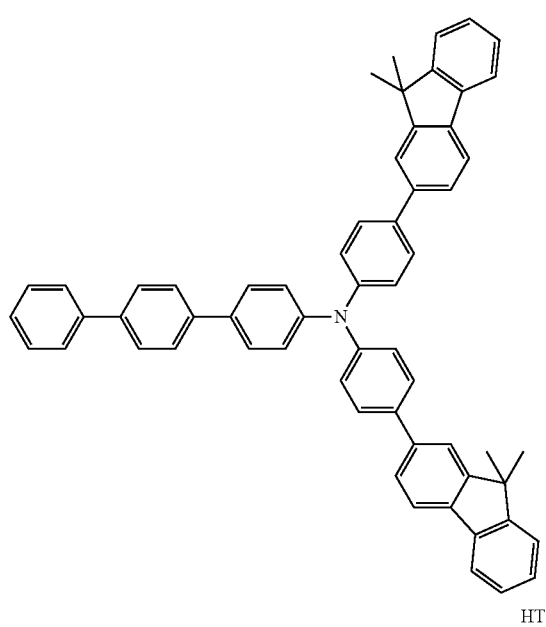
HT23
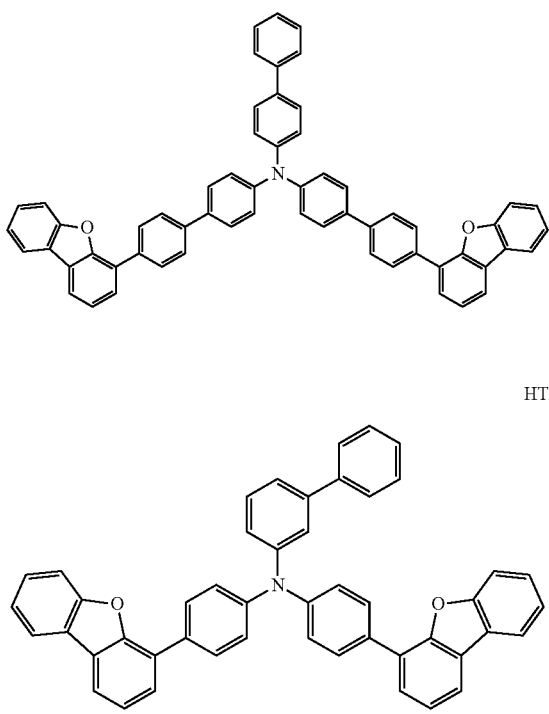
HT24
HT21
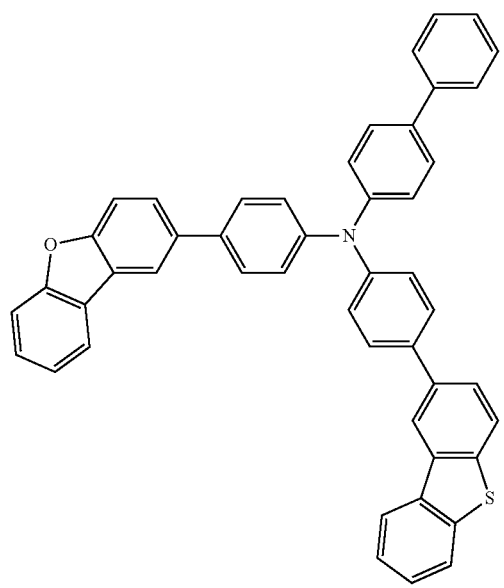
HT25

HT26
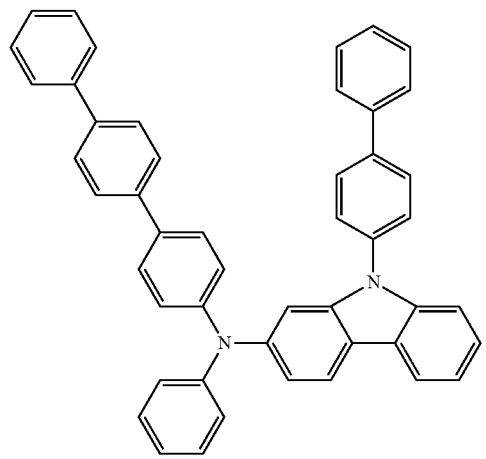
HT27
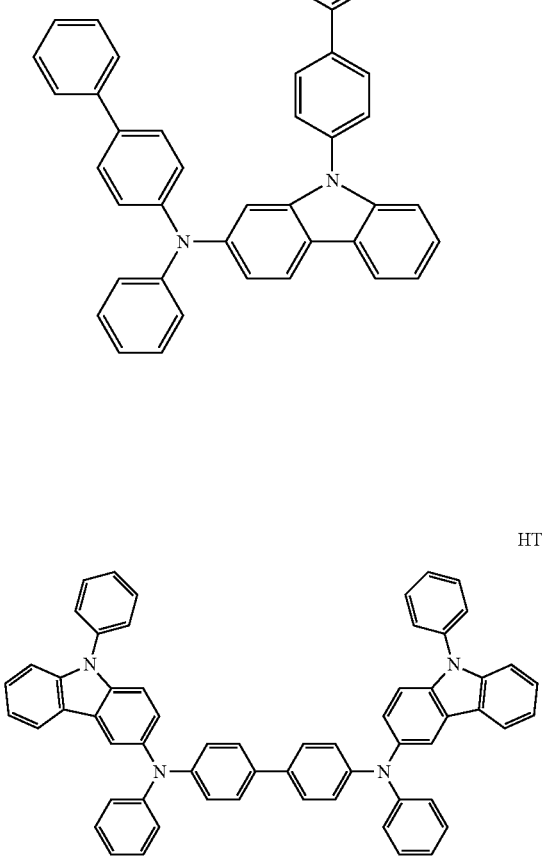
HT28
HT29
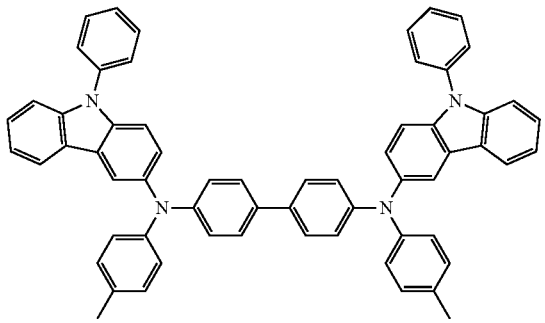
HT30
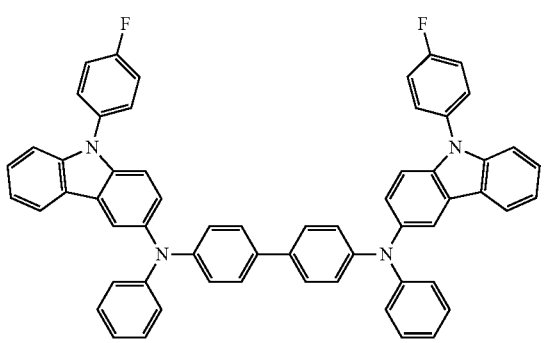
HT31
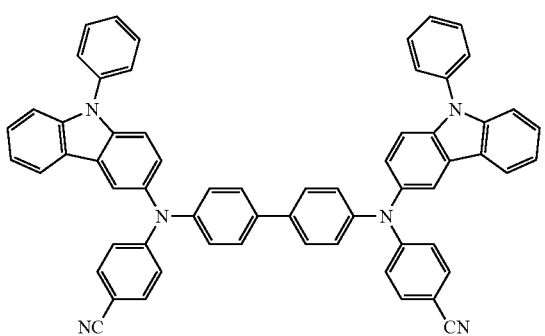
HT32
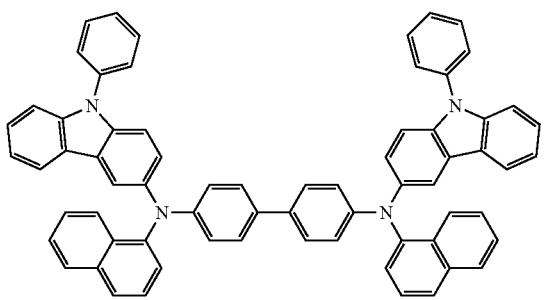

HT33
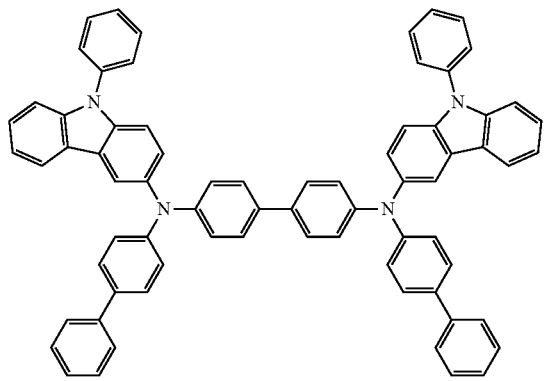
HT34
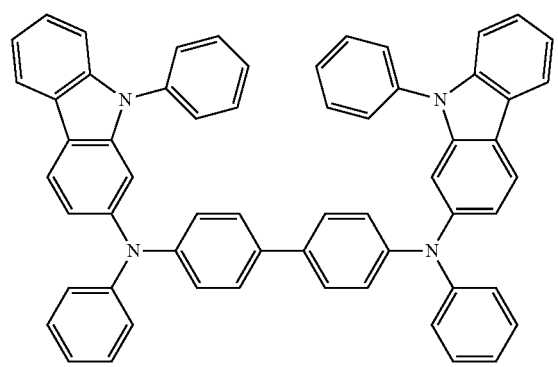
HT35
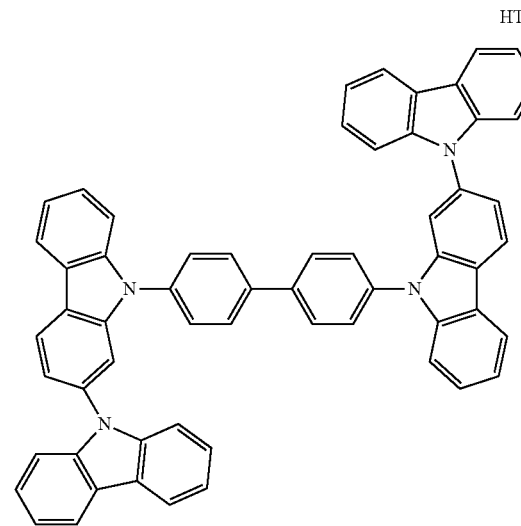
HT36
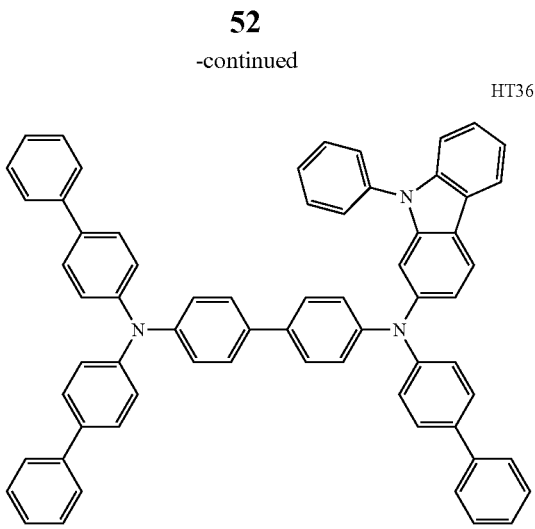
HT37
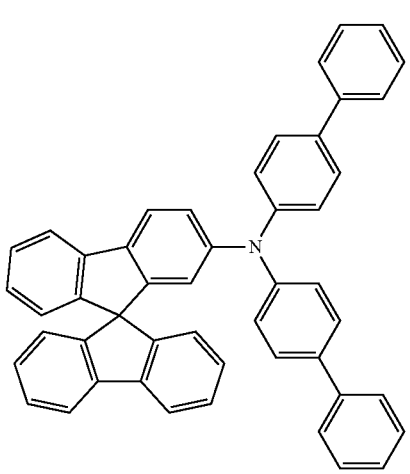
HT38
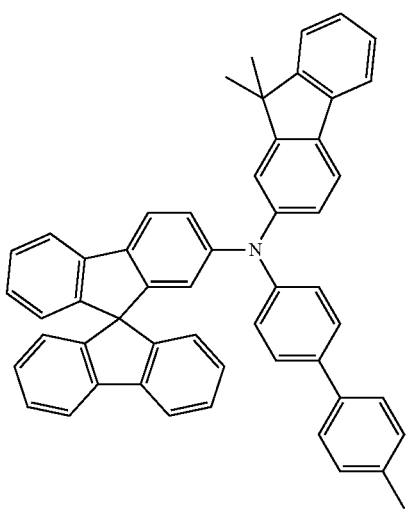

HT39
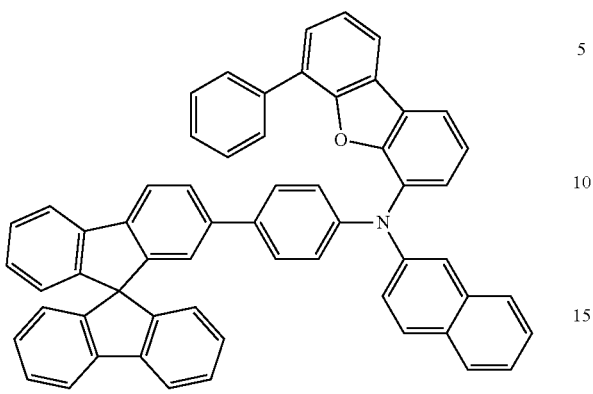
HT40
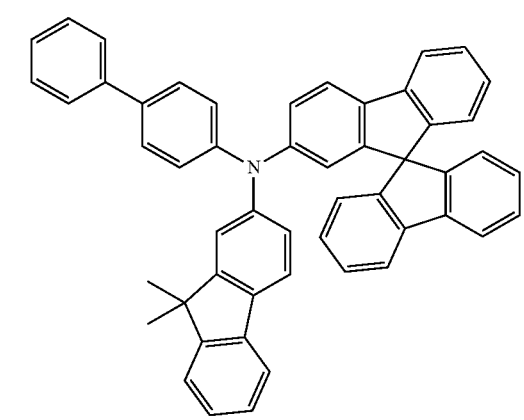
HT41
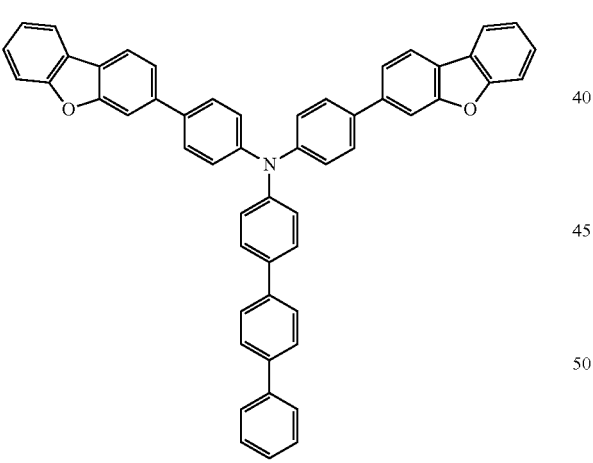
HT42
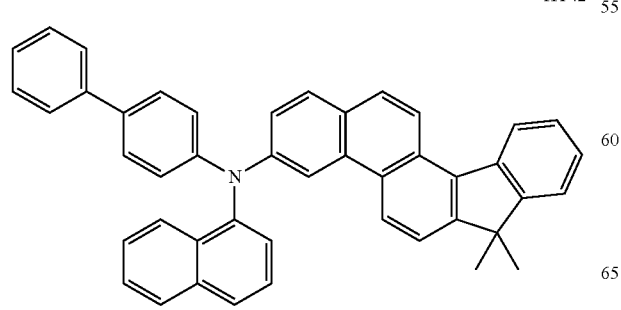
HT43
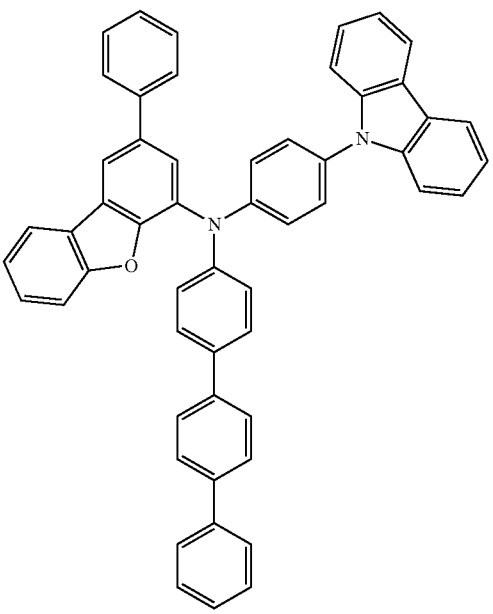
HT44
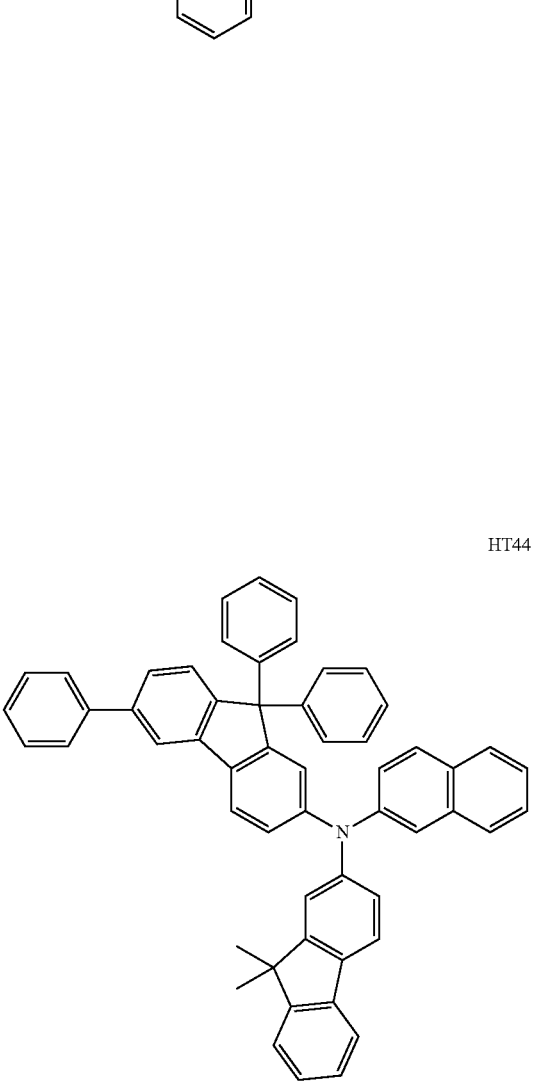

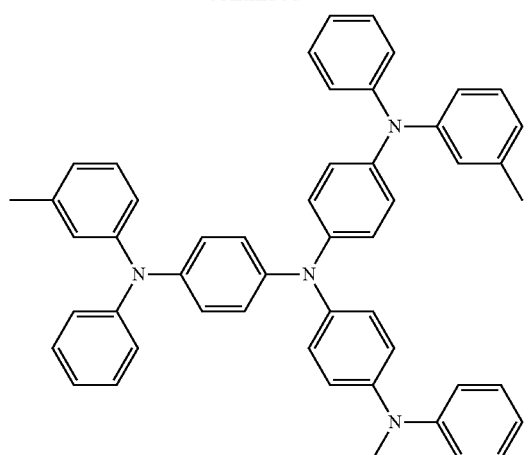
m-MTDATA
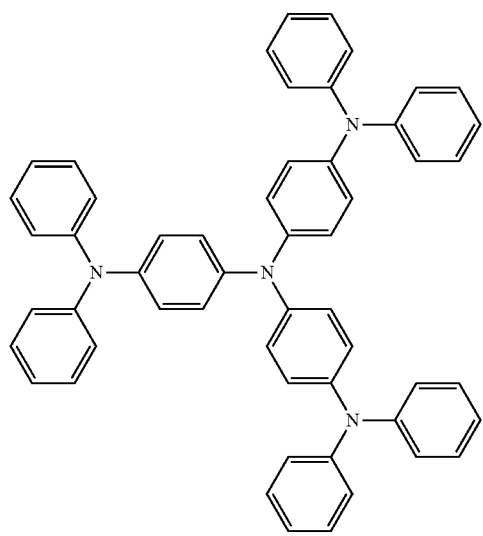
TDATA
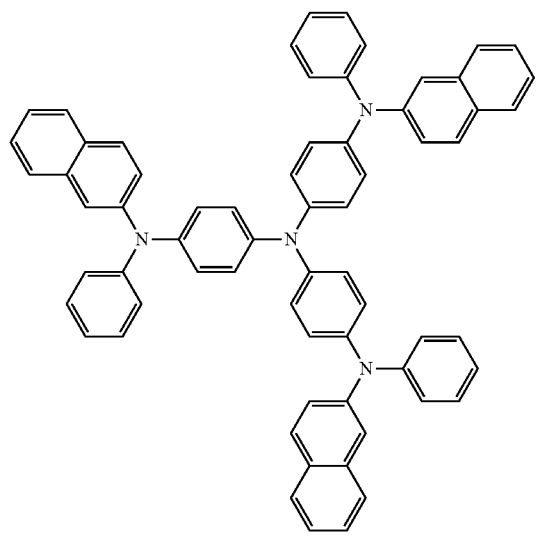
2-TNATA
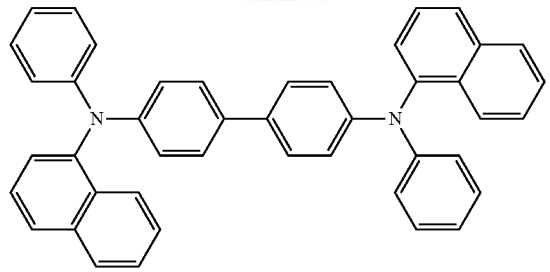
NPB
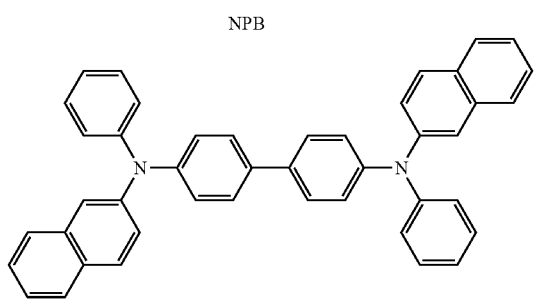
β-NPB
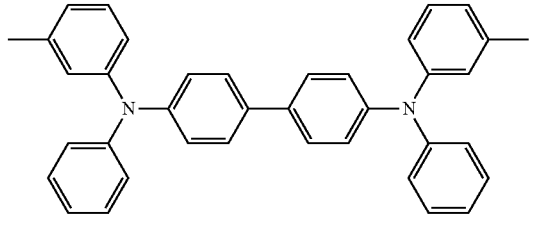
TPD
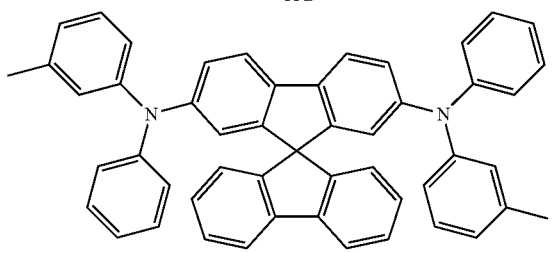
Spiro-TPD
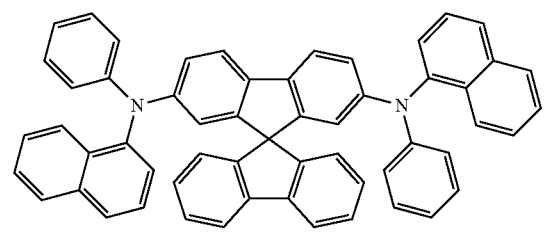
Spiro-NPB
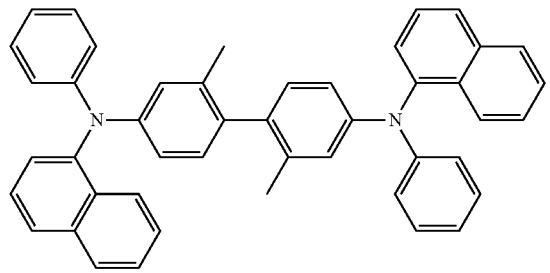
methylated-NPB

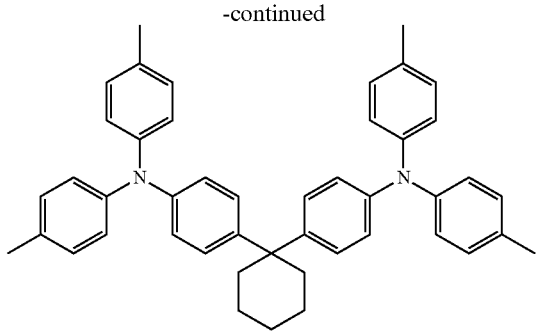

TAPC

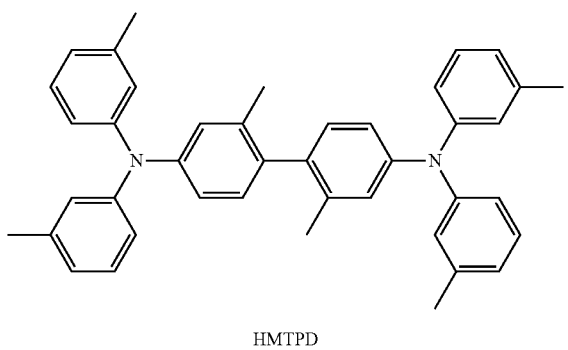

HMTPD

The thickness of the hole transport region may be in a range of about 100 Å to about 10,000 Å, and for example, about 100 Å to about 1,000 Å. When the hole transport region includes at least one selected from the hole injection layer and the hole transport layer, the thickness of the hole injection layer may be in a range of about 100 Å to about 9,000 Å, and for example, about 100 Å to about 1,000 Å, and the thickness of the hole transport layer may be in a range of about 50 Å to about 2,000 Å, and for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for the optical resonance distance according to the wavelength of light emitted by the emission layer, and the electron blocking layer may block the flow of electrons from the electron transport region. The emission auxiliary layer and the electron blocking layer may include the materials as described above.

p-Dopant

The hole transport region may include, in addition to these materials, a charge-generation material for improvement of conductive properties. The charge-generation material may be homogeneously or non-homogeneously dispersed in the hole transport region.

The charge-generation material may be, for example, a p-dopant.

In one or more exemplary embodiments, a LUMO energy level of the p-dopant may be about −3.5 eV or less.

The p-dopant may include a quinone derivative, a metal oxide, a cyano group-containing compound, or any combination thereof, but the exemplary embodiments are not limited thereto.

In one or more exemplary embodiments, the p-dopant may include:
a quinone derivative such as tetracyanoquinodimethane TCNQ or 2,3,5,6-tetrafluoro-7,7,8,8-tetracyanoquinodimethane F4-TCNQ;
a metal oxide such as tungsten oxide or molybdenum oxide;
a cyano group-containing compound such as 1,4,5,8,9,12-hexaazatriphenylene-hexacarbonitrile HAT-CN;
a compound represented by Formula 221; or
any combination thereof,
but the exemplary embodiments are not limited thereto:

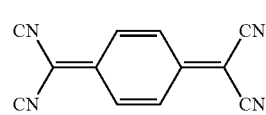

TCNQ

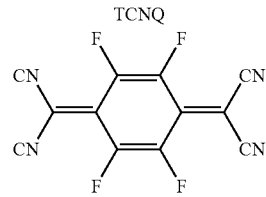

F4-TCNQ

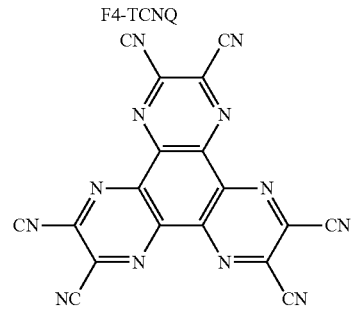

HAT-CN

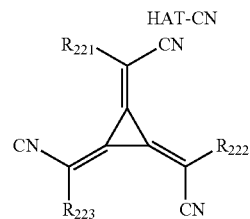

In Formula 221,
$R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein at least one of $R_{221}$ to $R_{223}$ may each independently be a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, each substituted with: a cyano group; —F; —Cl; —Br; —I; a $C_1$-$C_{20}$ alkyl group substituted with at least one cyano group; a $C_1$-$C_{20}$ alkyl group substituted with at least one —F; a $C_1$-$C_{20}$ alkyl group substituted with at least one —Cl; a $C_1$-$C_{20}$ alkyl group substituted with at least one —Br; a $C_1$-$C_{20}$ alkyl group substituted with at least one —I; or any combination thereof Emission Layer in the Intermediate Layer 150

When the light-emitting device 10 is a full-color light-emitting device, the emission layer may be patterned into a red emission layer, a green emission layer, and/or a blue emission layer, according to a representative sub-pixel. In one or more exemplary embodiments, the emission layer may have a stacked structure of two or more layers selected from the red emission layer, the green emission layer, and the blue emission layer, in which the two or more layers contact each other or are separated from each other. In one or more exemplary embodiments, the emission layer may include two or more materials selected from a red light-emitting material, a green light-emitting material, and a blue light-emitting material, in which the two or more materials are mixed with each other in a single layer to emit white light. In some exemplary embodiments, the emission layer may be patterned or include a blue emission layer.

The emission layer may include a host and the dopant. The dopant may include a phosphorescent dopant, a fluorescent dopant, or any combination thereof.

In the emission layer, an amount of the dopant may be in a range of about 0.01 parts by weight to about 15 parts by weight based on 100 parts by weight of the host, but the exemplary embodiments are not limited thereto.

Alternatively, the emission layer may include a quantum dot.

The thickness of the emission layer may be in a range of about 100 Å to about 1,000 Å, and for example, about 200 Å to about 600 Å. When the thickness of the emission layer is within this range, excellent light-emission characteristics may be obtained without a substantial increase in driving voltage.

Host in Emission Layer

The host may include a compound represented by Formula 301:

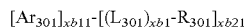   <Formula 301>

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xb1 may be 0, 1, 2, 3, 4, or 5, $R_{301}$ may be deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be 1, 2, 3, 4, or 5, and $Q_{301}$ to $Q_{303}$ are the same as described in connection with $Q_1$.

In one or more exemplary embodiments, when xb11 in Formula 301 is 2 or more, two or more $Ar_{301}$(s) may be linked to each other via a single bond.

In one or more exemplary embodiments, the host may include a compound represented by Formula 301-1, a compound represented by Formula 301-2, or any combination thereof:

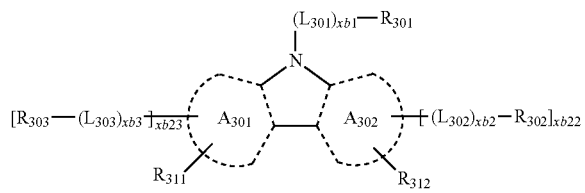   <Formula 301-1>

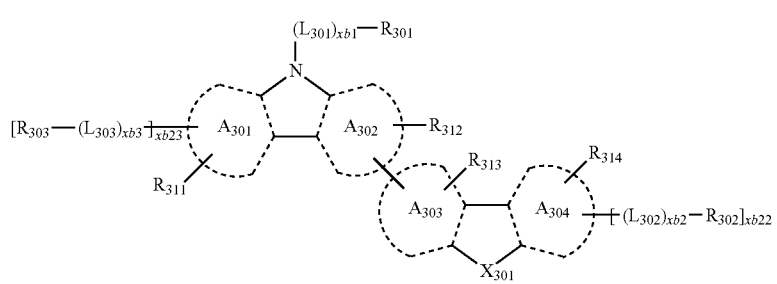   <Formula 301-2>

In Formulae 301-1 to 301-2, ring $A_{301}$ to ring $A_{304}$ may each independently be a $C_5$-$C_{60}$ carbocyclic group or a $C_1$-$C_{60}$ heterocyclic group, $X_{301}$ may be O, S, N-$[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ are the same as described above, $L_{302}$ to $L_{304}$ are each independently the same as described in connection with $L_{301}$, xb2 to xb4 are each independently the same as described in connection with xb1, and $R_{302}$ to $R_{305}$ and $R_{311}$ to $R_{314}$ are the same as described in connection with $R_{301}$.

In one or more exemplary embodiments, the host may include an alkaline earth-metal complex. For example, the host may include a Be complex (for example, Compound H55), a Mg complex, a Zn complex, or any combination thereof.

In one or more exemplary embodiments, the host may include at least one of Compounds H1 to H120, 9,10-Di(2-naphthyl)anthracene (ADN), 2-Methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof, but the exemplary embodiments are not limited thereto:

H1

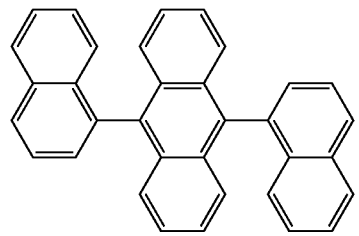

H2

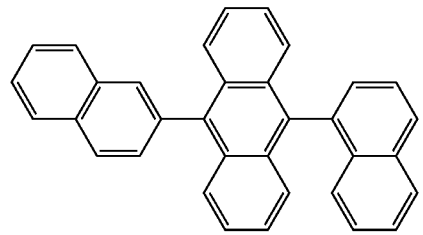

H3

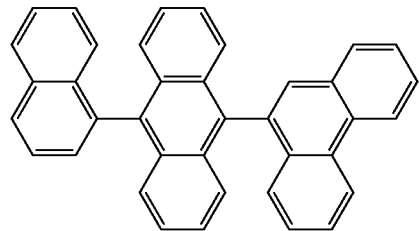

H4

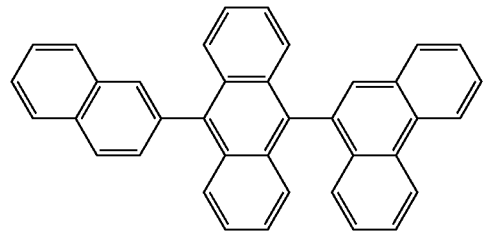

H5

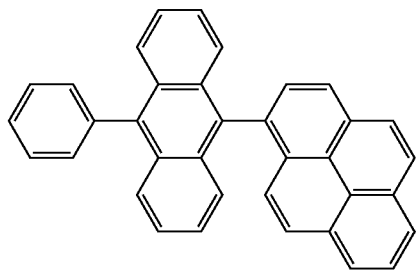

H6

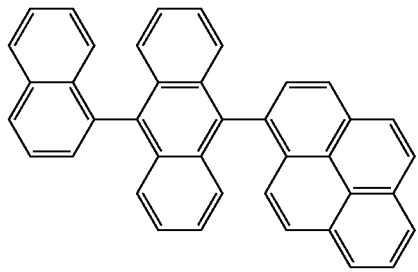

H7

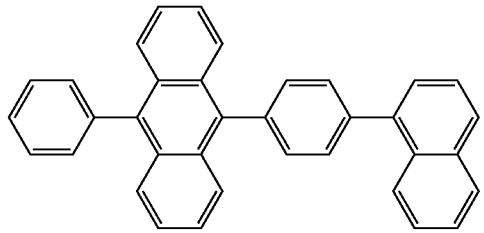

H8

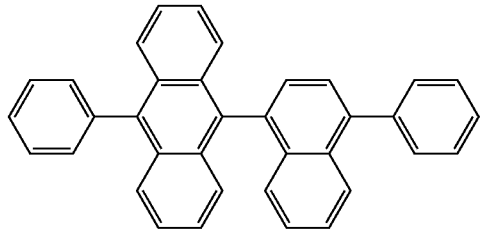

H9

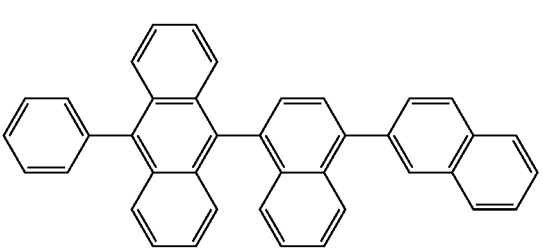

H10

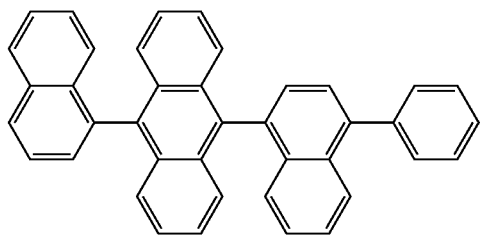

-continued
H11
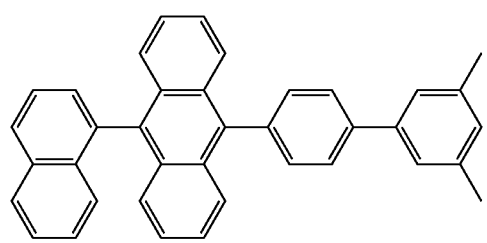
H12
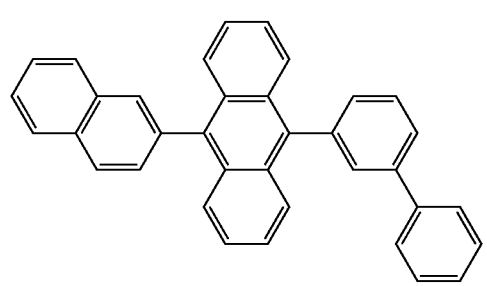
H13
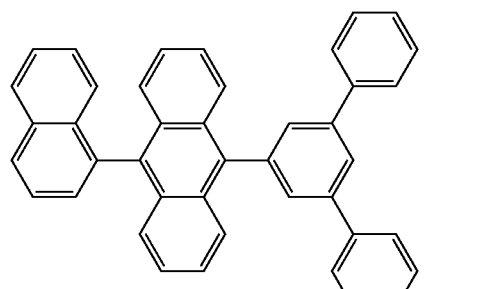
H14
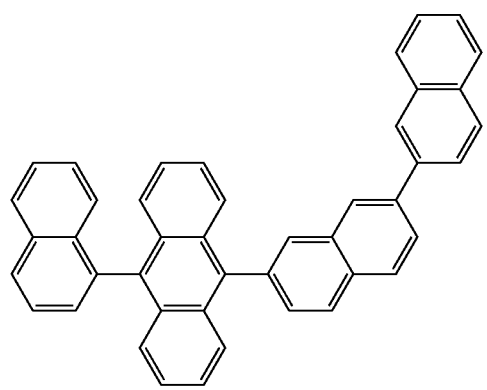
H15
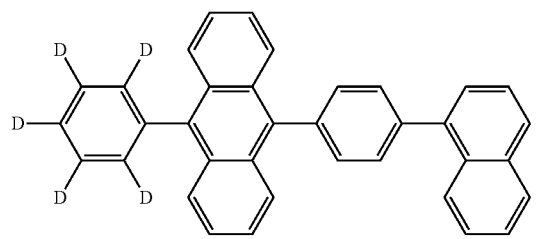
H16
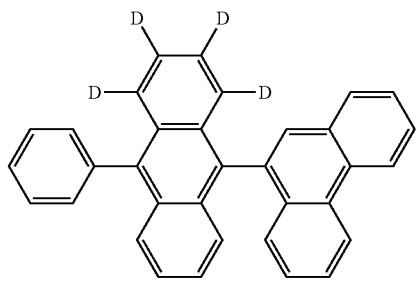
H17
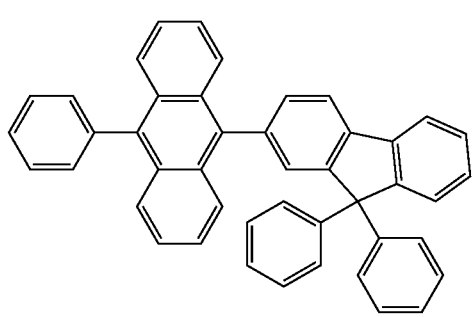
H18
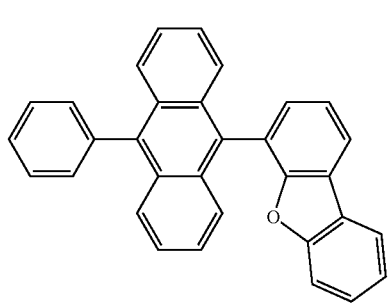
H19
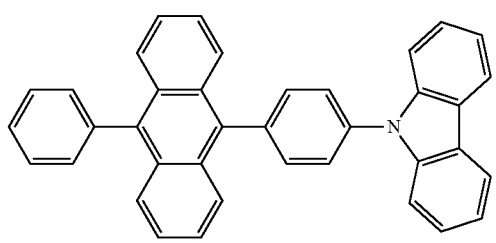
H20
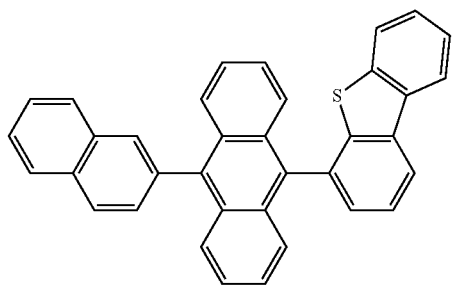

H21
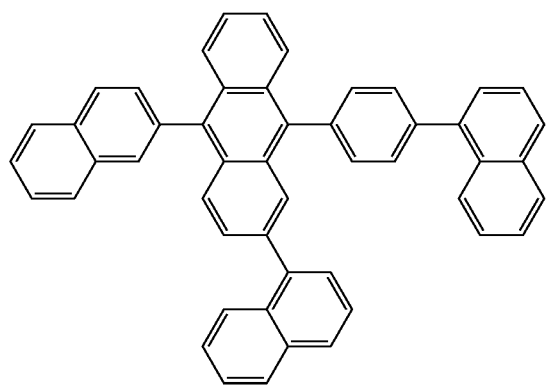
H22
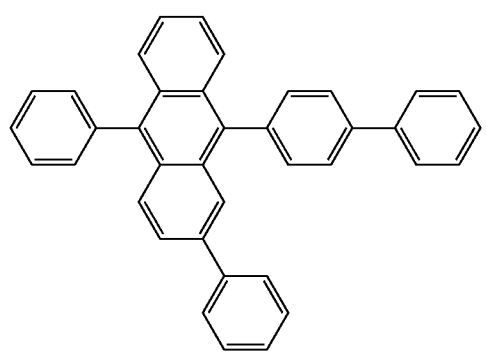
H23
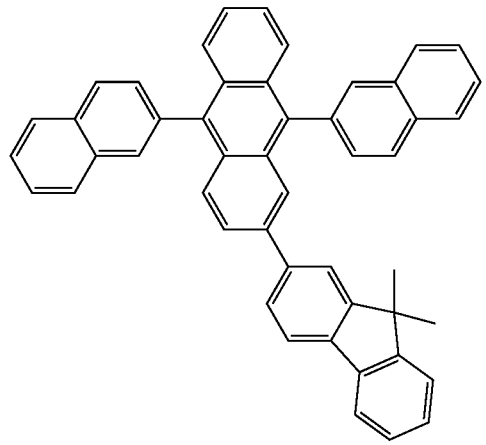
H24
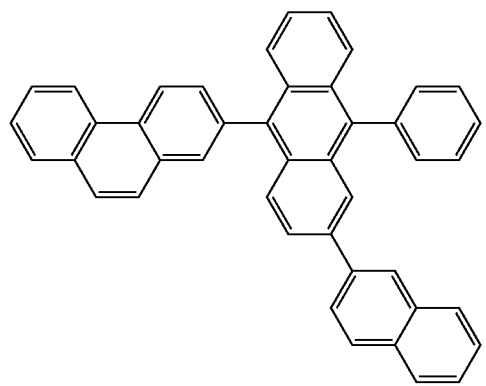
H25
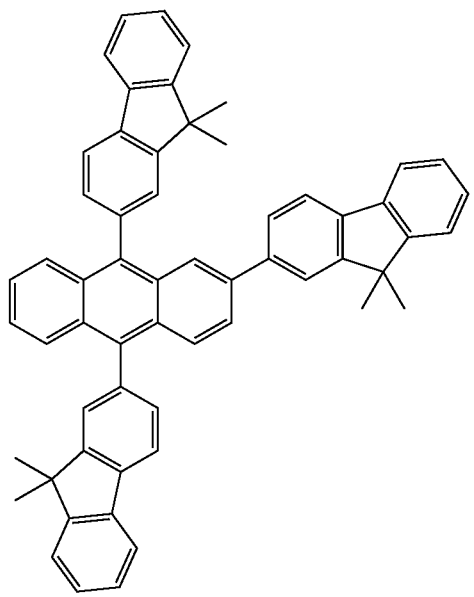
H26
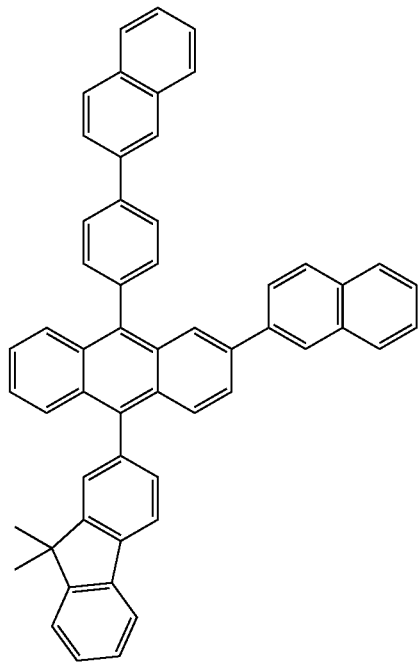

H27
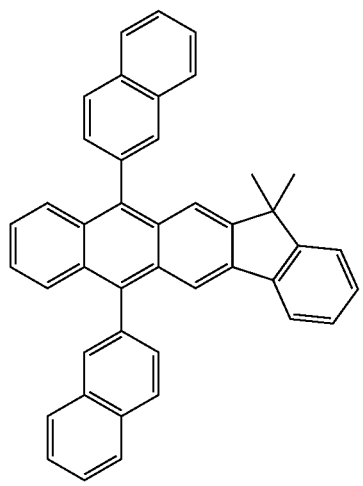
H28
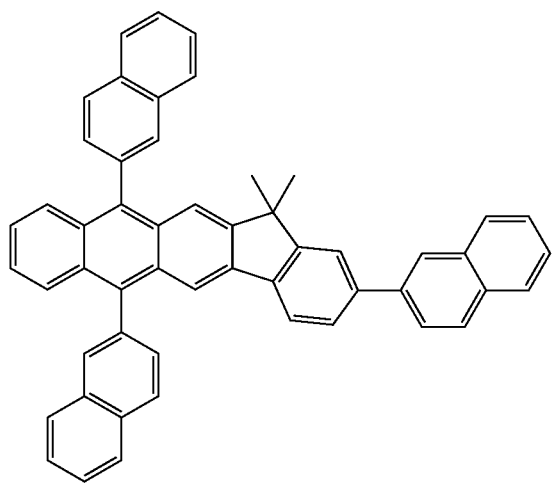
H29
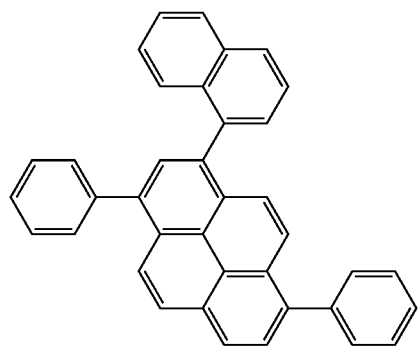
H30
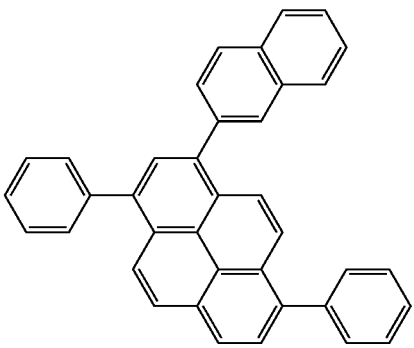
H31
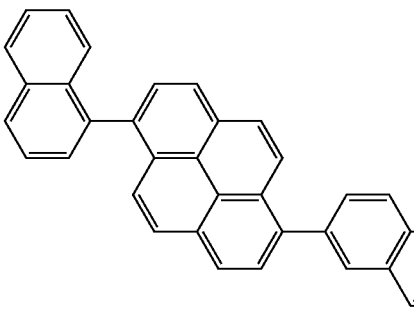
H32
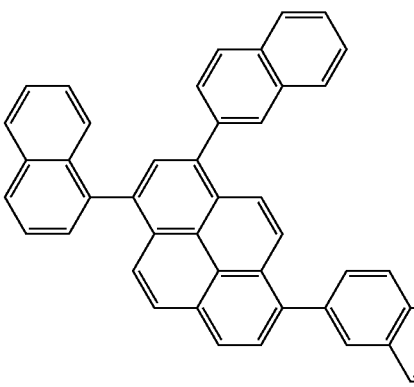
H33
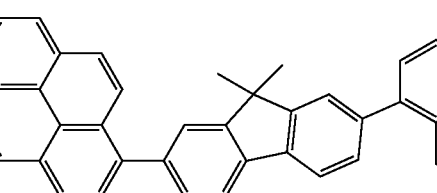
H34
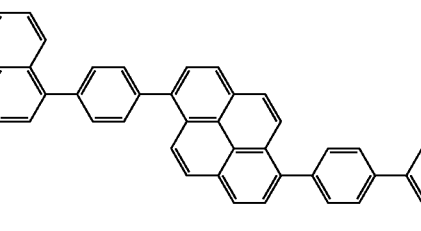

-continued
H35
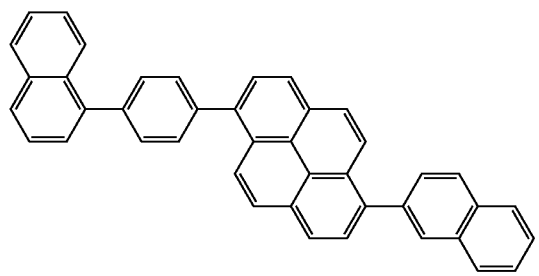
H36
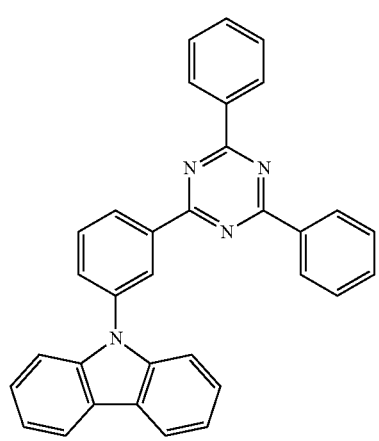
H37
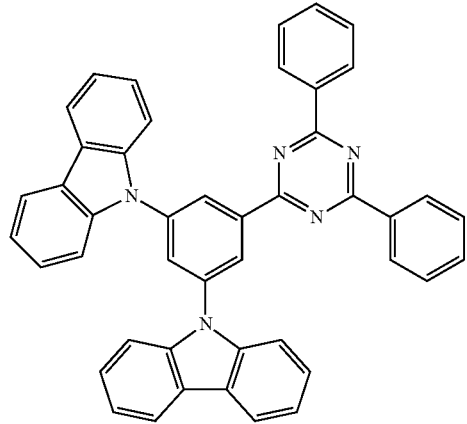
H38
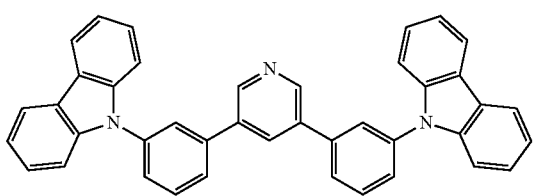
-continued
H39
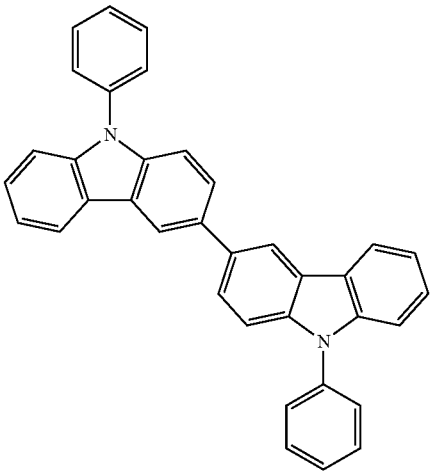
H40
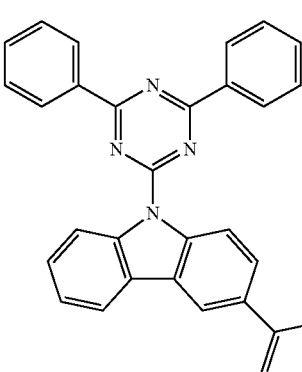
H41
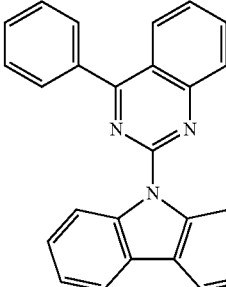
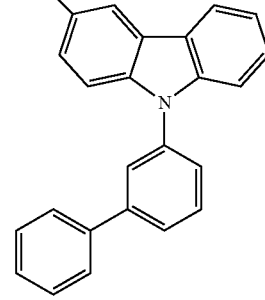

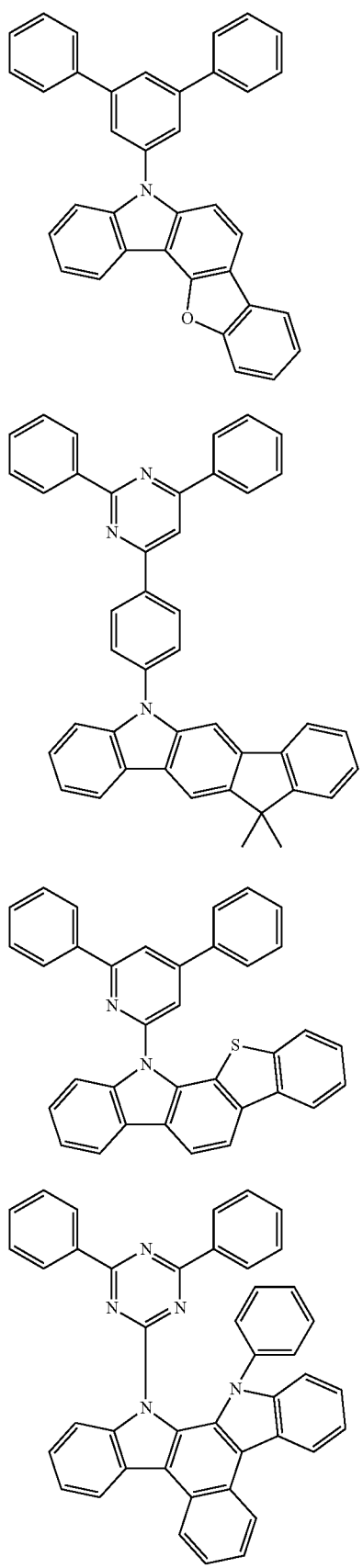
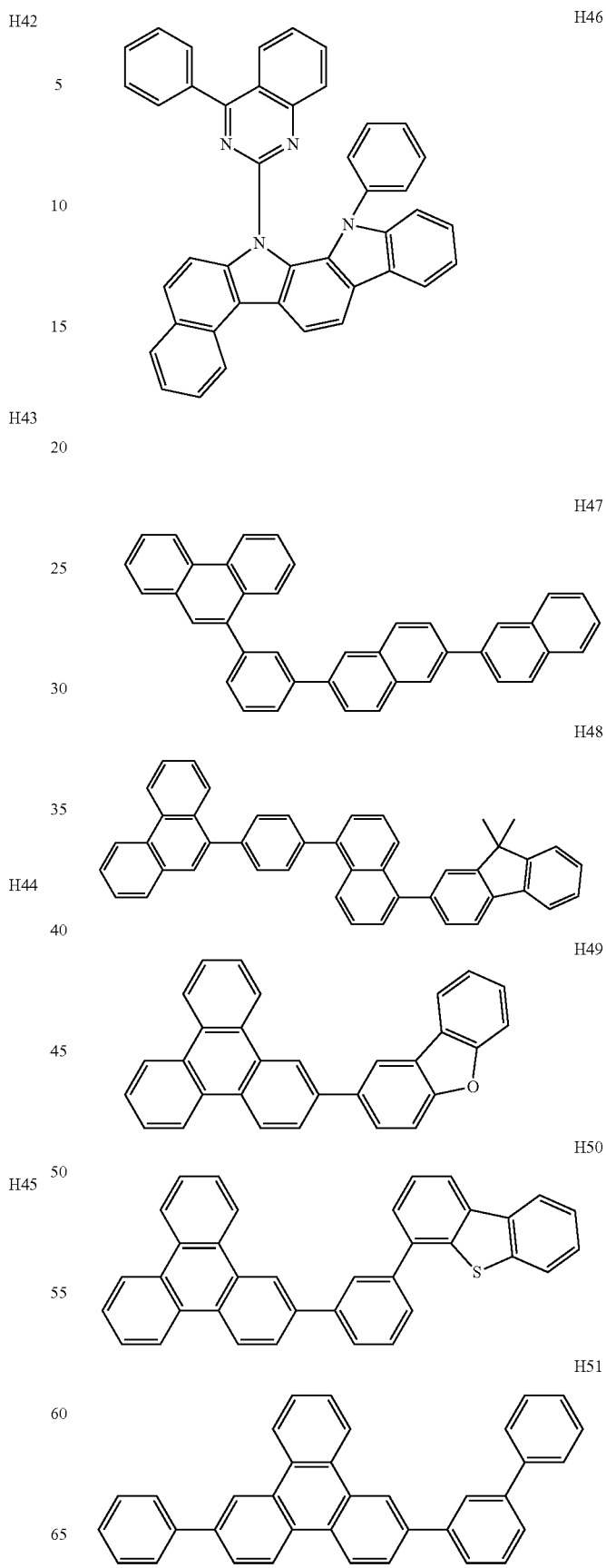

H52 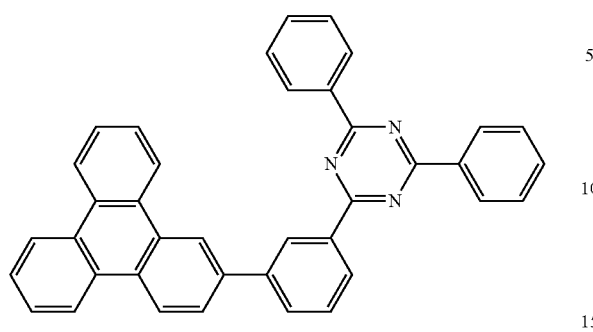
H56 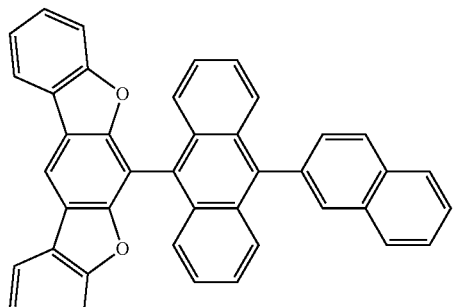
H53 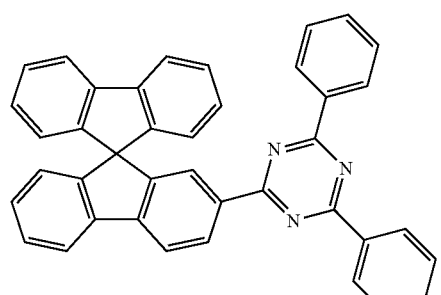
H57 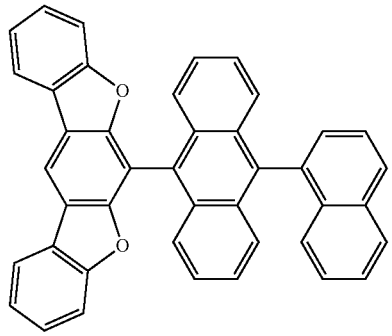
H54 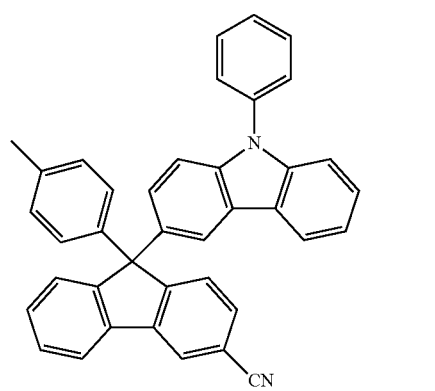
H58 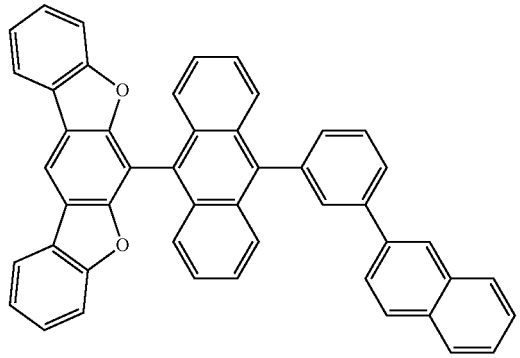
H55 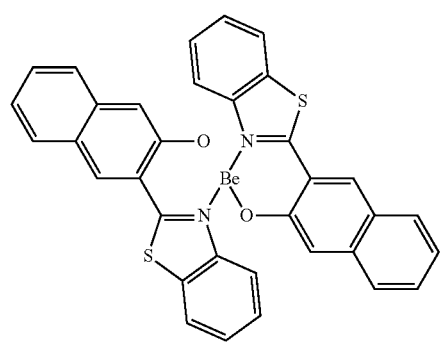
H59 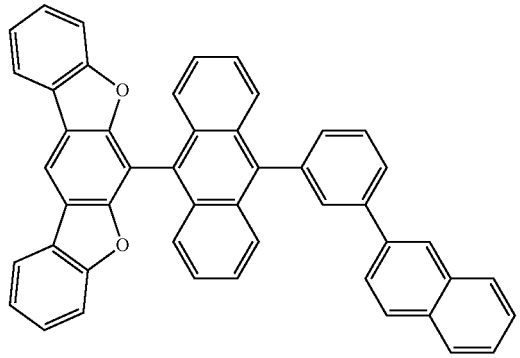

H60
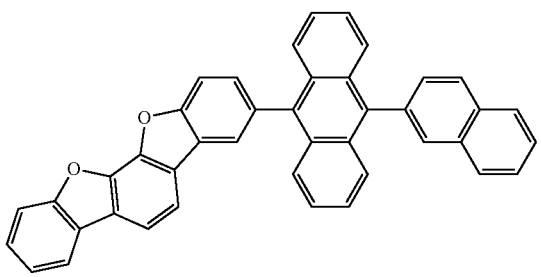
H61
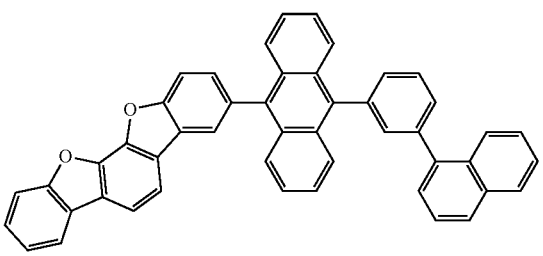
H62
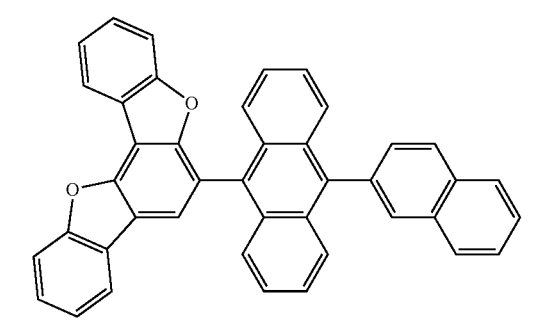
H63
H64
H65
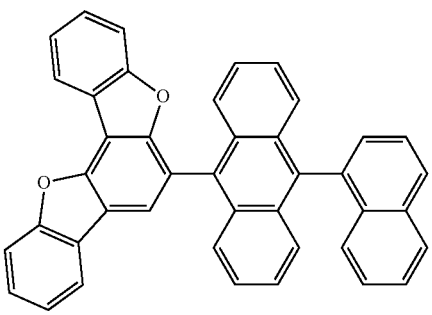
H66
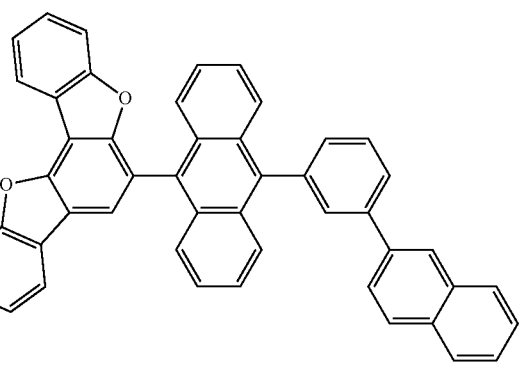
H67
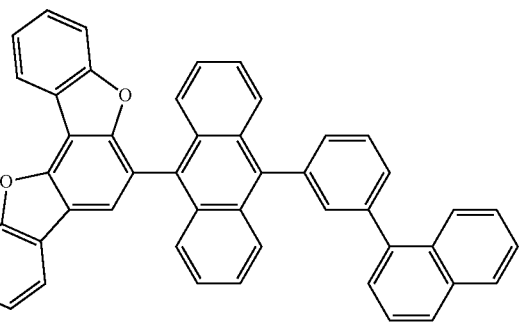
H68
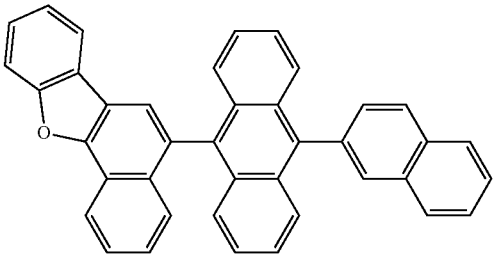
H69
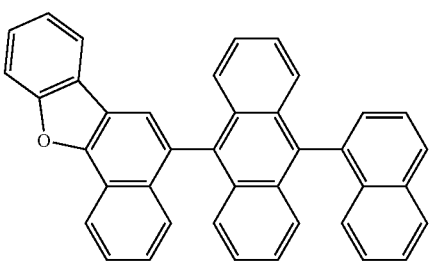

H70
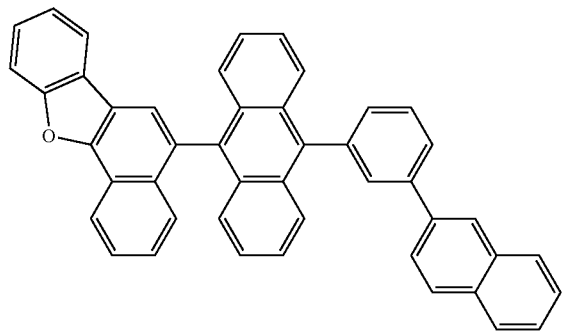
H71
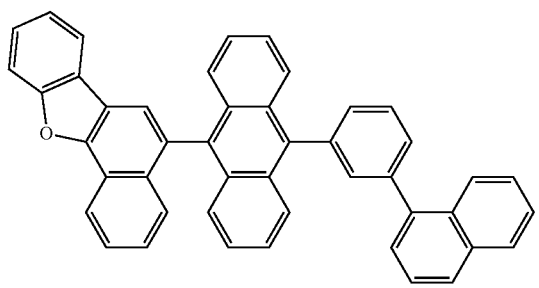
H72
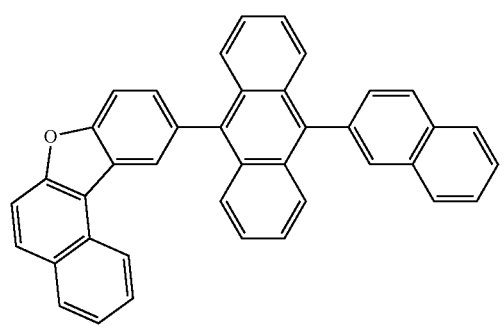
H73
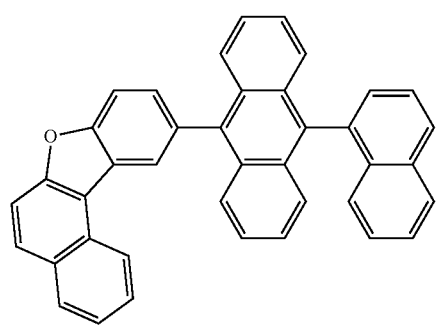
H74
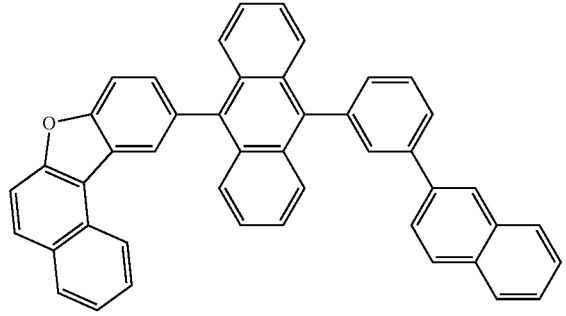
H75
H76
H77
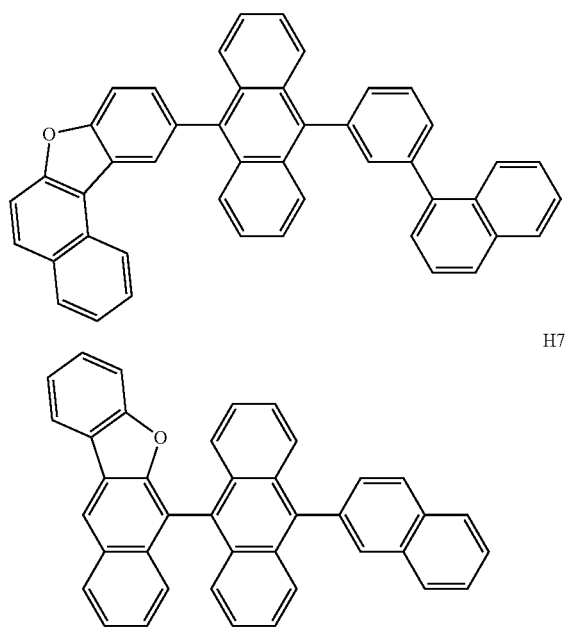
H78
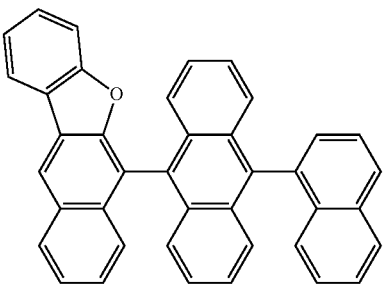

-continued
H79
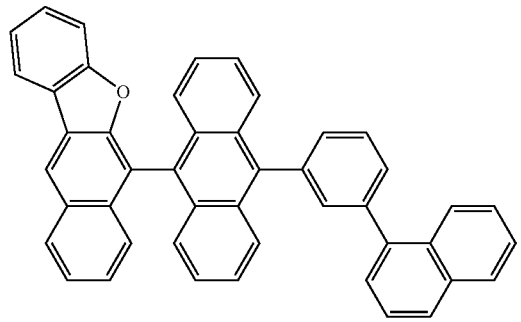
H80
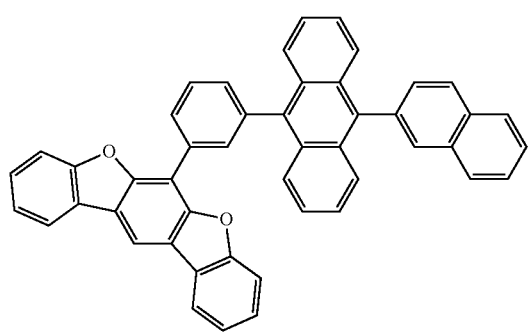
H81
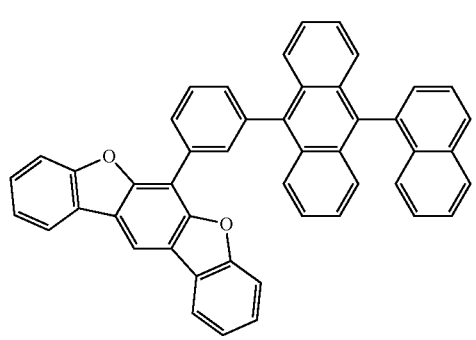
H82
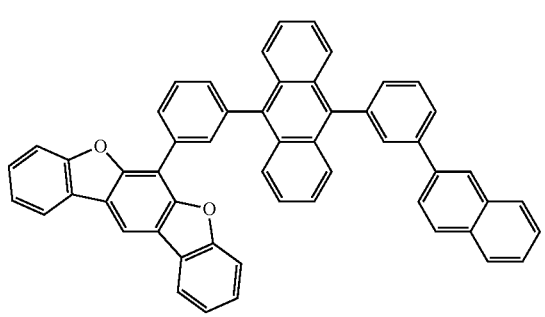
-continued
H83
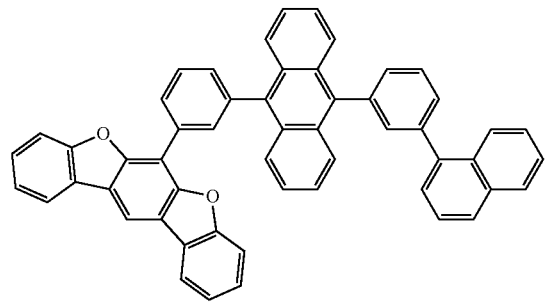
H84
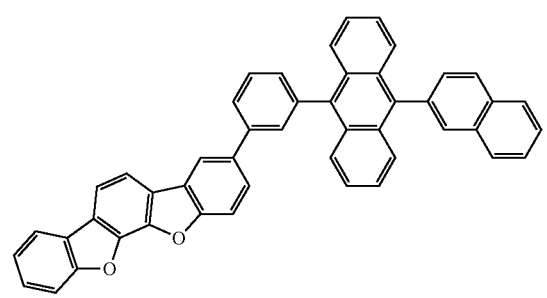
H85
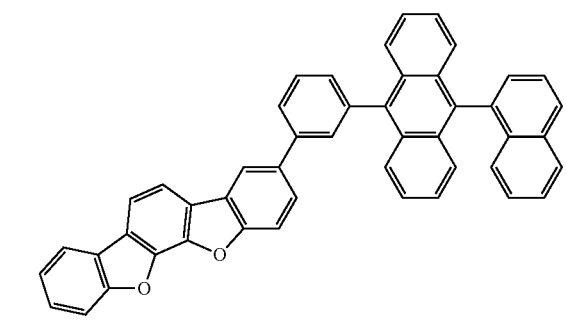
H86
H87
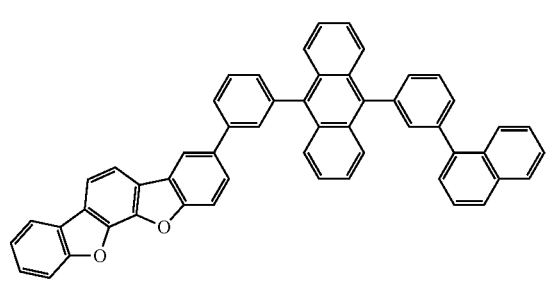

-continued
H88
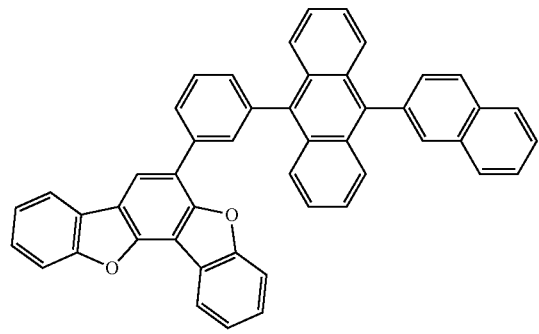
H89
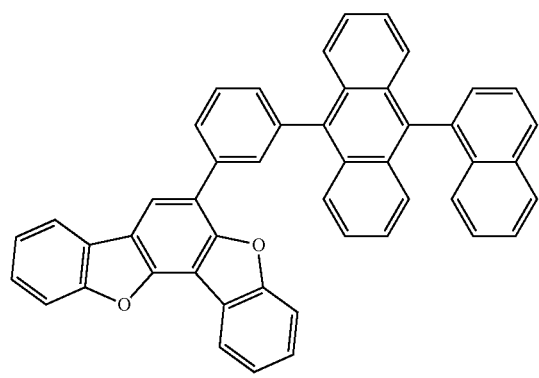
H90
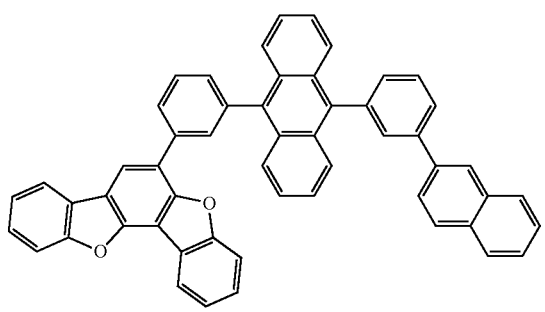
H91
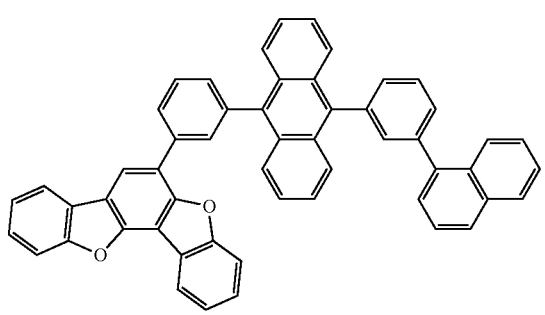
-continued
H92
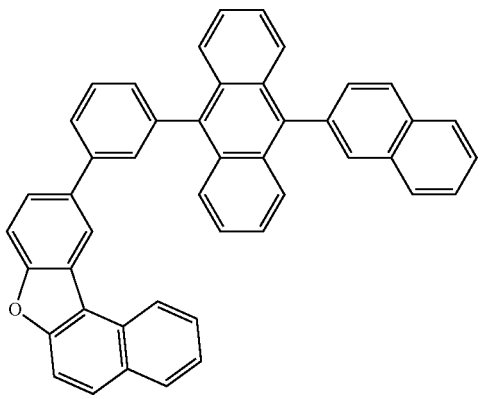
H93
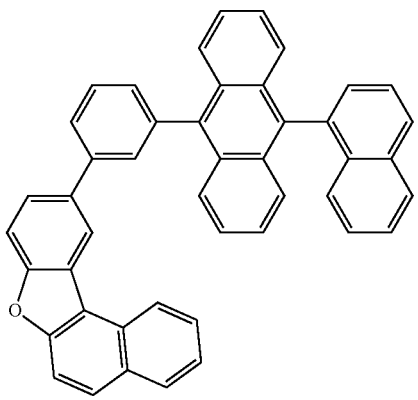
H94
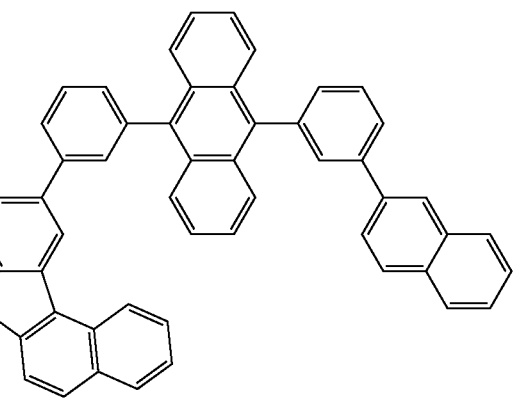
H95
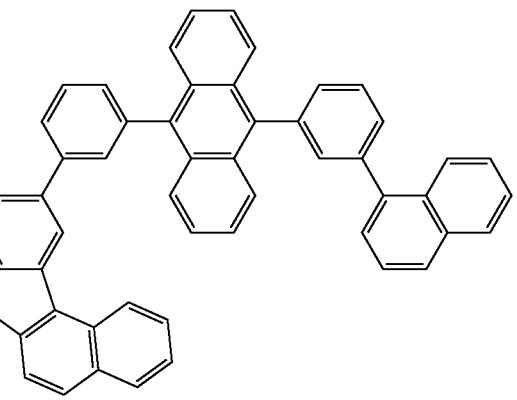

H96
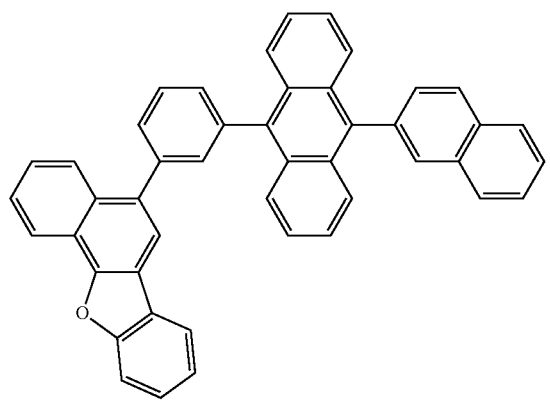
H97
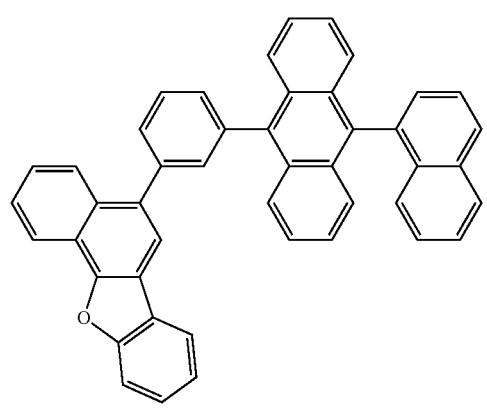
H98
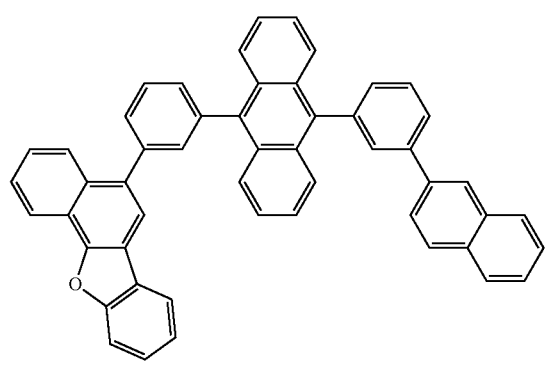
H99
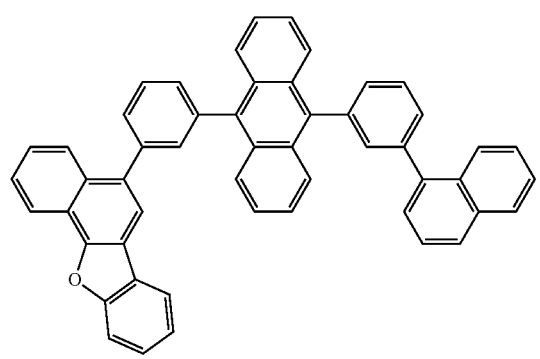
H100
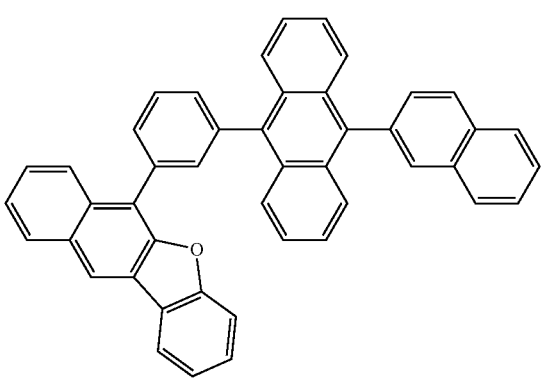
H101
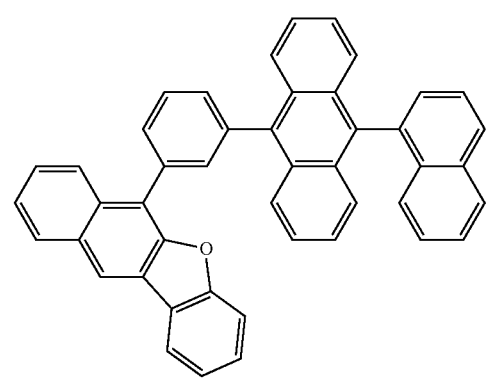
H102
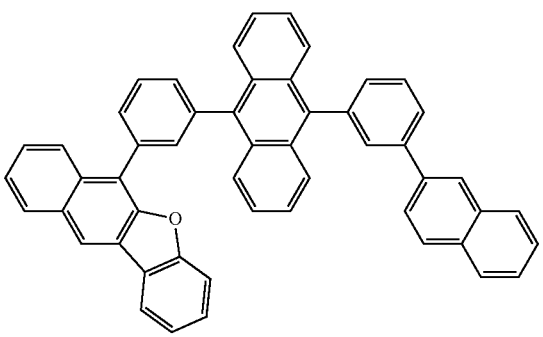
H103
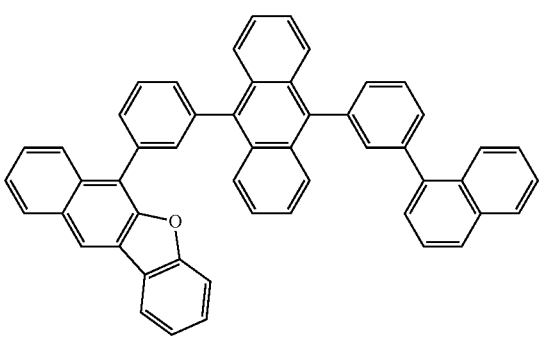

H104
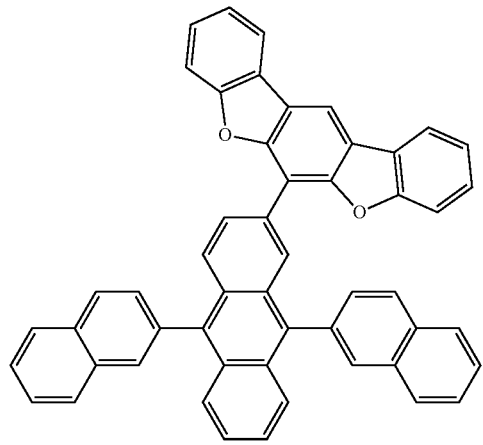
H105
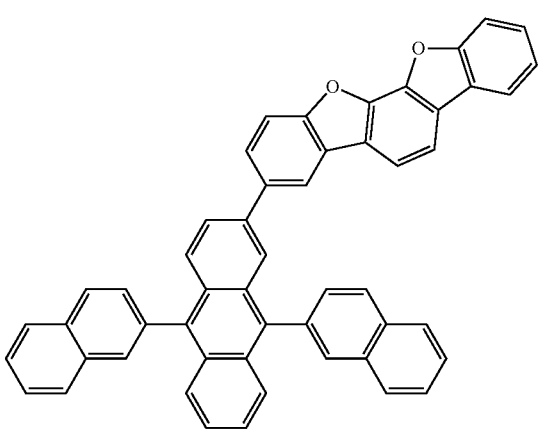
H106
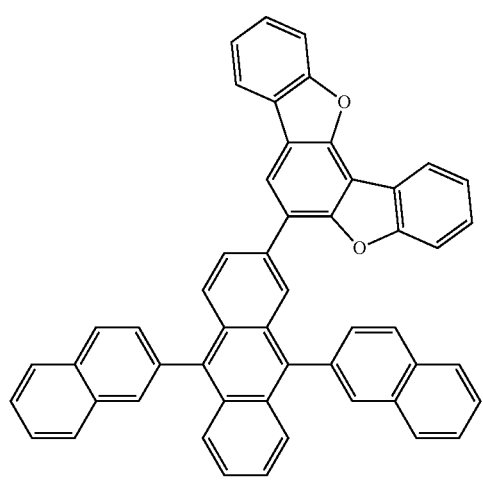
H107
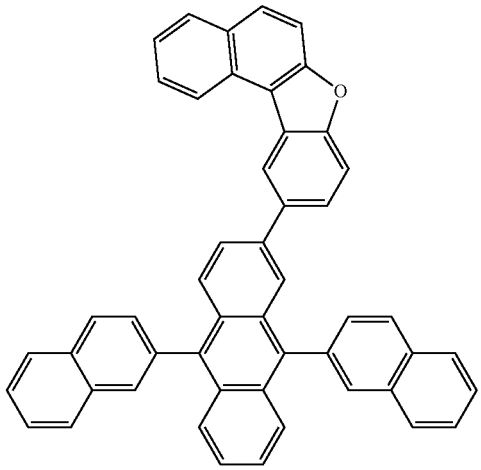
H108
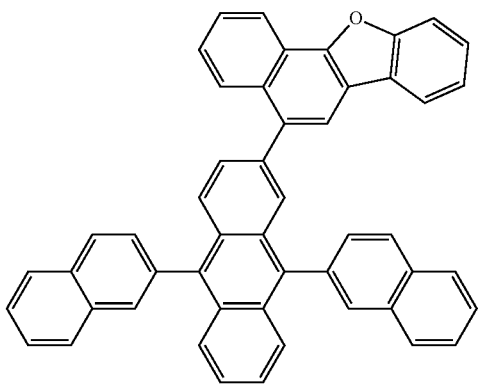
H109
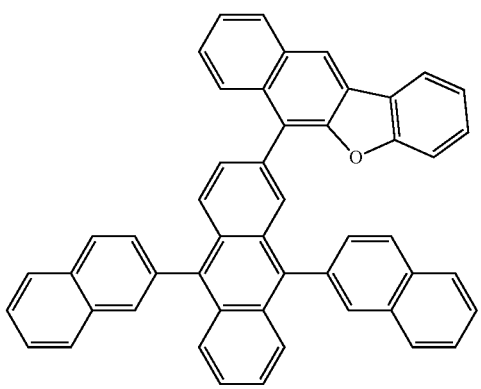
H110
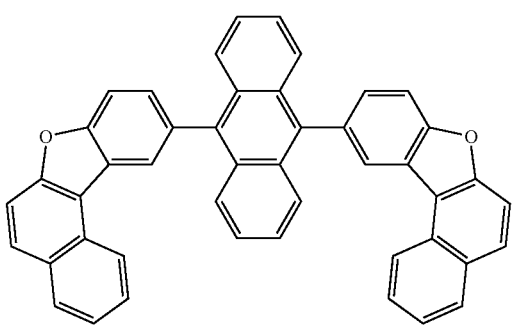

H111
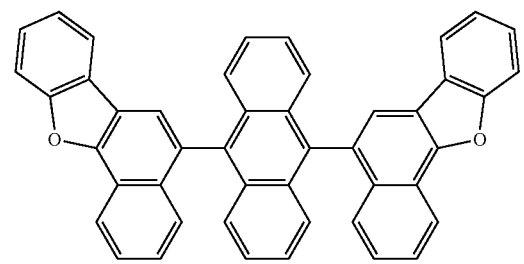
H112
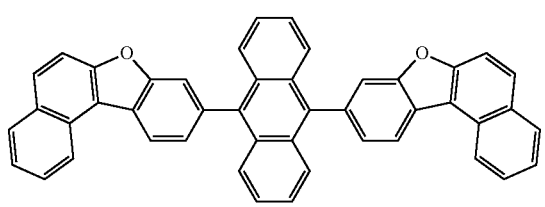
H113
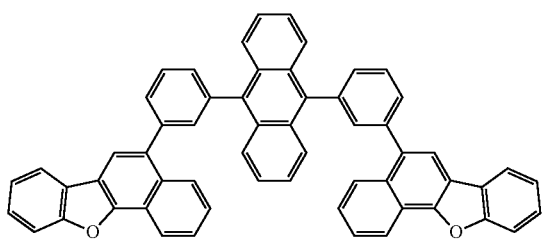
H114
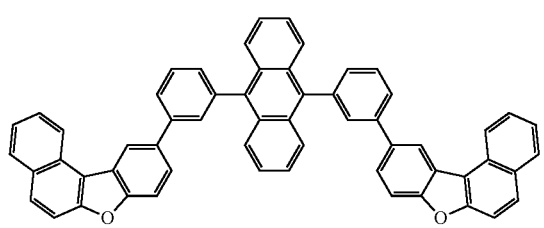
H115
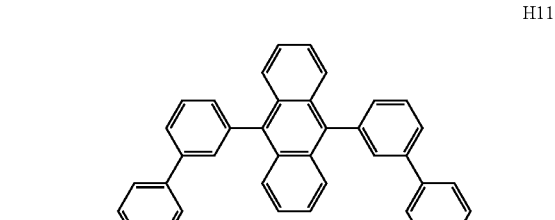
H116
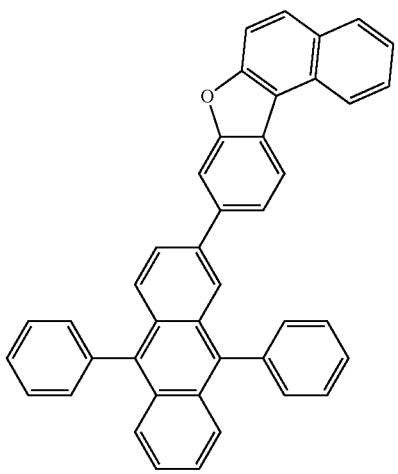
H117
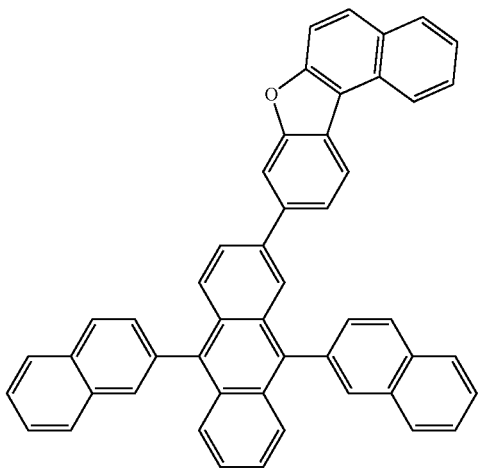
H118
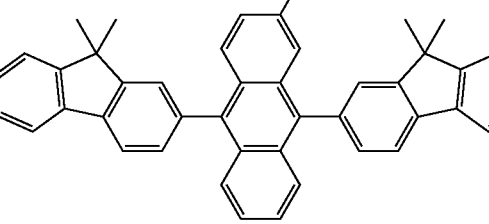

-continued

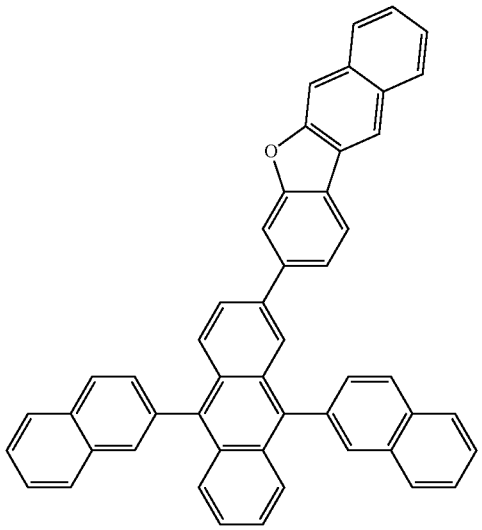
H119

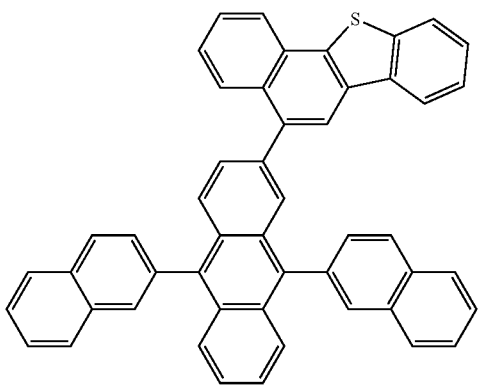
H120

Phosphorescent Dopant Included in Emission Layer in Intermediate Layer 150

The phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In one or more exemplary embodiments, the phosphorescent dopant may include an organometallic compound represented by Formula 401:

<Formula 401>
$M(L_{401})_{xc1}(L_{402})_{xc2}$

-continued

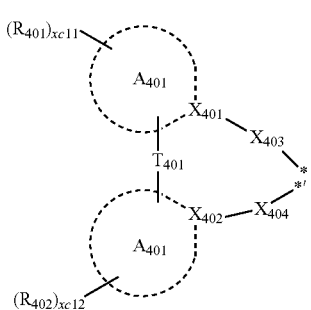

<Formula 402>

In Formulae 401 and 402,

M may be a transition metal (for example, iridium (Ir), platinum (Pt), palladium (Pd), osmium (Os), titanium (Ti), gold (Au) hafnium (Hf), europium (Eu), terbium (Tb), rhodium (Rh), rhenium (Re) or thulium (Tm)), $L_{401}$ may be a ligand represented by Formula 402, and xc1 may be 1, 2, or 3, wherein, when xc1 is 2 or more, two or more $L_{401}$(s) may be identical to or different from each other, $L_{402}$ may be an organic ligand, and xc2 may be 0, 1, 2, 3, or 4, wherein, when xc2 is two or more, two or more of $L_{402}$ may be identical to or different from each other, $X_{401}$ and $X_{402}$ may each independently be nitrogen or carbon, A ring $A_{401}$ and a ring $A_{402}$ may each independently be a $C_5$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)—*', *—C($Q_{411}$)($Q_{412}$)—*', *—C($Q_{411}$)=C($Q_{412}$)—*', *—C($Q_{411}$)=*', or *=C($Q_{411}$)=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$, xc11 and xc12 may each independently be an integer from 0 to 10, and

* and *' in Formula 402 each indicate a binding site to M in Formula 401.

In one or more exemplary embodiments, in Formula 402, i) $X_{401}$ may be nitrogen, and $X_{402}$ may be carbon, or ii) each of $X_{401}$ and $X_{402}$ may be nitrogen.

In one or more exemplary embodiments, when xc1 in Formula 402 is 2 or more, two rings $A_{401}$(s) in two or more $L_{401}$(s) may optionally linked to each other via $T_{402}$, which is a linking group, or two rings $A_{402}$(s) may optionally linked to each other via $T_{403}$, which is a linking group (see Compound PD1 to PD4 and PD7). $T_{402}$ and $T_{403}$ are the same as described in connection with $T_{401}$.

$L_{402}$ in Formula 401 may be an organic ligand. In one or more exemplary embodiments, $L_{402}$ may include a halogen group, a diketone group (for example, a acetylacetonate group), a carboxylic acid group (for example, a picolinate group), —C(=O), a isonitrile group, a —CN group, a phosphorus group (for example, a phosphine group, a phosphite group, and the like), or any combination thereof, but the exemplary embodiments are not limited thereto.

The phosphorescent dopant may include, for example, a compound selected from Compounds PD1 to PD25, or any combination thereof, but the exemplary embodiments are not limited thereto:

PD1

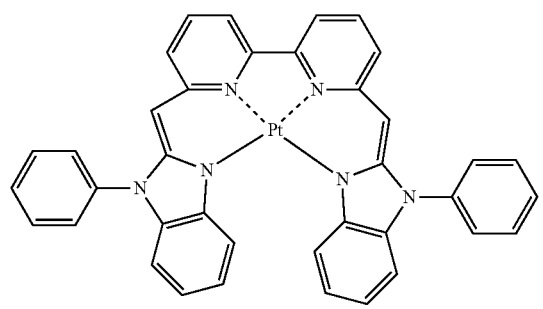

PD2

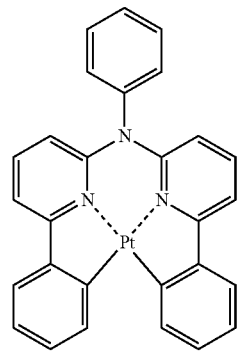

PD3

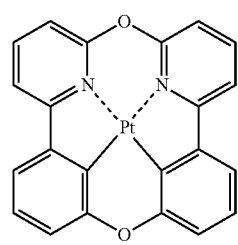

PD4

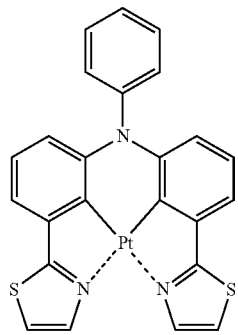

PD5

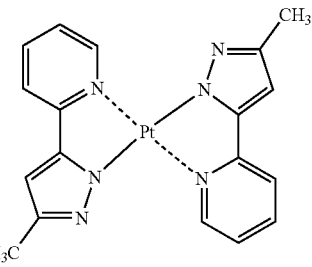

PD6

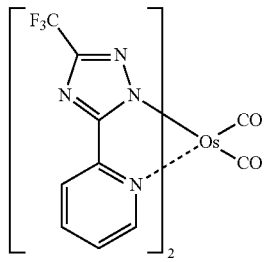

PD7

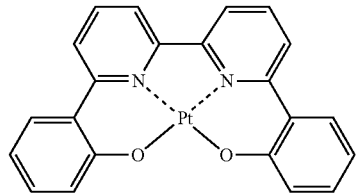

PD8

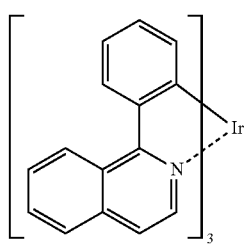

PD9

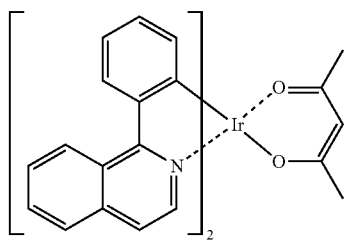

PD10 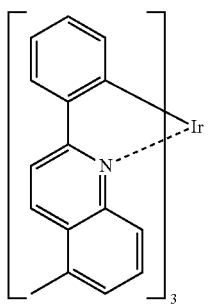
PD11 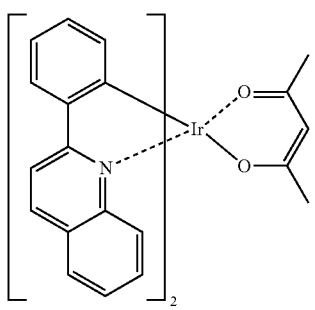
PD12 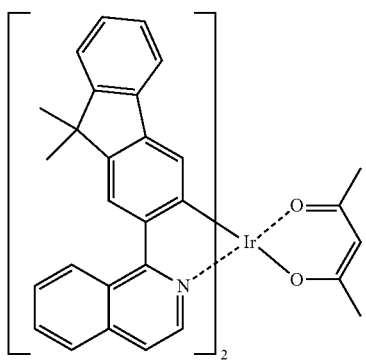
PD13 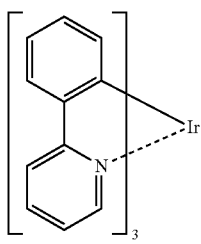
PD14 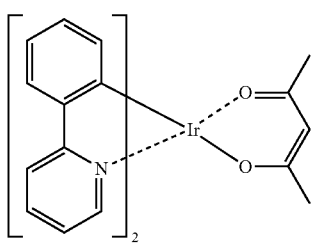
PD15 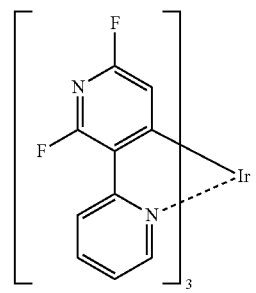
PD16 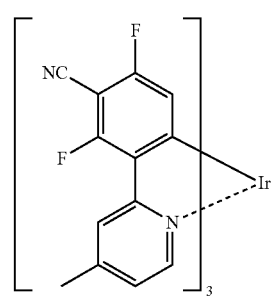
PD17 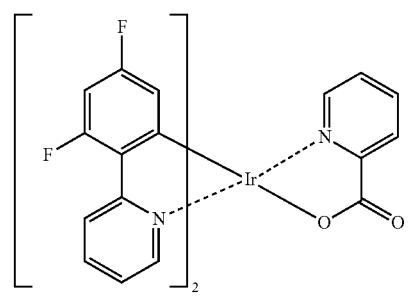
PD18 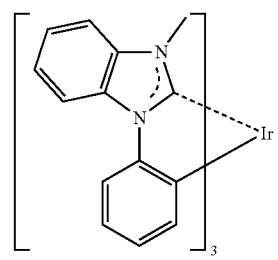
PD19 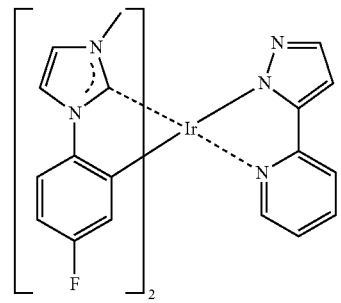

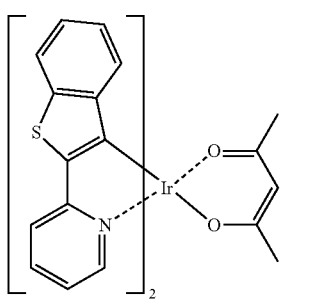

PD20

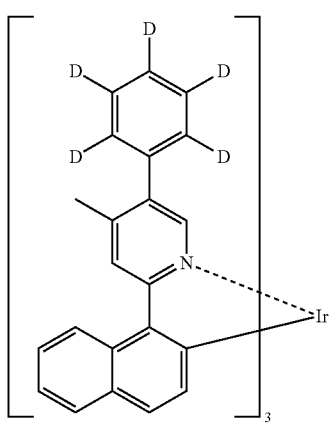

PD21

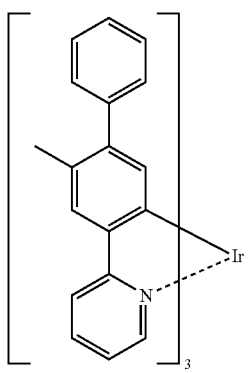

PD22

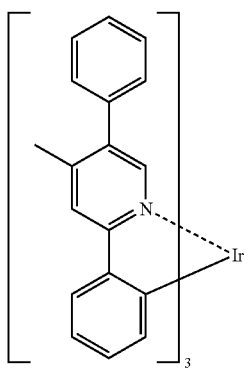

PD23

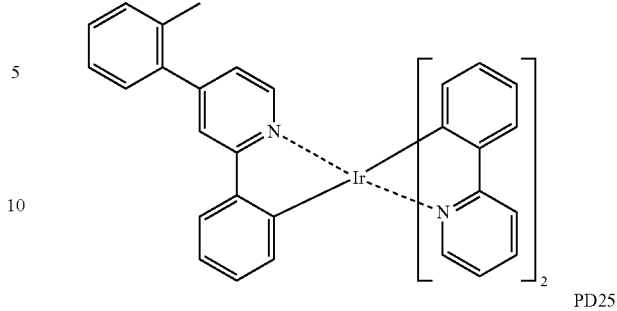

PD24

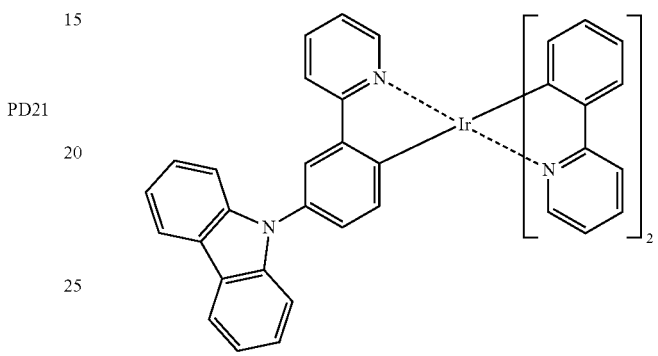

PD25

Fluorescent Dopant in the Emission Layer

The fluorescent dopant may include a compound of Formula 1, and the emission layer may be a fluorescent emission layer.

The fluorescent dopant may further include, for example, an arylamine compound or a styrylamine compound, in addition to the compound of Formula 1.

In one or more exemplary embodiments, the fluorescent dopant may further include a compound represented by Formula 501:

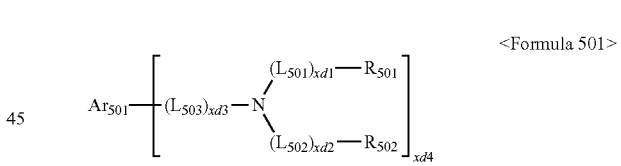

<Formula 501>

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xd1 to xd3 may each independently be 0, 1, 2, or 3, $R_{501}$ and $R_{502}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, or a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and xd4 may be 1, 2, 3, 4, 5, or 6.

In one or more exemplary embodiments, $Ar_{501}$ in Formula 501 may be a condensed cyclic group in which three or more monocyclic groups are condensed with each other (for example, an anthracene group, a chrysene group, a pyrene group, or the like).

In one or more exemplary embodiments, xd4 in Formula 501 may be 2, but the exemplary embodiments are not limited thereto.

In one or more exemplary embodiments, the fluorescent dopant may include one of Compounds FD1 to FD36, 4,4'-bis(2,2'-diphenylethenyl)-biphenyl (DPVBi), 4,4'-bis[4-(di-p-tolylamino)styryl]biphenyl (DPAVBi), or any combination thereof:

FD1

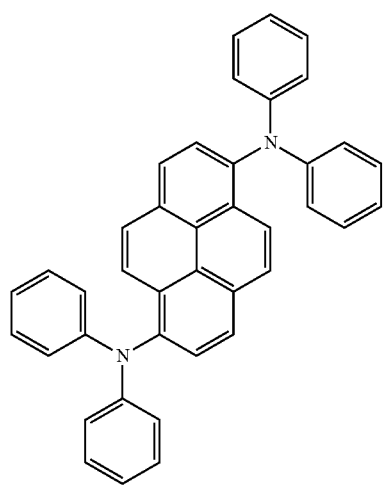

FD2

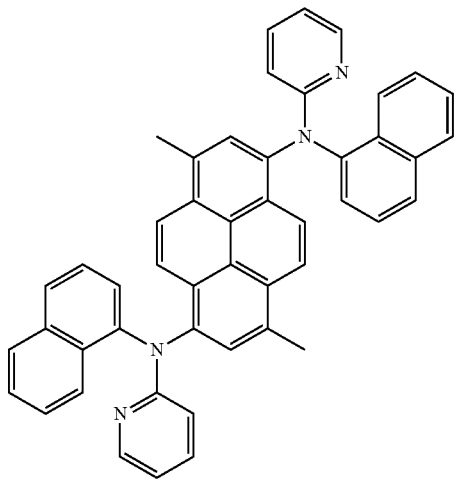

FD3

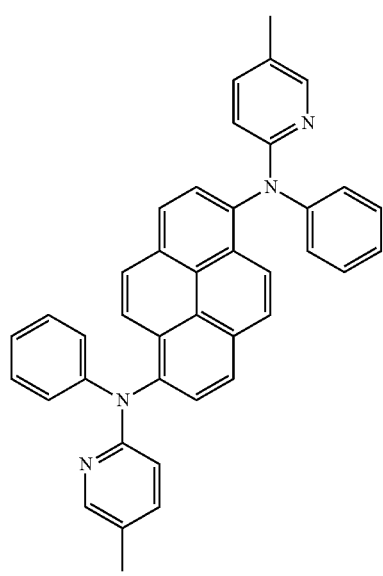

FD4

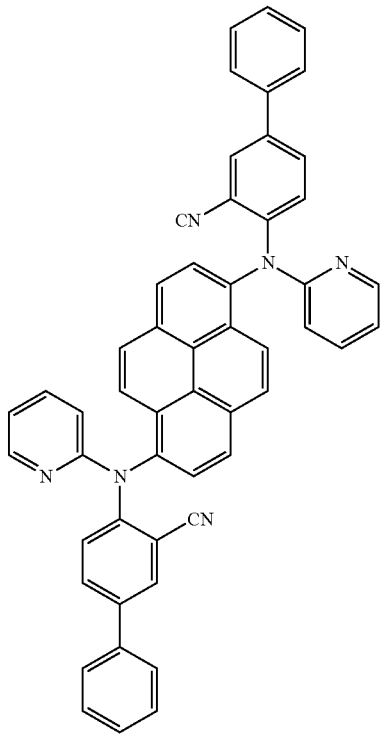

-continued
FD5
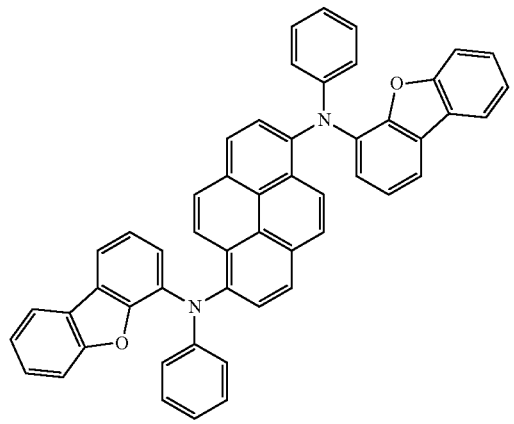
FD6
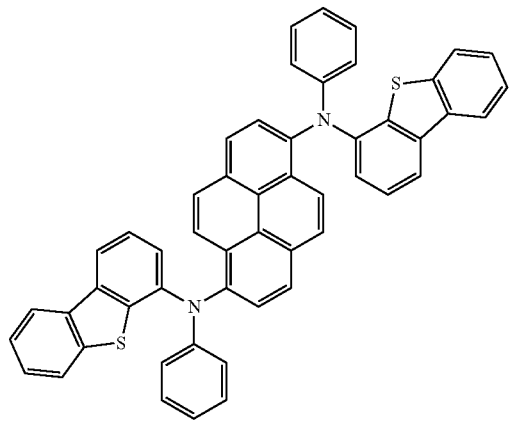
FD7
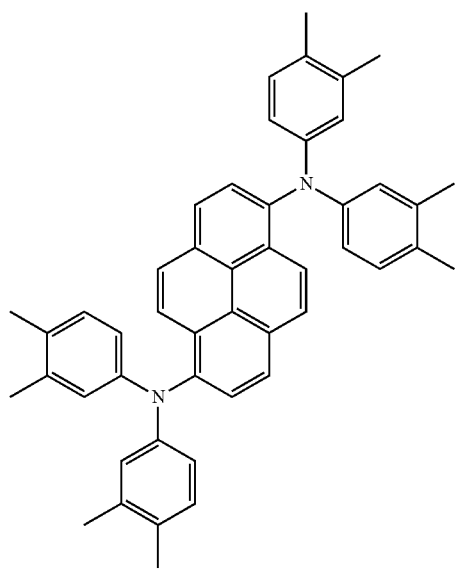
FD8
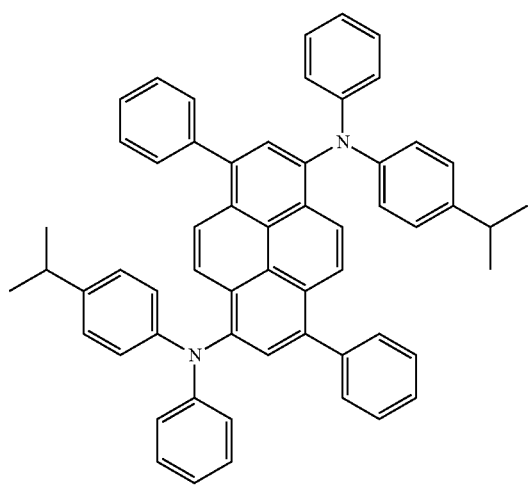
FD9
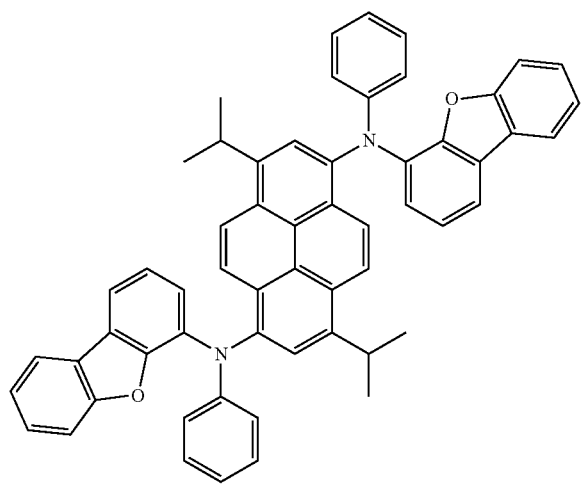

-continued
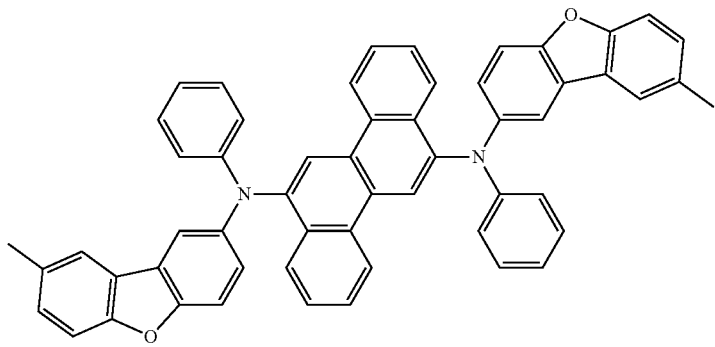
FD10
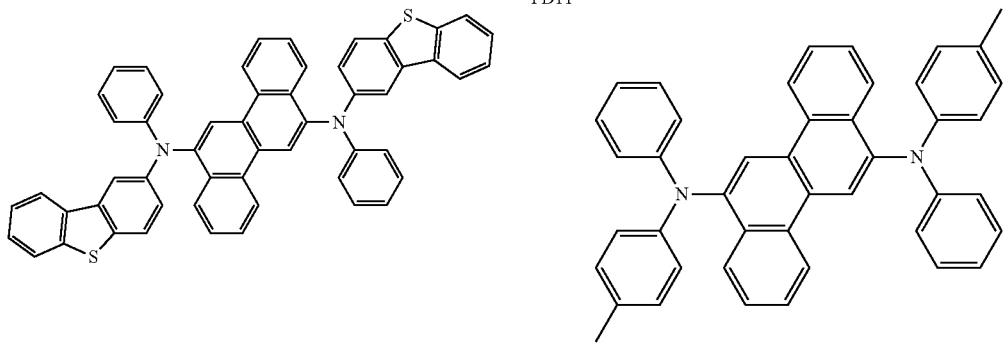
FD11  FD12
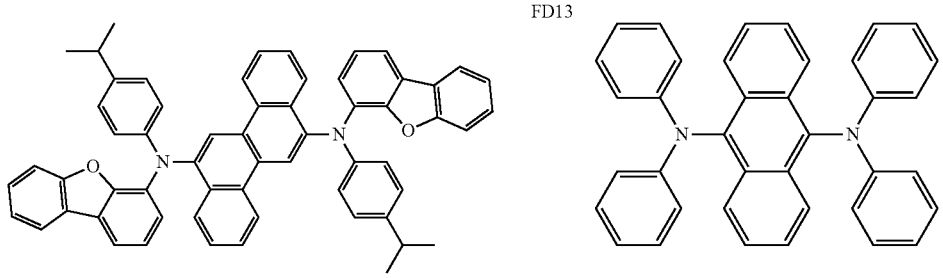
FD13  FD14
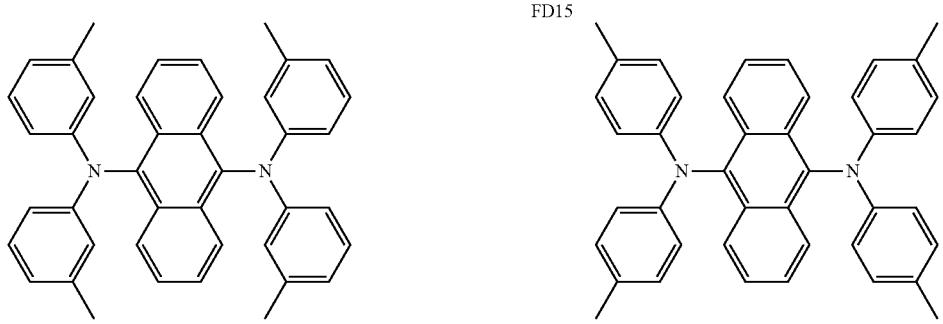
FD15  FD16

-continued
FD17
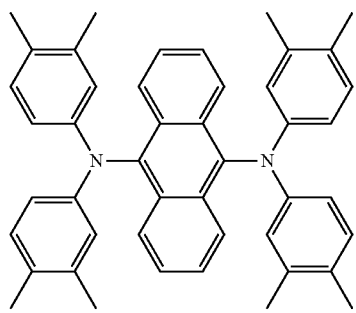
FD18
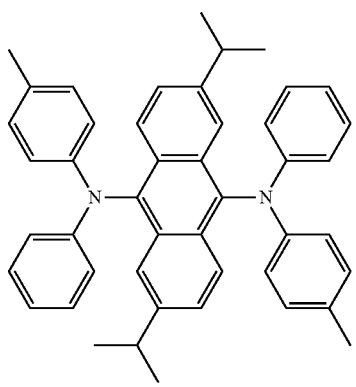
FD19
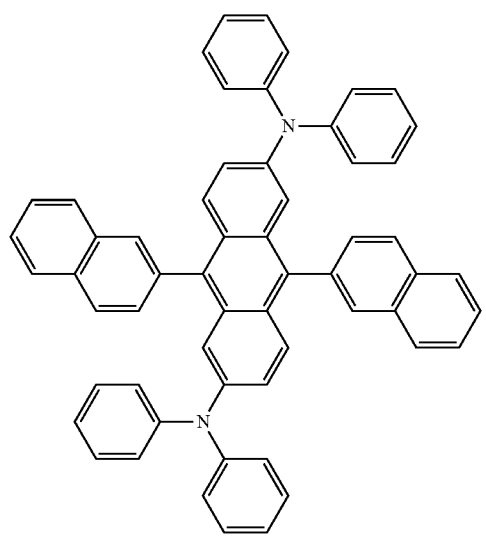
FD20
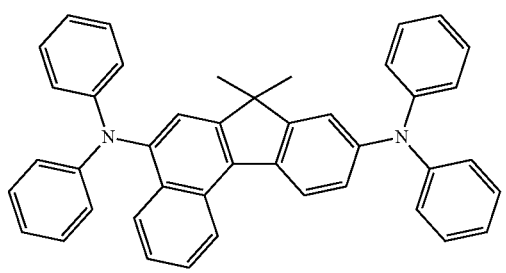
FD21
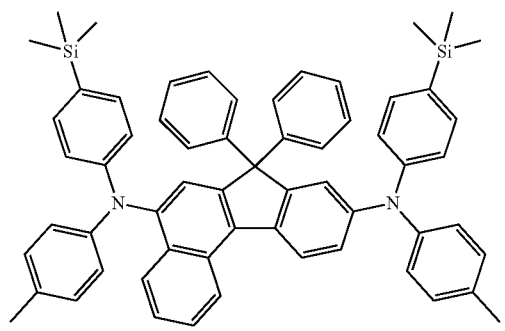
FD22
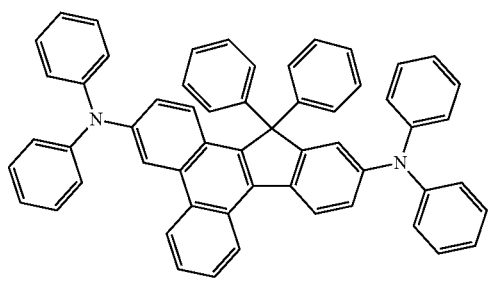
FD23
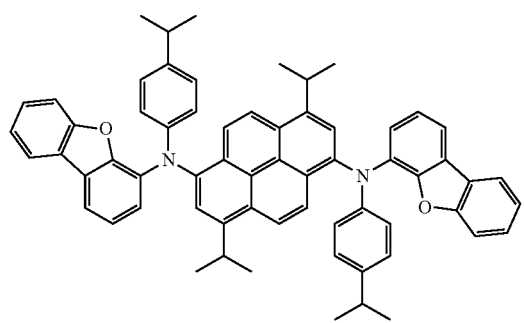
FD24
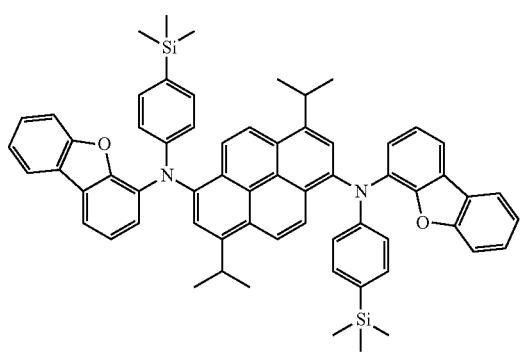

-continued
FD25
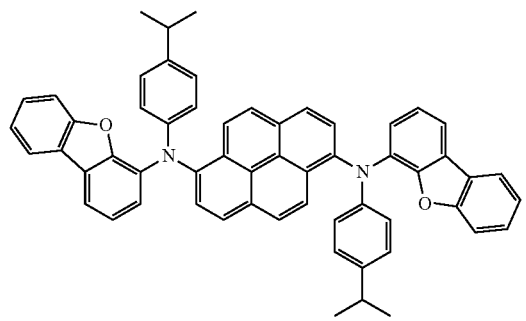
FD26
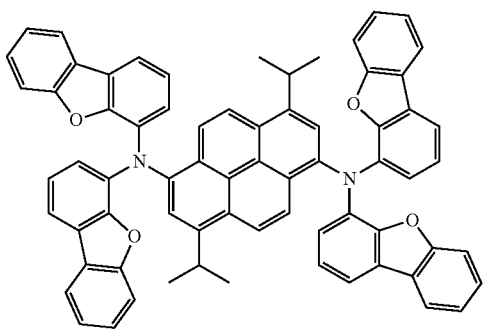
FD27
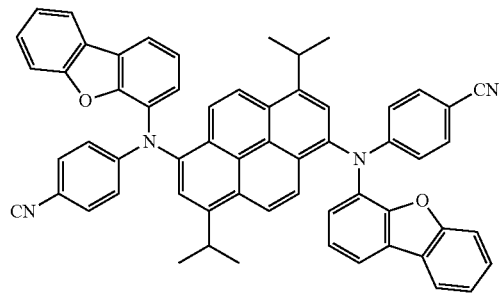
FD28
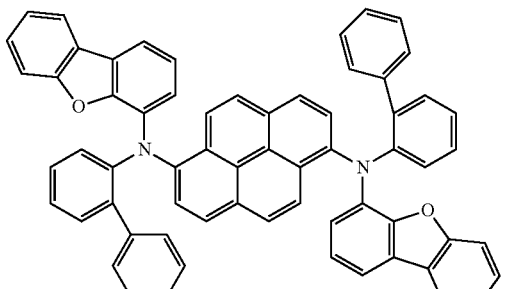
FD29
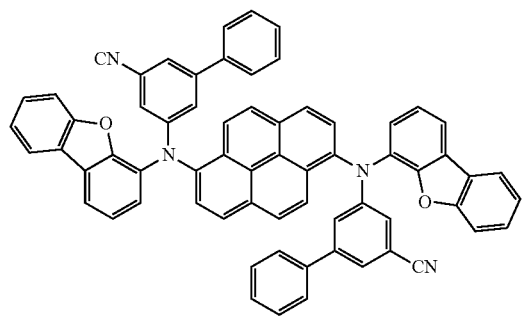
FD30
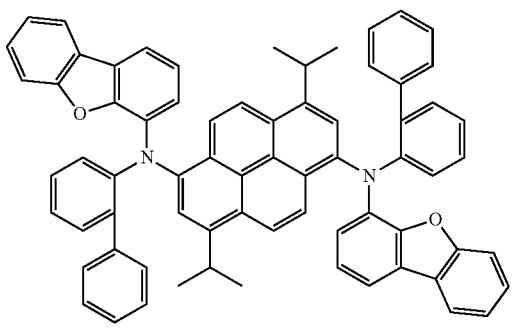
FD31
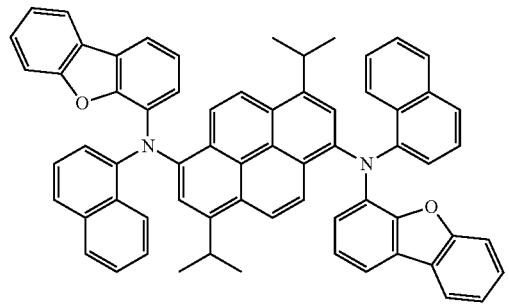
FD32
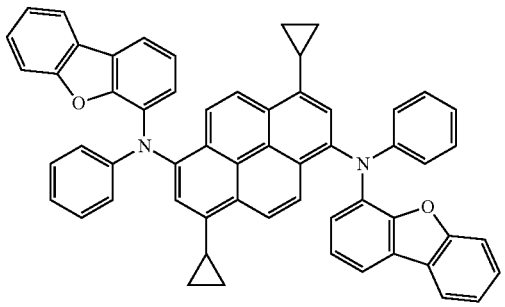
FD33
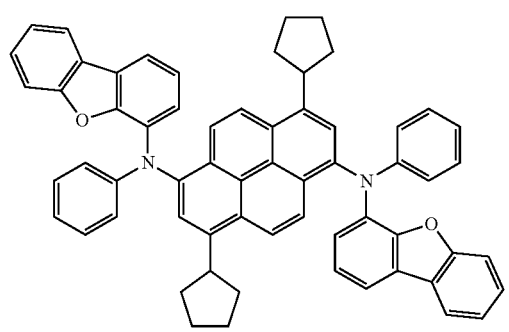
FD34
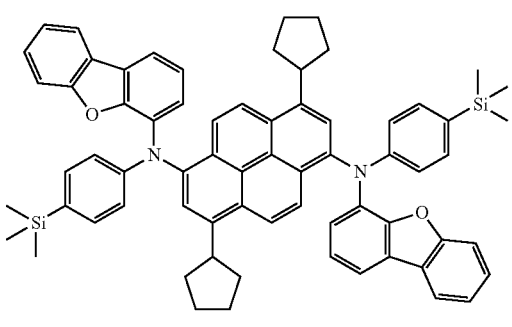

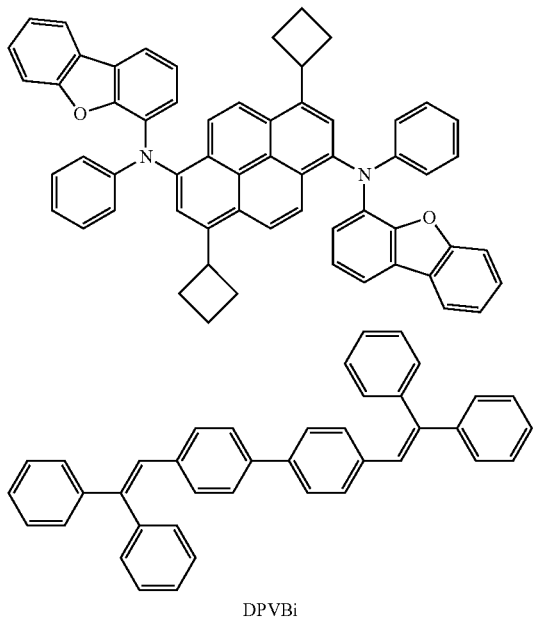

FD35

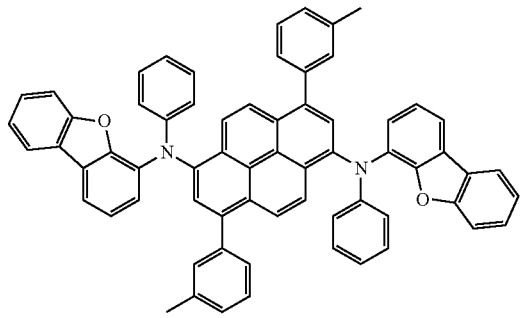

FD36

DPVBi

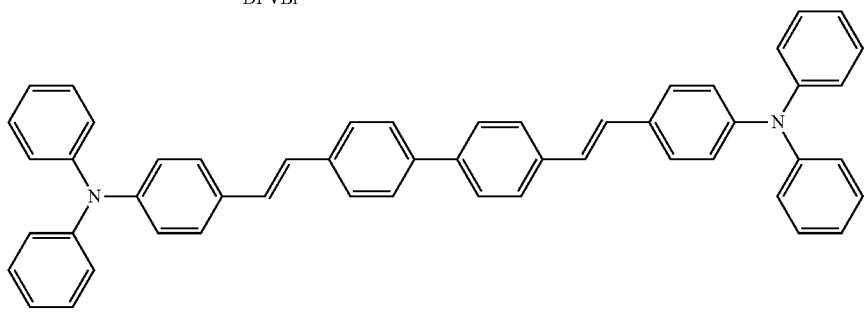

DPAVBi

Electron Transport Region in Intermediate Layer 150

The electron transport region may have i) a single layer structure consisting of a single layer consisting of a single material, ii) a single layer structure consisting of a single layer including a plurality of different materials, or iii) a multi-layered structure including a plurality of layers including a plurality of different materials.

The electron transport region may include a buffer layer, a hole blocking layer, an electron control layer, an electron transport layer (ETL), an electron injection layer, or any combination thereof, but the exemplary embodiments are not limited thereto.

In one or more exemplary embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from the emission layer. However, exemplary embodiments of the structure of the electron transport region are not limited thereto.

The electron transport region (for example, the buffer layer, the hole blocking layer, the electron control layer, or the electron transport layer in the electron transport region) may include a metal-free compound, capable of easily accepting electrons, including at least one π-electron-depleted nitrogen-containing cyclic group.

The "π-electron-depleted nitrogen-containing cyclic group" may be a $C_1$-$C_{60}$ heterocyclic group having at least one *—N=*' moiety as a ring-forming moiety.

In one or more exemplary embodiments, the "π-electron-depleted nitrogen-containing cyclic group" may be i) a first ring, ii) a condensed cyclic group in which two or more first rings are condensed with each other, or iii) a condensed cyclic group in which one or more first rings and one or more second rings are condensed with each other, wherein the first ring may be a heteromonocyclic group (for example, an imidazole group, a pyridine group, or a triazine group) including at least one *—N=*' moiety as a ring-forming moiety, and the second ring may be a cyclic group (for example, a benzene group, a dibenzofuran group, or a carbazole group) excluding a *—N=*' moiety as a ring-forming moiety.

Examples of the π-electron-depleted nitrogen-containing cyclic group include a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, and an imidazopyridazine group, but the exemplary embodiments are not limited thereto.

In one or more exemplary embodiments, the electron transport region may include a compound represented by Formula 601 below and including at least one π-electron-depleted nitrogen-containing cyclic group.

$$[Ar_{601}]_{xe11}-[(L_{601})_{xe1}-R_{601}]_{xe21} \quad \text{<Formula 601>}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xe1 may be 0, 1, 2, 3, 4, or 5, $R_{601}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ are the same as described in connection with $Q_1$, and xe21 may be 1, 2, 3, 4, or 5.

In one or more exemplary embodiments, at least one of $Ar_{601}$, $L_{601}$, and $R_{601}$ of Formula 601 may each independently include at least one π-electron-depleted nitrogen-containing ring.

In one or more exemplary embodiments, when xe11 in Formula 601 is 2 or more, two or more $Ar_{601}$(s) may be linked to each other via a single bond.

In one or more exemplary embodiments, $Ar_{601}$ in Formula 601 may be a substituted or unsubstituted anthracene group.

In one or more exemplary embodiments, the electron transport region may include a compound represented by Formula 601-1 below:

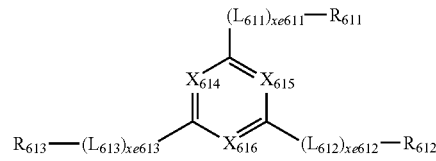

<Formula 601-1>

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ are the same as described in connection with $L_{601}$, xe611 to xe613 are the same as described in connection with xe1, $R_{611}$ to $R_{613}$ are the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a biphenyl group, a terphenyl group, or a naphthyl group.

In one or more exemplary embodiments, xe1 and xe611 to xe613 in Formulae 601 and 601-1 may each independently be 0, 1, or 2.

The electron transport region may include one of Compounds ET1 to ET36, 2,9-Dimethyl-4,7-diphenyl-1,10-phenanthroline (BCP), 4,7-Diphenyl-1,10-phenanthroline (Bphen), tris-(8-hydroxyquinoline)aluminum ($Alq_3$), bis(2-methyl-8-quinolinolato-N1,O8)-(1,1'-biphenyl-4-olato)aluminum (BAlq), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), or any combination thereof, but the exemplary embodiments are not limited thereto:

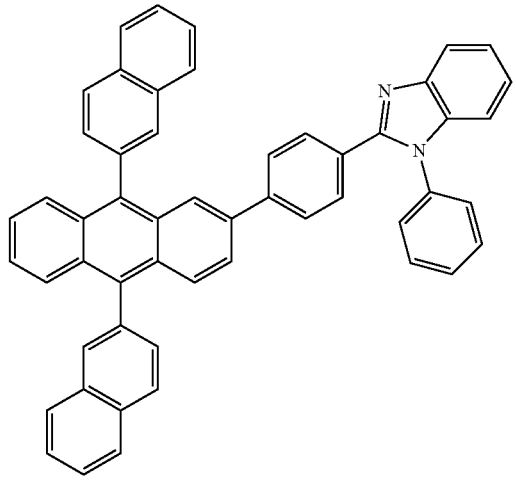

ET1

111                  112
ET2
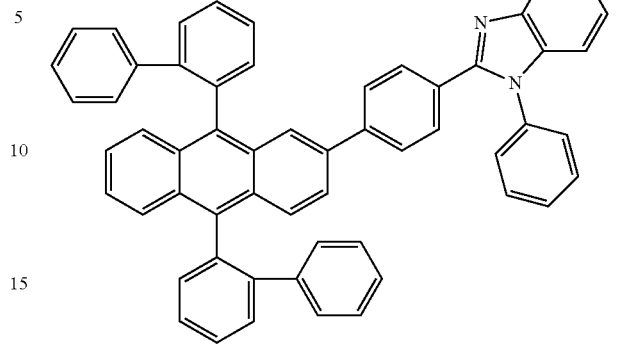
ET3
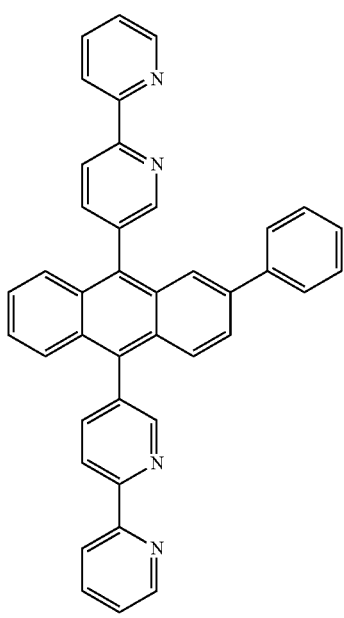
ET5
ET6
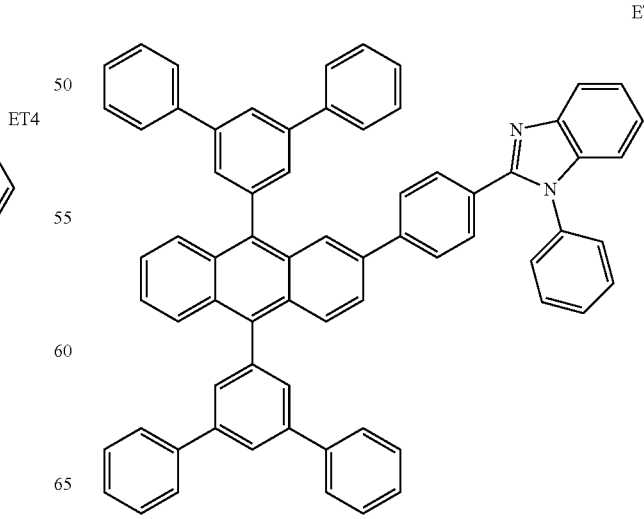
ET4
ET7

ET8
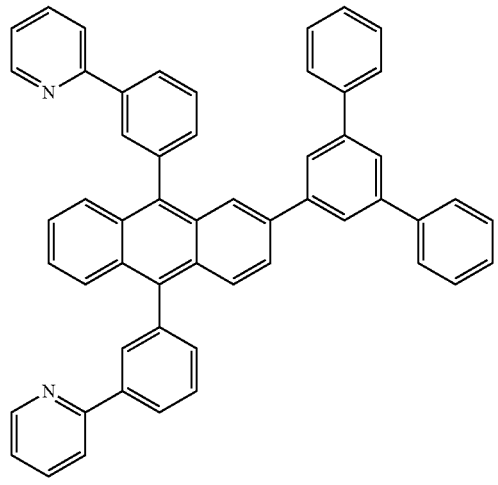
ET9
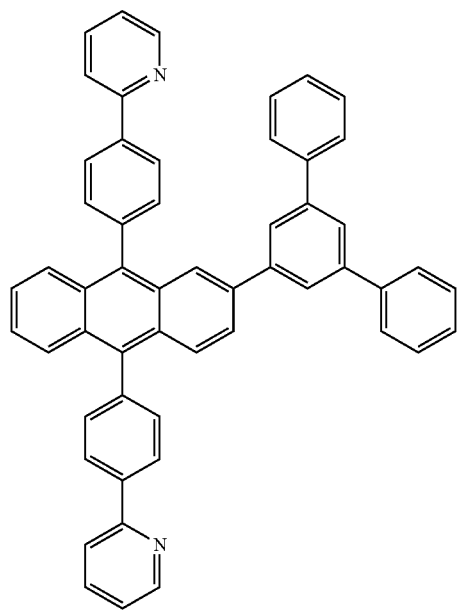
ET10
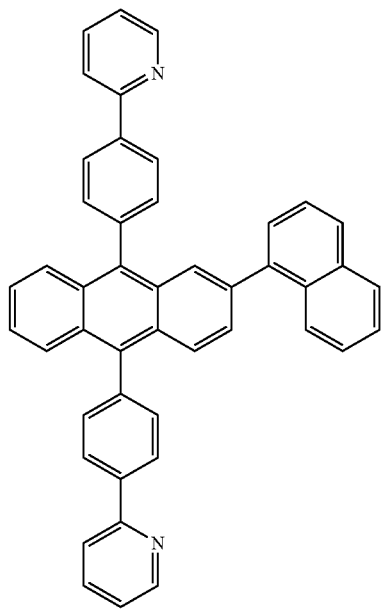
ET11
ET12
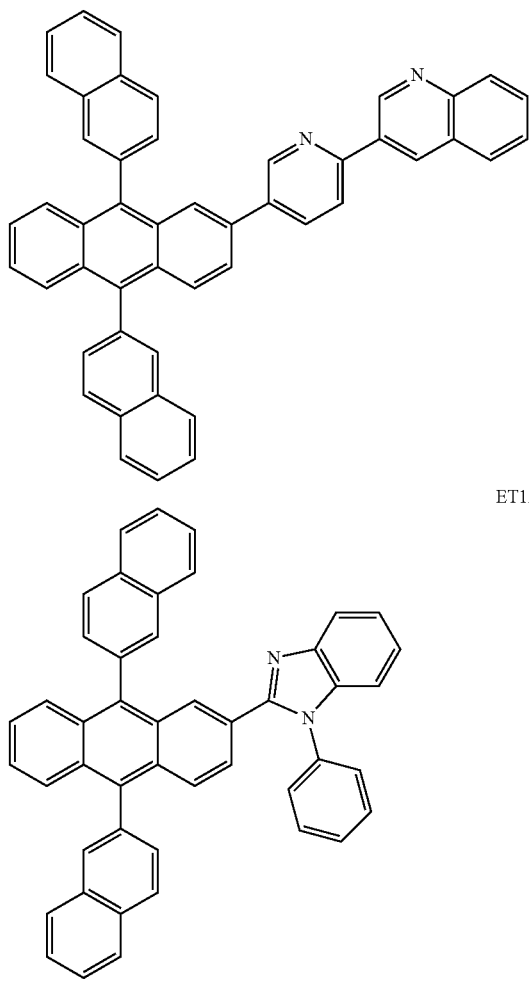

ET13
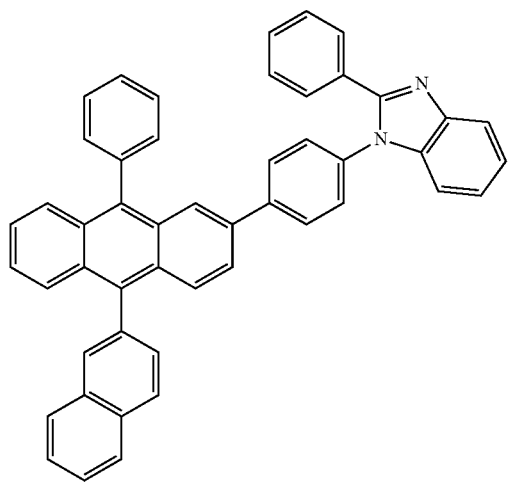
ET14
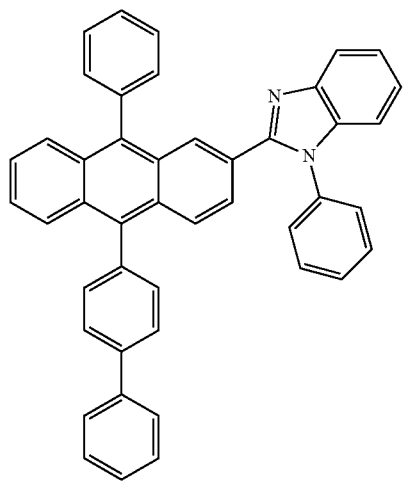
ET15
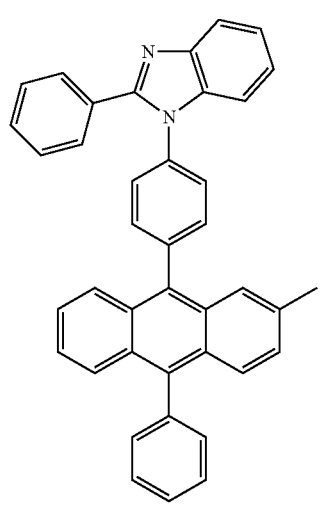
ET16
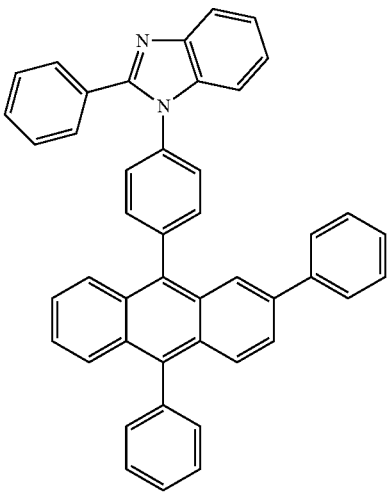
ET17
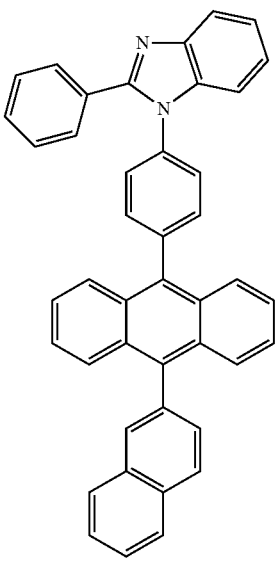
ET18
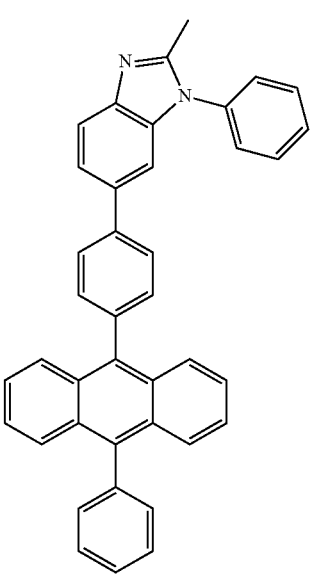

117
-continued
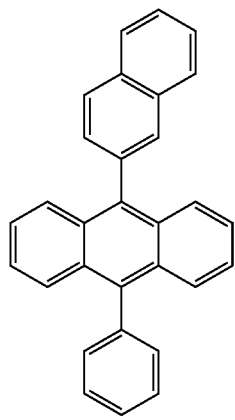
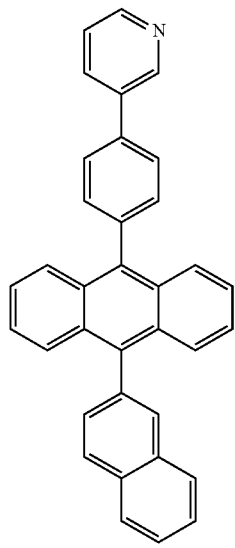
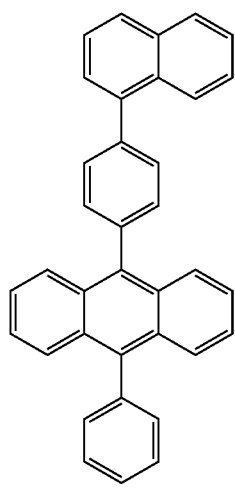
118
-continued
ET19
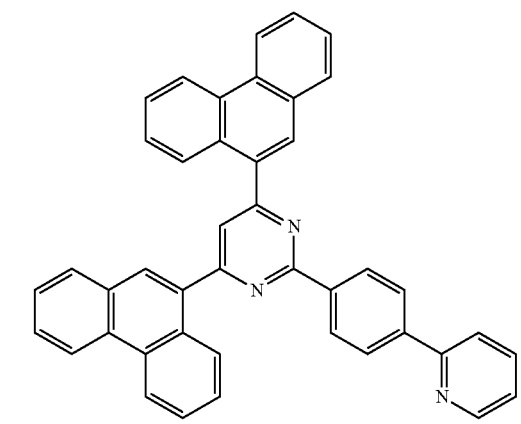
ET20
ET21
ET22
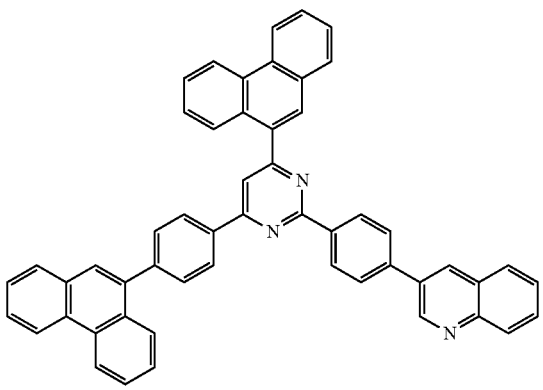
ET23
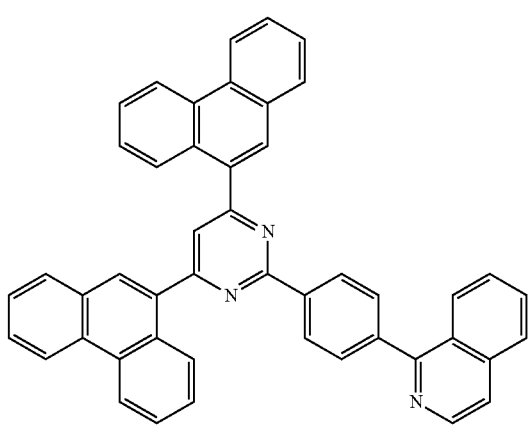
ET24

ET25
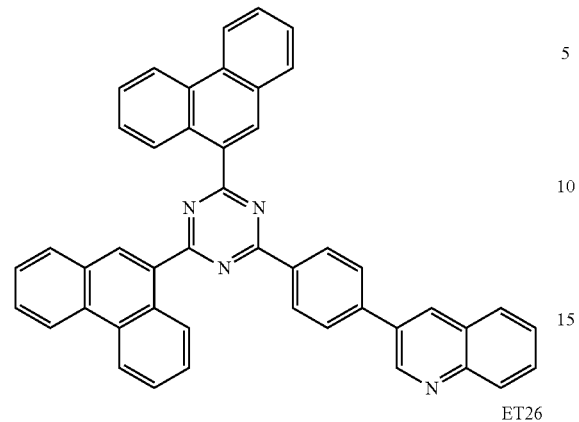
ET26
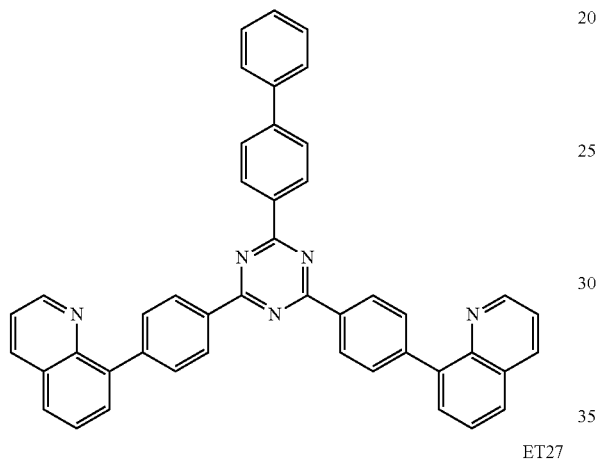
ET27
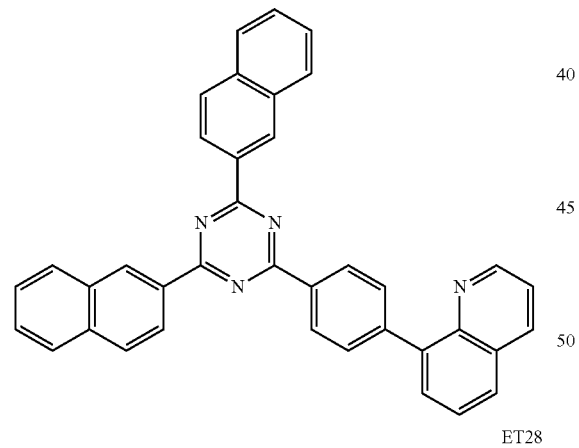
ET28
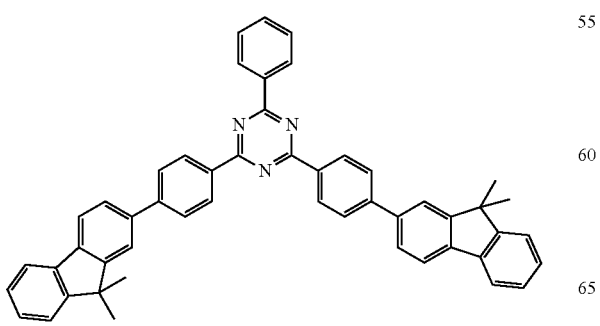
ET29
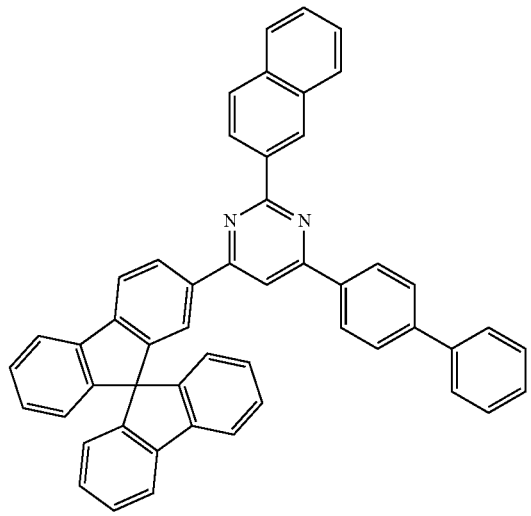
ET30
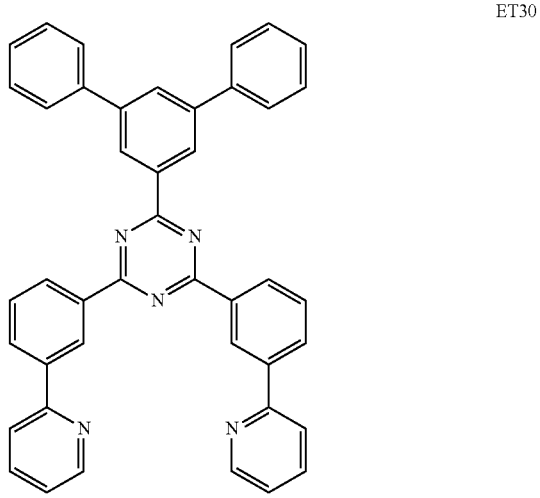
ET31
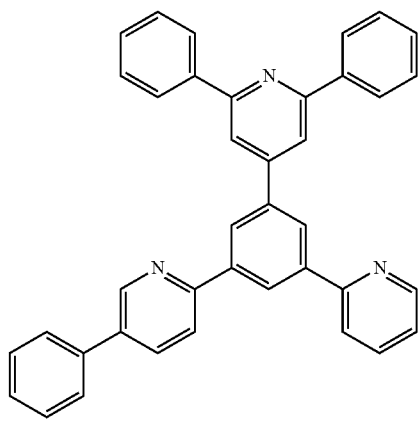

ET32
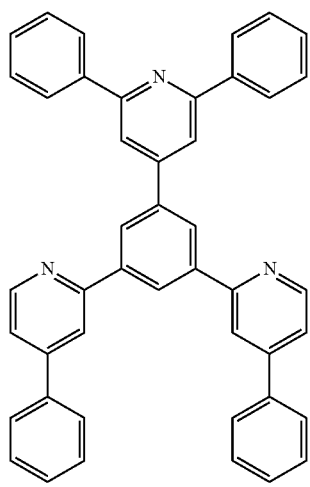
ET35
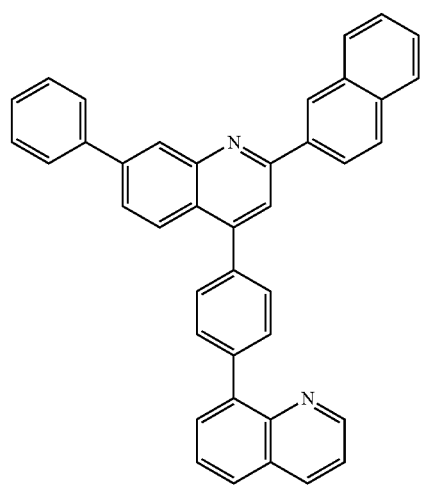
ET33
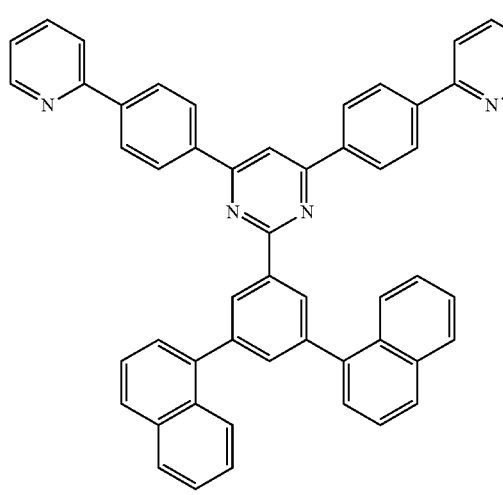
ET36
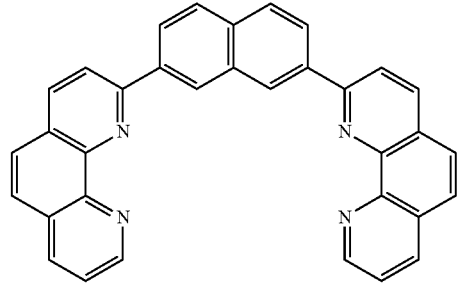
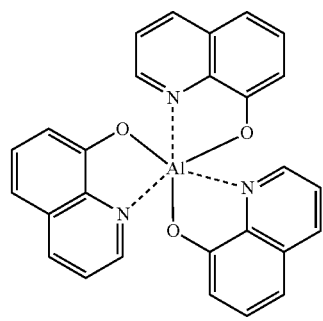
Alq₃
ET34
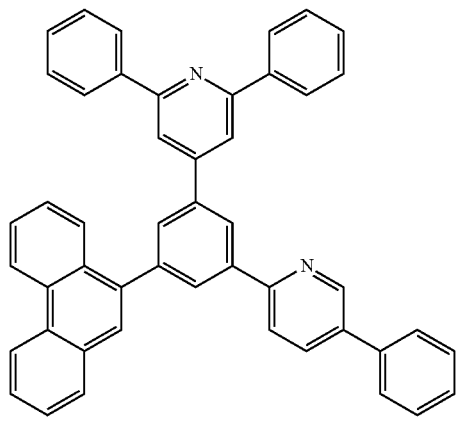
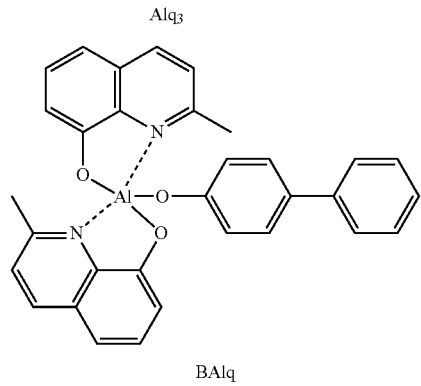
BAlq

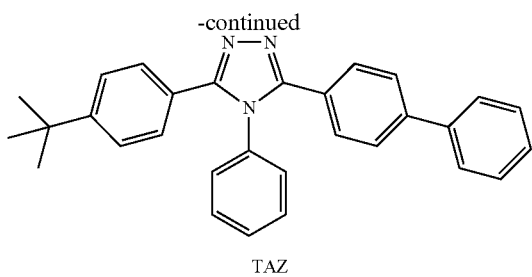

TAZ

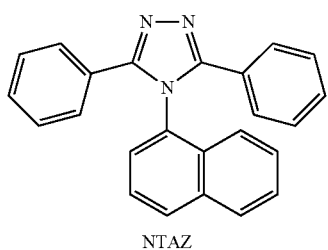

NTAZ

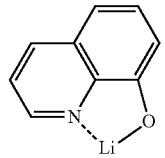

ET-D1

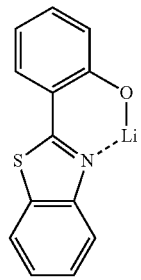

ET-D2

Thicknesses of the buffer layer, the hole blocking layer, and the electron control layer may each be in a range of about 20 Å to about 1,000 Å, for example, about 30 Å to about 300 Å. When the thicknesses of the buffer layer, the hole blocking layer, and the electron control layer are within these ranges, the electron blocking layer may have excellent electron blocking characteristics or electron control characteristics without a substantial increase in driving voltage.

The thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

The electron transport region (for example, the electron transport layer in the electron transport region) may further include, in addition to the materials described above, a metal-containing material.

The metal-containing material may include alkali metal complex, alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof, but the exemplary embodiments are not limited thereto.

In one or more exemplary embodiments, the metal-containing material may include a Li complex. The Li complex may include, for example, Compound ET-D1 (lithium quinolate, LiQ) or ET-D2.

The electron transport region may include the electron injection layer that facilitates the flow of electrons from the second electrode 190. The electron injection layer may directly contact the second electrode 190.

The electron injection layer may have i) a single layer structure consisting of a single layer consisting of a single material, ii) a single layer structure consisting of a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth-metal-containing compound, a rare earth metal-containing compound, an alkali metal complex, an alkaline earth-metal complex, a rare earth metal complex, or any combinations thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, or iodides), or any combination thereof, of the alkali metal, the alkaline earth metal, and the rare earth metal, respectively.

The alkali metal-containing compound may include alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth metal-containing compound may include an alkaline earth metal compound such as BaO, SrO, CaO, $Ba_xSr_{1-x}O$ (0<x<1), or $Ba_xCa_{1-x}O$ (0<x<1). The rare earth metal-containing compound may include $YbF_3$, $ScF_3$, $ScO_3$, $Y_2O_3$, $Ce_2O_3$, $GdF_3$, $TbF_3$, $YbI_3$, $ScI_3$, $TbI_3$, or any combination thereof.

The alkali metal complex, the alkaline earth metal complex, and the rare earth metal complex may include i) one of the alkali metal, the alkaline earth metal, and rare earth metal ions, and ii) a ligand combined with the metal ion, for example, a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof, but the exemplary embodiments are not limited thereto.

The electron injection layer may consist of an alkali metal, an alkaline earth metal, a rare earth metal, an alkali metal-containing compound, an alkaline earth-metal-containing compound, a rare earth metal-containing compound, an alkali metal complex, an alkaline earth-metal complex, a rare earth metal complex, or any combinations thereof, as described above. In one or more exemplary embodiments, the electron injection layer may further include an organic material (for example, a compound represented by Formula 601). When the electron injection layer further includes an organic material, an alkali metal, an alkaline earth metal, a rare earth metal, an alkali metal-containing compound, an alkaline earth-metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

The thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

Second Electrode 190

The second electrode 190 may be disposed on the intermediate layer 150 having such a structure. The second electrode 190 may be a cathode which is an electron injection electrode, and in this regard, a material for forming the second electrode 190 may be selected from a metal, an alloy, an electrically conductive compound, or a combination thereof, which have a relatively low work function.

The second electrode 190 may include lithium (Li), silver (Ag), magnesium (Mg), aluminum (Al), aluminum-lithium (Al—Li), calcium (Ca), magnesium-indium (Mg—In), magnesium-silver (Mg—Ag), ITO, IZO, or any combination thereof, but the exemplary embodiments are not limited thereto. The second electrode 190 may be a transmissive electrode, a semi-transmissive electrode, or a reflective electrode.

The second electrode 190 may have a single-layered structure, or a multi-layered structure including two or more layers.

Capping Layer

A first capping layer may be disposed outside the first electrode 110, and/or a second capping layer may be disposed outside the second electrode 190. In detail, the light-emitting device 10 may have a structure in which the first capping layer, the first electrode 110, the intermediate layer 150, and the second electrode 190 are sequentially stacked, a structure in which the first electrode 110, the intermediate layer 150, the second electrode 190, and the second capping layer are sequentially stacked, or a structure in which the first capping layer, the first electrode 110, the intermediate layer 150, the second electrode 190, and the second capping layer are sequentially stacked.

In the intermediate layer 150 of the light-emitting device 10, light generated in the emission layer may pass through the first electrode 110 and the first capping layer toward the outside, wherein the first electrode 110 may be a semi-transmissive electrode or a transmissive electrode. In the intermediate layer 150 of the light-emitting device 10, light generated in the emission layer may pass through the second electrode 190 and the second capping layer toward the outside, wherein the second electrode 190 may be a semi-transmissive electrode or a transmissive electrode.

The first capping layer and the second capping layer may increase external luminescence efficiency according to the principle of constructive interference.

The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may be optionally substituted with a substituent containing O, N, S, Se, Si, F, Cl, Br, I, or any combination thereof.

In one or more exemplary embodiments, at least one of the first capping layer and the second capping layer may each independently include the amine group-containing compound.

In one or more exemplary embodiments, at least one of the first capping layer and the second capping layer may each independently include a compound selected from Compounds HT28 to HT33, a compound selected from Compounds CP1 to CP5, or any compound thereof, but the exemplary embodiments are not limited thereto:

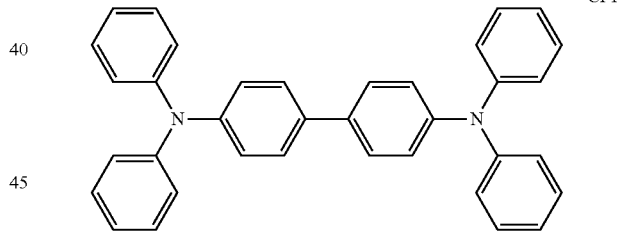

CP1

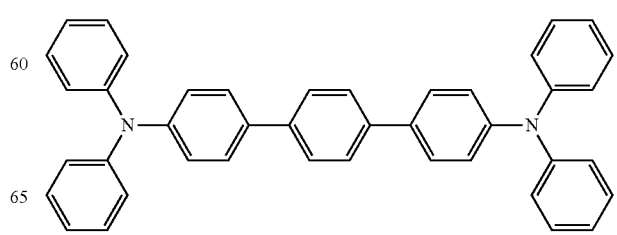

CP2

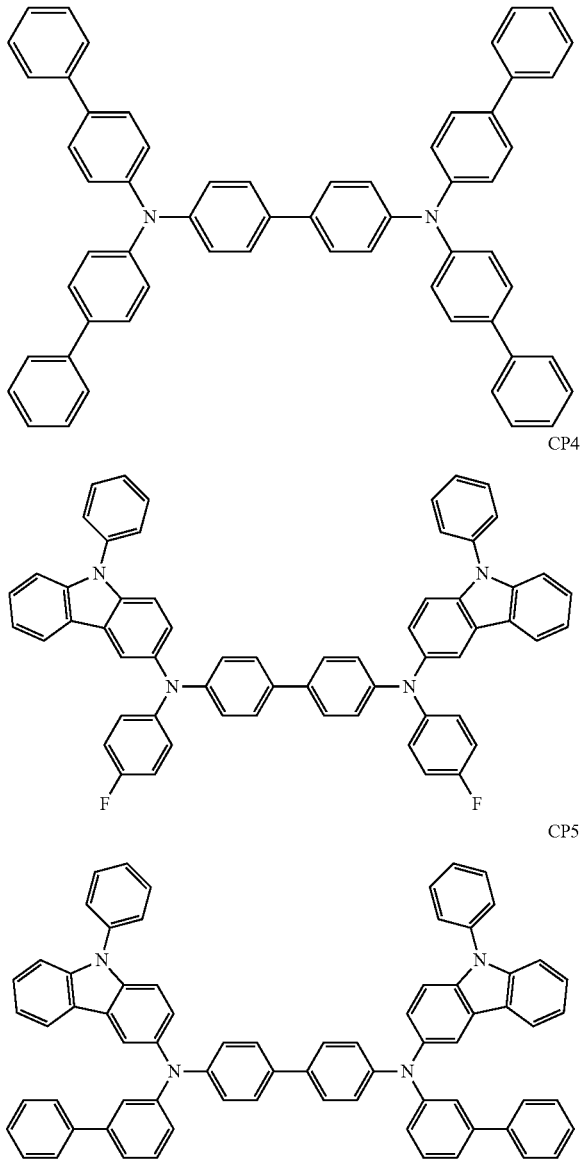

Apparatus

The light-emitting device 10 may be included in at least one apparatus. For example, a light-emitting apparatus, an authentication apparatus, or an electronic apparatus may include the light-emitting device.

The light-emitting apparatus may further include a color filter, in addition to the light-emitting device. The color filter may be located on at least one traveling direction of light emitted from the light-emitting device. In one or more exemplary embodiments, light emitted from the light-emitting device may be a blue light, but the exemplary embodiments are not limited thereto. The light-emitting device may be understood by referring to the description thereof provided herein.

The light-emitting apparatus may include a first substrate. The first substrate may include a plurality of subpixel areas, and the color filter may include a plurality of color filter areas respectively corresponding to the plurality of the subpixel areas.

A pixel-defining film may be disposed between the plurality of the subpixel areas to define each of the subpixel areas.

The color filter may further include light blocking patterns disposed between the plurality of the color filter areas.

The plurality of color filter areas may include a first color filter area emitting first color light, a second color filter area emitting second color light, and/or a third color filter area emitting third color light, and the first color light, the second color light, and/or the third color light may have different maximum emission wavelengths from one another. For example, the first color light may be a red light, the second color light may be a green light, and the third color light may be a blue light, but the exemplary embodiments are not limited thereto. In one or more exemplary embodiments, each of the plurality of color filter areas may include a quantum dot, but the exemplary embodiments are not limited thereto. In detail, the first color filter area may include a red quantum dot, the second color filter area may include a green quantum dot, and the third color filter area may not include a quantum dot. A quantum dot may be understood by referring to the description thereof provided herein. Each of the first color filter area, the second color filter area, and/or the third color filter area may further include a scatterer, but the exemplary embodiments are not limited thereto.

In one or more exemplary embodiments, the light-emitting device may emit first light, the first color filter area may absorb the first light to emit first first-color light, the second color filter area may absorb the first light to emit second first-color light, and the third color filter area may absorb the first light to emit third first-color light. In this case, the first first-color light, the second first-color light, and the third first-color light may have different maximum emission wavelengths from one another. In detail, the first light may be blue light, the first first-color light may be red light, the second first-color light may be green light, and the third first-color light may be blue light, but the exemplary embodiments are not limited thereto.

The light-emitting apparatus may further include a thin-film transistor, in addition to the light-emitting device 10 as described above. The thin-film transistor may include a source electrode, an activation layer, and a drain electrode, and one of the source electrode and the drain electrode may be electrically connected to the one of the first electrode 110 and the second electrode 190 of the light-emitting device 10.

The thin-film transistor may further include a gate electrode, a gate insulation film, or the like.

The activation layer may include a crystalline silicon, an amorphous silicon, an organic semiconductor, an oxide semiconductor, or the like, but the exemplary embodiments are not limited thereto.

The light-emitting apparatus may further include a sealing part for sealing the light-emitting device 10. The sealing part may be disposed between the color filter and the light-emitting device 10. The sealing part may allow light from the light-emitting device 10 to be output toward the outside and may block outside air and moisture from penetrating into the light-emitting device 10. The sealing part may be a sealing substrate including a transparent glass substrate or a plastic substrate. The sealing part may be a thin film encapsulation layer including a plurality of organic layers and/or a plurality of inorganic layers. When the sealing part is a thin-film encapsulation layer, the light-emitting apparatus may be flexible.

The light-emitting apparatus may be used as various displays, light sources, and the like.

The authentication apparatus may be, for example, a biometric authentication apparatus for authenticating an individual by using biometric information of a biometric body (for example, a finger tip, a pupil, or the like).

The authentication apparatus may further include, in addition to the light-emitting device as described above, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various measuring instruments, meters (for example, meters for a vehicle, an aircraft, and a vessel), projectors, and the like, but the exemplary embodiments are not limited thereto.

Preparation Method

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account the material formed into the formed layer and its structure.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed, and the structure of a layer to be formed.

General Definition of Substituents

The term "$C_1$-$C_{60}$ alkyl group" as used herein refers to a linear or branched aliphatic saturated hydrocarbon monovalent group having 1 to 60 carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of a $C_2$-$C_{60}$ alkyl group, and examples thereof include an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" refers to a monovalent hydrogen group having at least one carbon-carbon triple bond in the middle or at the terminus of a $C_2$-$C_{60}$ alkyl group, and examples thereof include a ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by-$OA_{101}$ (wherein, $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group, a bicyclo[1.1.1] pentyl group, a bicyclo[2.1.1]hexyl group, a bicyclo[2.2.1] heptyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group having a heteroatom (for example, N, O, Si, P, S, or any combination thereof) as a ring-forming atom and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_3$-$C_{10}$ cycloalkenyl group" as used herein refers to a monovalent cyclic group that has 3 to 10 carbon atoms, at least one carbon-carbon double bond in the ring thereof, and no aromaticity, and examples thereof include a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group that has a heteroatom (for example, N, O, Si, P, S, or any combination thereof) as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a heterocyclic aromatic system that has a heteroatom (for example, N, O, Si, P, S, or any combination thereof) as a ring-forming atom, in addition to 1 to 60 carbon atoms. The term "$C_1$-$C_{60}$ heteroarylene group" as used herein refers to a divalent group having a heterocyclic aromatic system that has a heteroatom (for example, N, O, Si, P, S, or any combination thereof) as a ring-forming atom, in addition to 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be fused with each other.

The term "$C_6$-$C_{60}$ aryloxy group" as used herein refers to -$OA_{102}$ (wherein $A_{102}$ is the $C_6$-$C_{60}$ aryl group), and a $C_6$-$C_{60}$ arylthio group used herein indicates -$SA_{103}$ (wherein $A_{103}$ is the $C_6$-$C_{60}$ aryl group).

The term "monovalent non-aromatic fused polycyclic group" as used herein refers to a monovalent group (for example, having 8 to 60 carbon atoms) having two or more rings fused with each other, only carbon atoms as ring-forming atoms, and non-aromaticity in its entire molecular structure. Examples of the monovalent non-aromatic fused polycyclic group include an indenyl group, a fluorenyl group, a spiro-bifluorenyl group, a benzofluorenyl group, an indenophenanthrenyl group, and an indenoanthracenyl group. The term "divalent non-aromatic fused polycyclic group" as used herein refers to a divalent group having a structure corresponding to the monovalent non-aromatic fused polycyclic group.

A monovalent non-aromatic fused heteropolycyclic group as used herein refers to a monovalent group (for example, having 1 to 60 carbon atoms) having two or more rings fused with each other, a heteroatom (for example, N, O, Si, P, S, or any combination thereof), in addition to carbon atoms, as a ring-forming atom, and non-aromaticity in its entire molecular structure. Examples of the monovalent non-aromatic fused heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "divalent non-aromatic fused heteropolycyclic group" as used herein refers to a divalent group having a structure corresponding to the monovalent non-aromatic fused heteropolycyclic group.

The term "$C_5$-$C_{60}$ carbocyclic group" as used herein refers to a monocyclic or polycyclic group having 5 to 60 carbon atoms and only carbon as ring-forming atoms. The term "$C_5$-$C_{60}$ carbocyclic group" may be an aromatic carbocyclic group or a non-aromatic carbocyclic group. The term "$C_5$-$C_{60}$ carbocyclic group" may be a compound such as benzene, a monovalent group such as a phenyl group, or a divalent group such as a phenylene group. Alternatively, depending on the number of substituents connected to the $C_5$-$C_{60}$ carbocyclic group, the $C_5$-$C_{60}$ carbocyclic group may be a trivalent group or a quadrivalent group.

Examples of $C_5$-$C_{60}$ carbocyclic group include a cyclopentadiene group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indeno phenanthrene group, and an indenoanthracene group.

The term "$C_1$-$C_{60}$ heterocyclic group" refers to a monocyclic or polycyclic group having a heteroatom (for example, N, O, Si, P, S, or any combination thereof), in addition to carbon atoms (wherein, the carbon atoms may number 1 to 60), as a ring-forming atom, and 1 to 60 carbon atoms. The $C_1$-$C_{60}$ heterocyclic group may be an aromatic heterocyclic group or a non-aromatic heterocyclic group. The $C_1$-$C_{60}$ heterocyclic group may be a compound such as pyridine, a monovalent group such as a pyridinyl group, or a divalent group such as a pyridinylene group. Alternatively, depending on the number of substituents connected to the $C_1$-$C_{60}$ heterocyclic group, the $C_1$-$C_{60}$ heterocyclic group may be a trivalent group or a quadrivalent group.

The terms "hydrogen," "deuterium," "fluorine," "chlorine," "bromine," and "iodine" refer to their respective atoms and corresponding radicals.

Examples of $C_1$-$C_{60}$ heterocyclic group include a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, a pyrrole group, a thiophene group, a furan group, an indole group, a benzoindole group, a naphthoindole group, an isoindole group, a benzo isoindole group, a naphthoisoindole group, a benzosilole group, a benzothiophene group, a benzofuran group, a carbazole group, a dibenzosilole group, a dibenzothiophene group, a dibenzofuran group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, an imidazopyridazine group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, and a benzothienodibenzothiophene group.

The substituted $C_5$-$C_{60}$ carbocyclic group, the substituted $C_1$-$C_{60}$ heterocyclic group, the substituted $C_1$-$C_{60}$ alkylene group, the substituted $C_2$-$C_{60}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic fused polycyclic group, the substituted divalent non-aromatic fused heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic fused polycyclic group, and the substituted monovalent non-aromatic fused heteropolycyclic group, as used herein, may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, or a monovalent non-aromatic fused heteropolycyclic group, each substituted with at least one of deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$);

—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$); or any combination thereof.

$Q_1$ to $Q_3$, $Q_{11}$ to $Q_{13}$, $Q_{21}$ to $Q_{23}$, and $Q_{31}$ to $Q_{33}$, as used herein, may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, a monovalent non-aromatic fused heteropolycyclic group, a biphenyl group, or a terphenyl group.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group". In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a phenyl group having, as a substituent, a $C_6$-$C_{60}$ aryl group substituted with a $C_6$-$C_{60}$ aryl group.

\* and \*', as used herein, unless defined otherwise, each refer to a binding site to a neighboring atom in a corresponding formula.

Hereinafter, a compound according to exemplary embodiments and a light-emitting device according to exemplary embodiments will be described in detail with reference to Synthesis Examples and Examples. The wording "B was used instead of A" used in describing Synthesis Examples refers to that an identical molar equivalent of B was used in place of A.

EXAMPLES

Synthesis Example: Synthesis of Compound 7

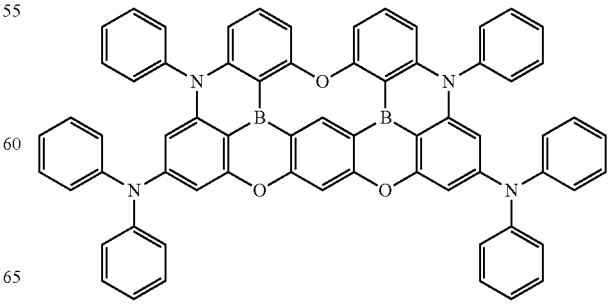

-continued
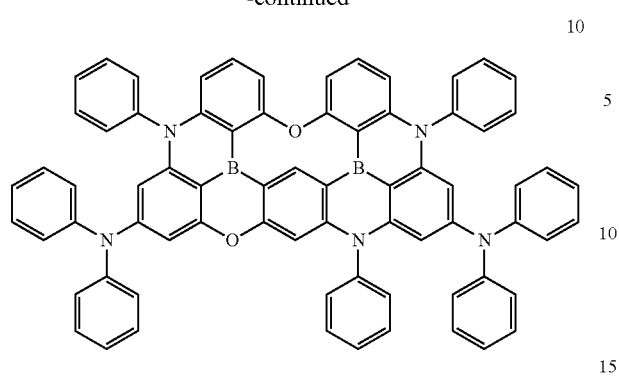
10
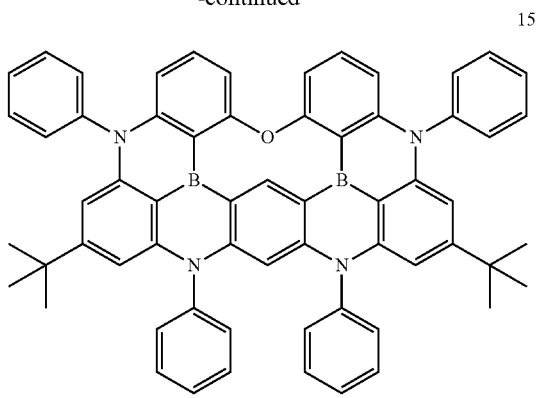
15
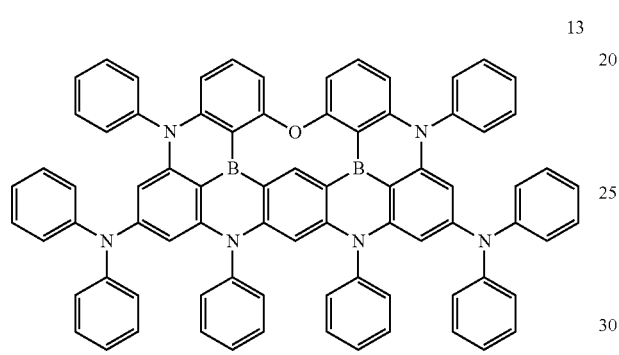
13
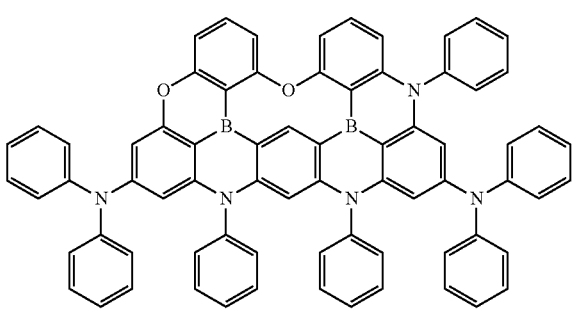
16
Synthesis Example 1
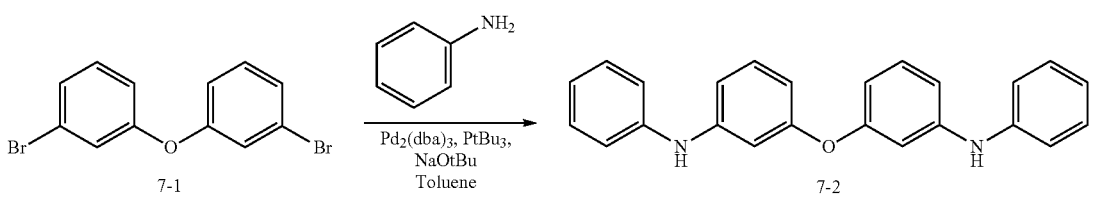
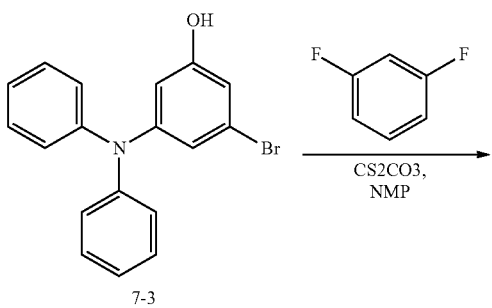

-continued
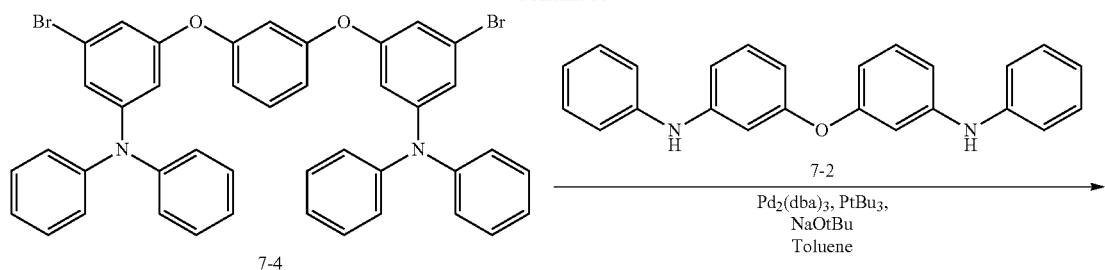
7-4
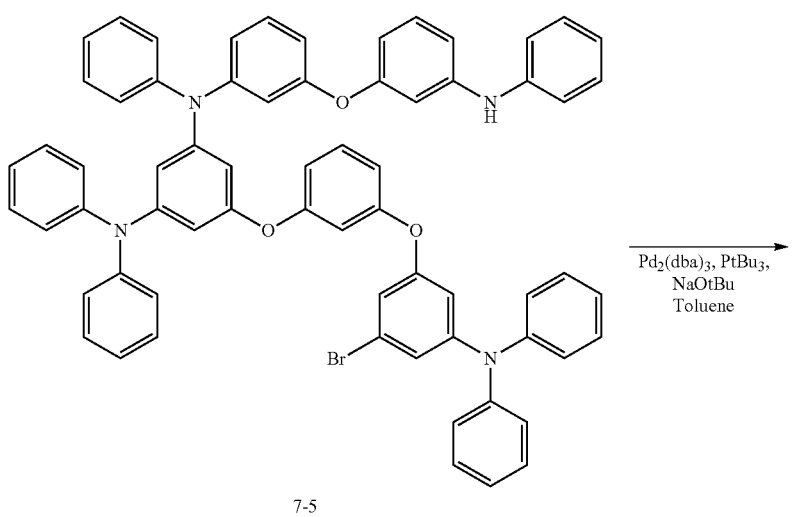
7-5
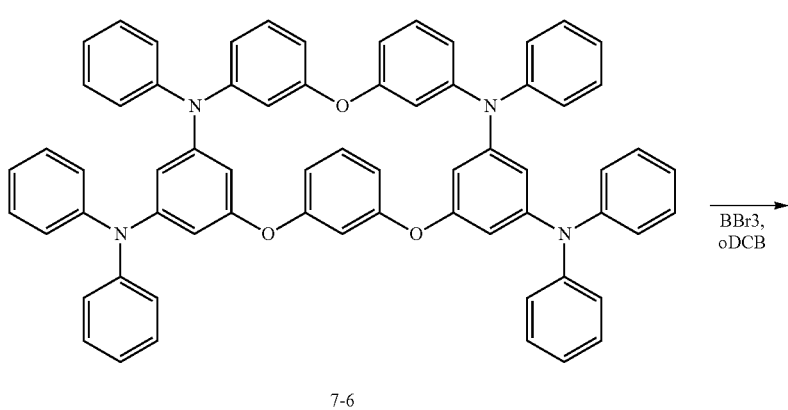
7-6
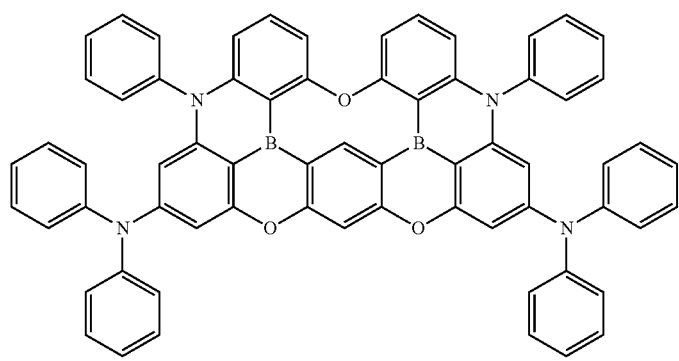
7

Synthesis of Intermediate 7-2

Intermediate 7-1 (1 eq), aniline (3eq), tris(dibenzylideneacetone)dipalladium(0) (0.1eq), tri-tert-butylphosphine (0.2eq), and sodium tert-butoxide (4eq) were dissolved in toluene, and then, were stirred at a temperature of 110° C. for 12 hours in a nitrogen atmosphere. The mixture was cooled and cleaned three times by using ethyl acetate and water, and then the obtained organic layer was dried by using MgSO$_4$ under reduced pressure. Column chromatography and recrystallization (dichloromethane:n-hexane) were performed thereon to obtain Intermediate 7-2. (Yield: 53%)

Synthesis of Intermediate 7-4

Intermediate 7-3 (1eq), 1,3-difluorobenzene (3eq), and cesium carbonate (3eq) were dissolved in N-methyl-2-pyrrolidone (NMP), and then, were stirred at a temperature of 190° C. for 12 hours in a nitrogen atmosphere. The mixture was cooled and dried under reduced pressure, and then NMP was removed therefrom. Then, the remainder was cleaned three times by using ethyl acetate and water, and then the obtained organic layer was dried by using MgSO$_4$ under reduced pressure. Column chromatography was performed to obtain Intermediate 7-4. (Yield: 62%)

Synthesis of Intermediate 7-5

Intermediate 7-4 (1eq), Intermediate 7-2 (1eq), tris(dibenzylideneacetone)dipalladium(0) (0.1eq), tri-tert-butylphosphine (0.2eq), and sodium tert-butoxide (3eq) were dissolved in toluene, and then, were stirred at a temperature of 110° C. for 12 hours in a nitrogen atmosphere. The mixture was cooled, then cleaned three times by using ethyl acetate and water, and then the obtained organic layer was dried by using MgSO$_4$ under reduced pressure. Column chromatography and recrystallization (dichloromethane:n-hexane) were performed thereon to obtain Intermediate 7-5. (Yield: 77%)

Synthesis of Intermediate 7-6

Intermediate 7-5 (1 eq), tris(dibenzylideneacetone)dipalladium(0) (0.1eq), tri-tert-butylphosphine (0.2eq), and sodium tert-butoxide (3eq) were dissolved in toluene, and then, were stirred at a temperature of 110° C. for 24 hours in a nitrogen atmosphere. The mixture was cooled, then cleaned three times by using ethyl acetate and water, and then the obtained organic layer was dried by using MgSO$_4$ under reduced pressure. Column chromatography and recrystallization (dichloromethane:n-hexane) were performed thereon to obtain Intermediate 7-6. (Yield: 42%)

Synthesis of Compound 7

Intermediate 7-6 (1 eq) was dissolved in ortho dichlorobenzene, and then the flask was cooled to a temperature of 0° C. in a nitrogen atmosphere, and then, BBr$_3$ (4 eq) was slowly added thereto. After completion of the addition, the temperature was raised to 190° C. and the mixture was stirred for 24 hours. After cooling to 0° C., triethylamine was slowly added into the flask until heating was stopped to terminate the reaction, and then, hexane was added thereto and the solid was filtered out. The obtained solid was purified by silica filtration and then purified by methylene chloride (CH$_2$Cl$_2$)/n-hexane (MC/Hex) recrystallization to obtain Compound 7. Then, sublimation purification was used for final purification. (Yield after sublimation: 4%)

Synthesis Example 2

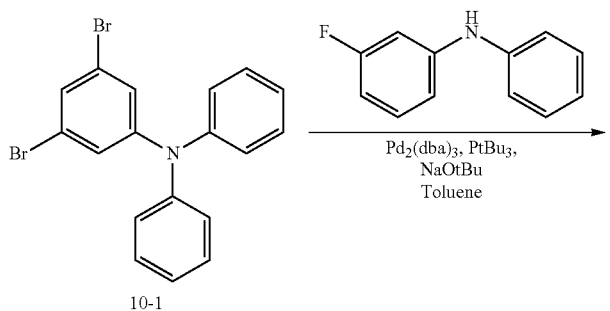

10-1

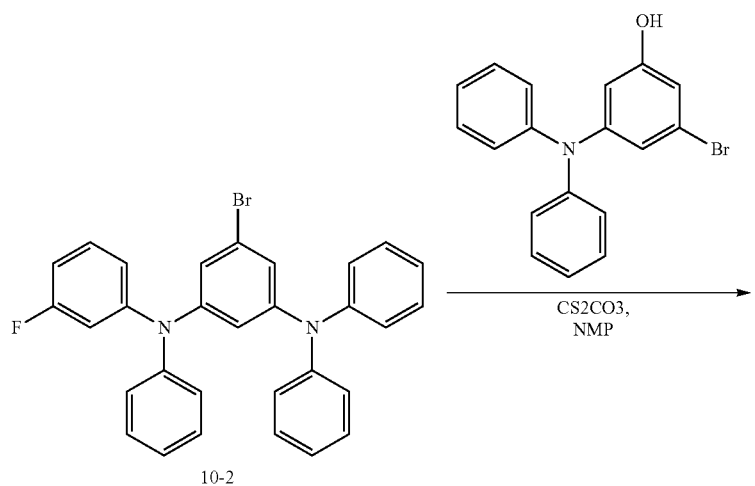

10-2

-continued
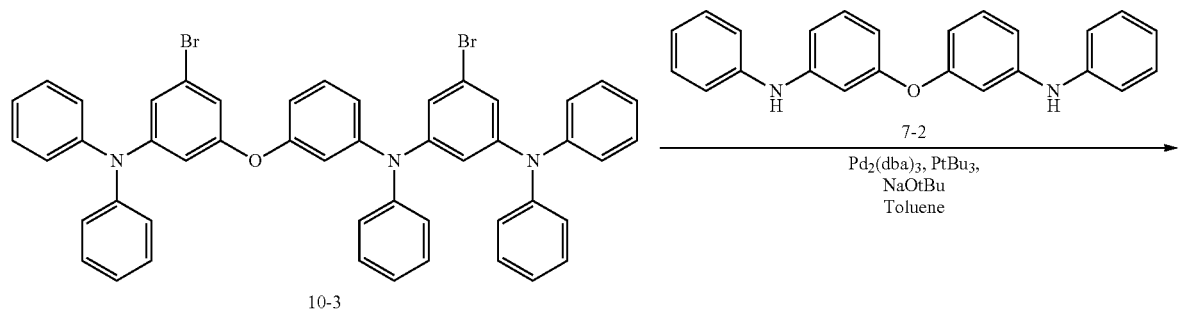
10-3
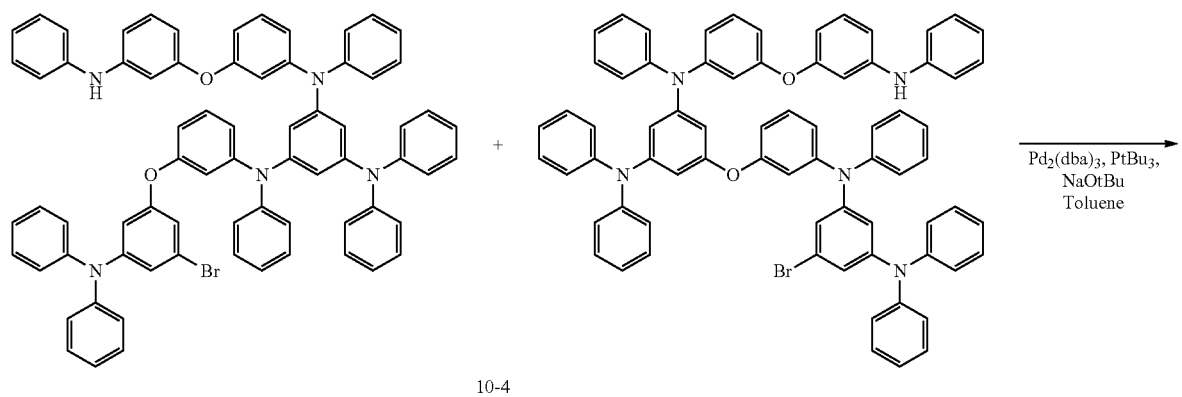
10-4
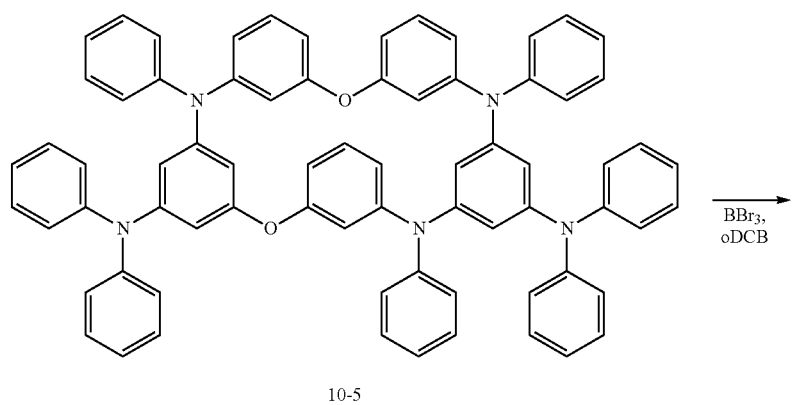
10-5
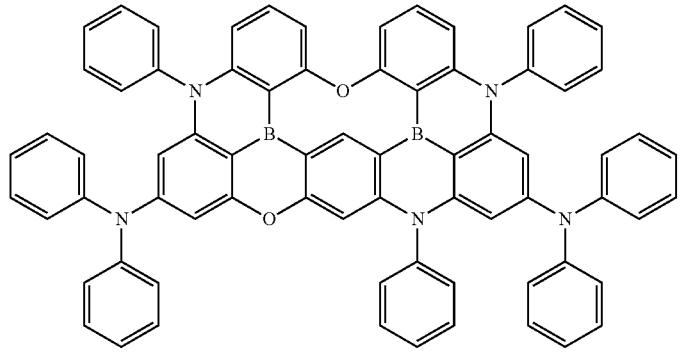
10

Synthesis of Intermediate 10-2

Intermediate 10-1 (1eq), 3-fluoro-N-phenylaniline (1 eq), tris(dibenzylideneacetone)dipalladium(0) (0.1eq), tri-tert-butylphosphine (0.2eq), and sodium tert-butoxide (3eq) were dissolved in toluene, and then, were stirred at a temperature of 90° C. for 8 hours in a nitrogen atmosphere. The mixture was cooled, then cleaned three times by using ethyl acetate and water, and then the obtained organic layer was dried by using $MgSO_4$ under reduced pressure. Column chromatography and recrystallization (dichloromethane:n-hexane) were performed thereon to obtain Intermediate 10-2. (Yield: 67%)

Synthesis of Intermediate 10-3

Intermediate 10-2 (1 eq), 3-bromo-5-(diphenylamino) phenol (1.2eq), and cesium carbonate (3eq) were dissolved in NMP, and then, were stirred at a temperature of 190° C. for 12 hours in a nitrogen atmosphere. The mixture was cooled and dried under reduced pressure, and then NMP was removed therefrom. Then, the remainder was cleaned three times by using ethyl acetate and water, and then the obtained organic layer was dried by using $MgSO_4$ under reduced pressure. Column chromatography was performed to obtain Intermediate 10-3. (Yield: 66%)

Synthesis of Intermediate 10-4

Intermediate 10-4 was obtained in the same manner as Intermediate 7-5. (Yield: 72%)

Synthesis of Intermediate 10-5

Intermediate 10-5 was obtained in the same manner as Intermediate 7-6. (Yield: 47%)

Synthesis of Compound 10

Compound 10 was obtained by using Intermediate 10-5 in the same manner as Compound 7. (Yield after sublimation: 3%)

Synthesis Example 3

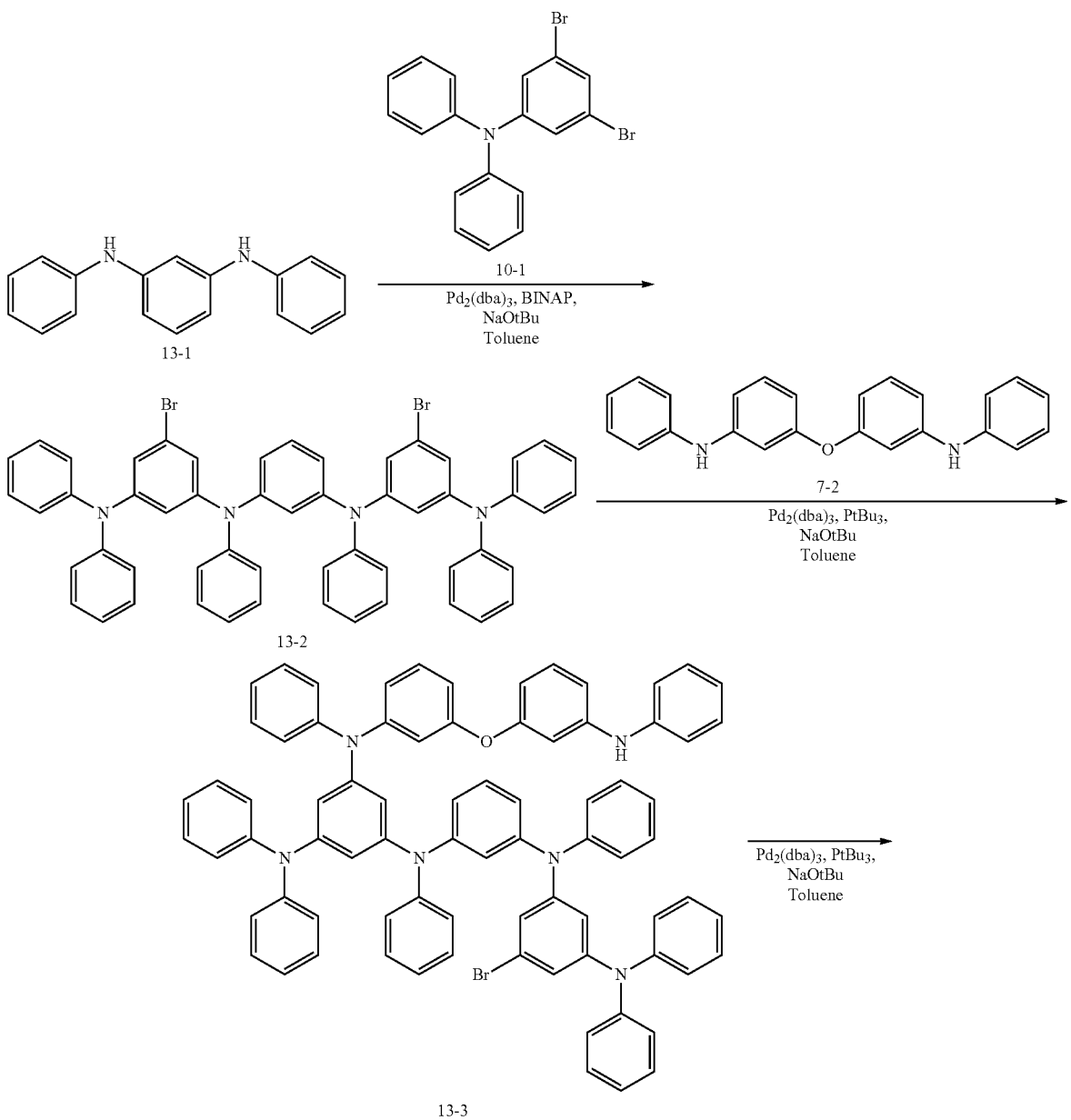

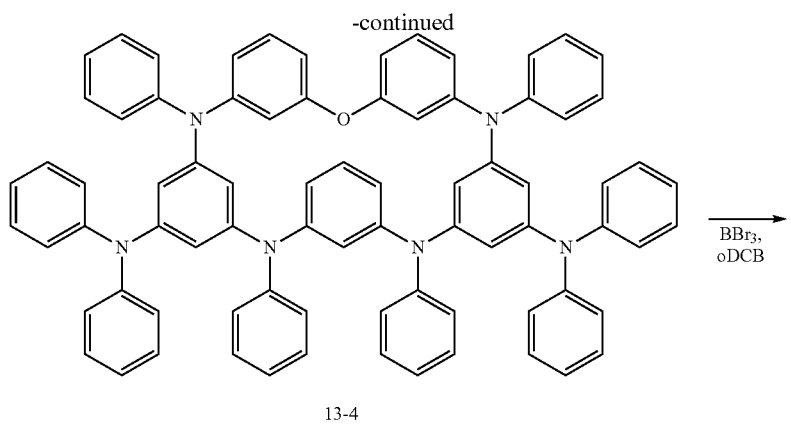

13-4

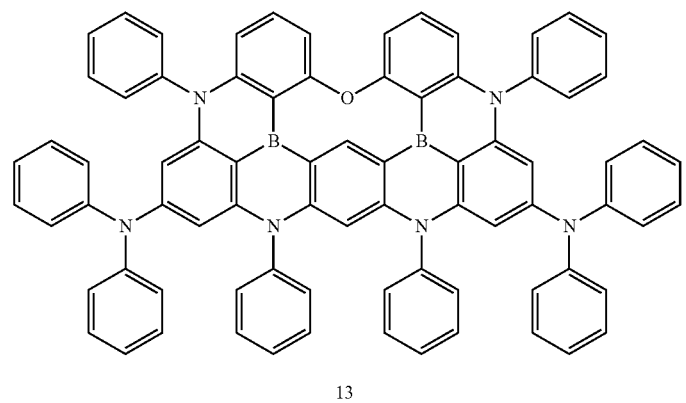

13

Synthesis of Intermediate 13-2

Intermediate 13-1 (1eq), Intermediate 10-1 (2.2eq), tris(dibenzylideneacetone)dipalladium(0) (0.1eq), BINAP (0.2eq), and sodium tert-butoxide (3eq) were dissolved in toluene, and then, were stirred at a temperature of 90° C. for 24 hours in a nitrogen atmosphere. The mixture was cooled and cleaned three times by using ethyl acetate and water, and then the obtained organic layer was dried by using $MgSO_4$ under reduced pressure. Column chromatography and recrystallization (dichloromethane:n-hexane) were performed thereon to obtain Intermediate 13-2. (Yield: 67%)

Synthesis of Intermediate 13-3

Intermediate 13-3 was obtained in the same manner as Intermediate 7-5. (Yield: 63%)

Synthesis of Intermediate 13-4

Intermediate 13-4 was obtained in the same manner as Intermediate 7-6. (Yield: 42%)

Synthesis of Compound 13

Compound 13 was obtained by using Intermediate 13-4 in the same manner as Compound 7. (Yield after sublimation: 8%)

Synthesis Example 4

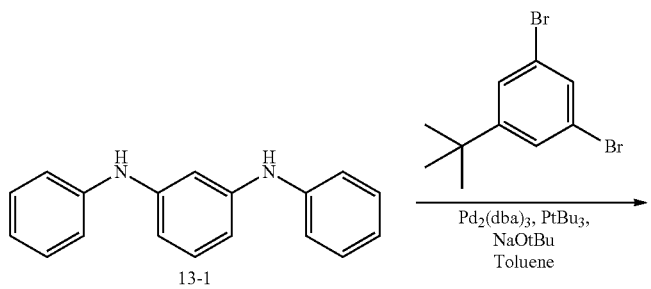

-continued
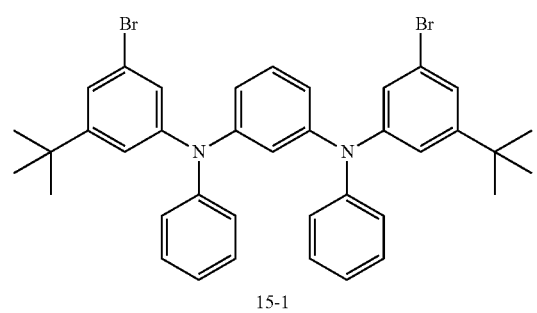
15-1
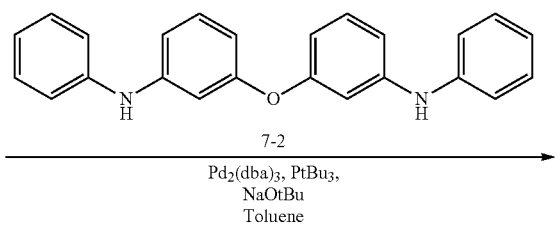
7-2
Pd₂(dba)₃, PtBu₃,
NaOtBu
Toluene
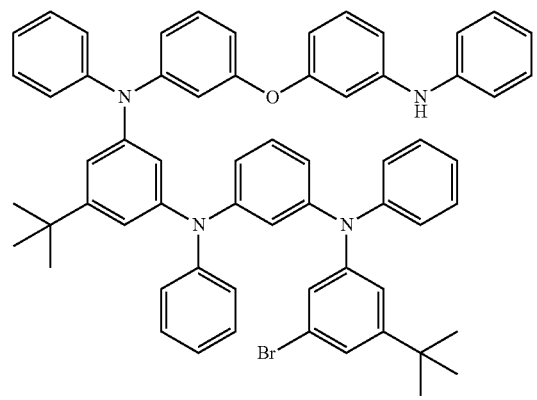
15-2
Pd₂(dba)₃, PtBu₃,
NaOtBu
Toluene
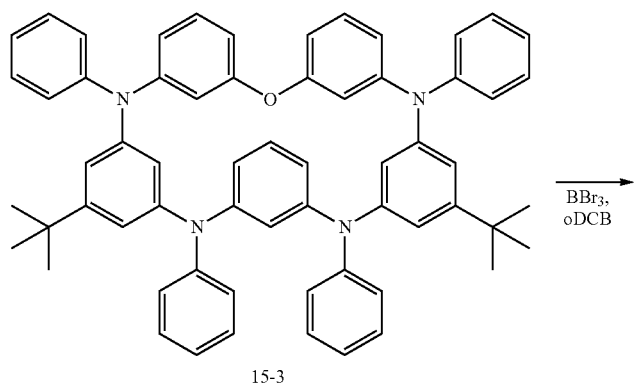
15-3
BBr₃,
oDCB
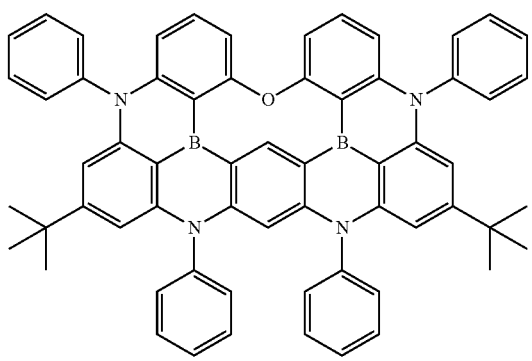
15

Synthesis of Intermediate 15-1
Intermediate 15-1 was obtained in the same manner as Intermediate 13-2. (Yield: 77%)
Synthesis of Intermediate 15-2
Intermediate 15-2 was obtained in the same manner as Intermediate 7-5. (Yield: 68%)
Synthesis of Intermediate 15-3
Intermediate 15-3 was obtained in the same manner as Intermediate 7-6. (Yield: 37%)
Synthesis of Compound 15
Compound 15 was obtained by using Intermediate 15-3 in the same manner as Compound 7. (Yield after sublimation: 7%)

Synthesis Example 5

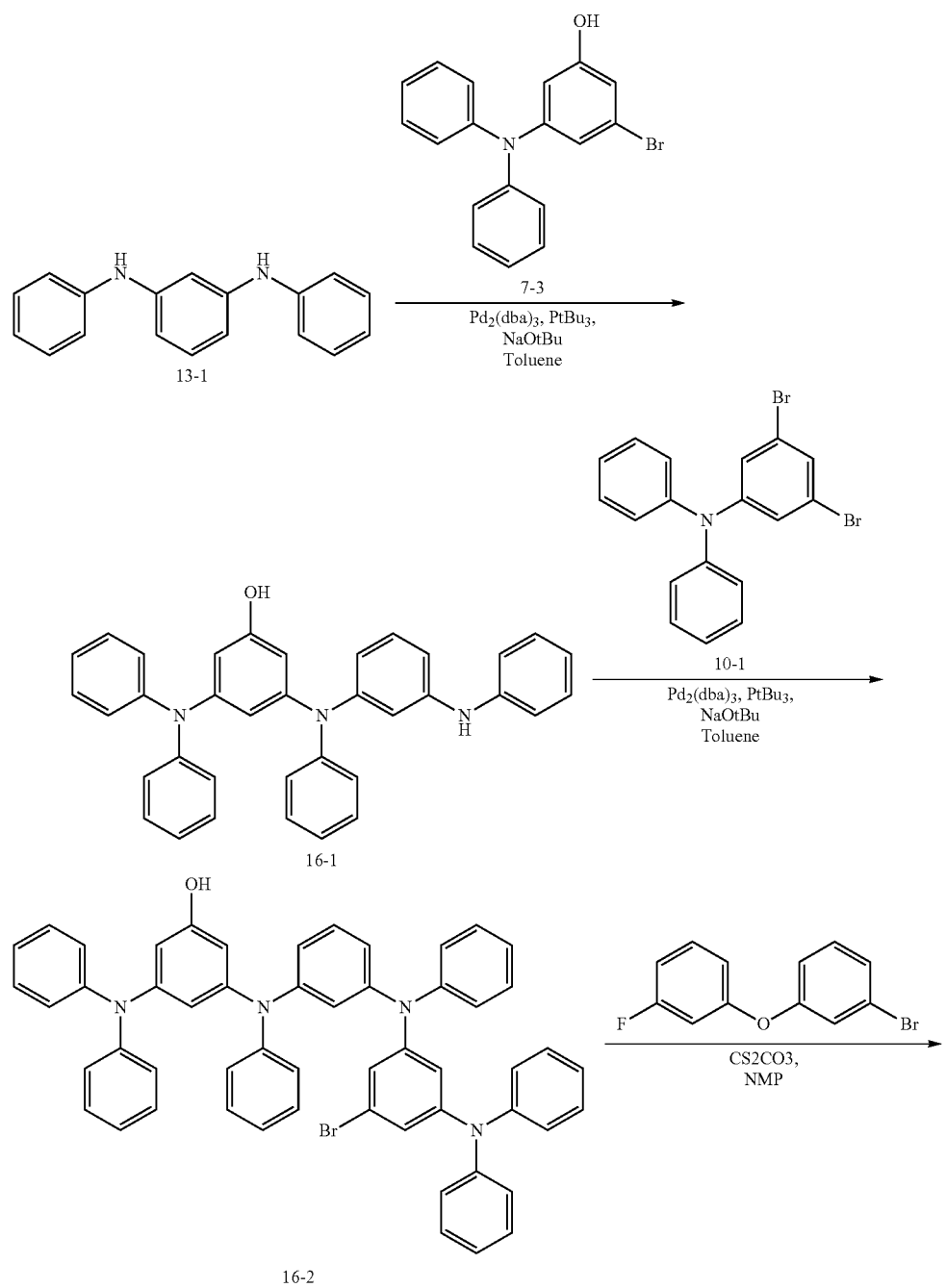

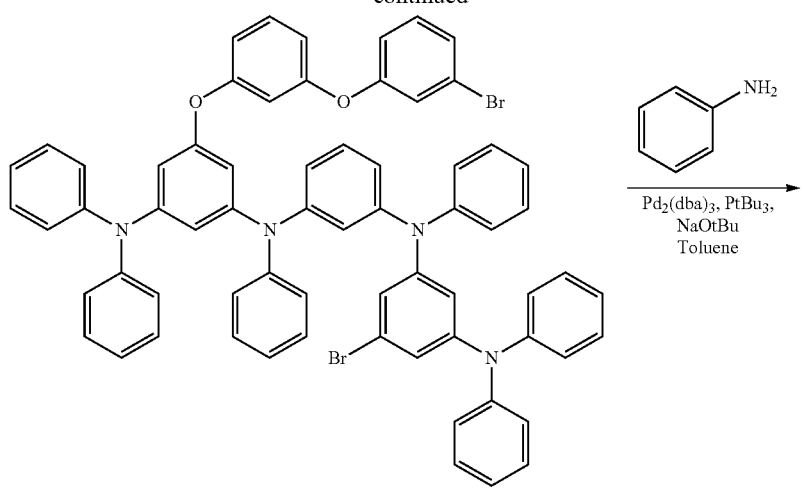
16-3
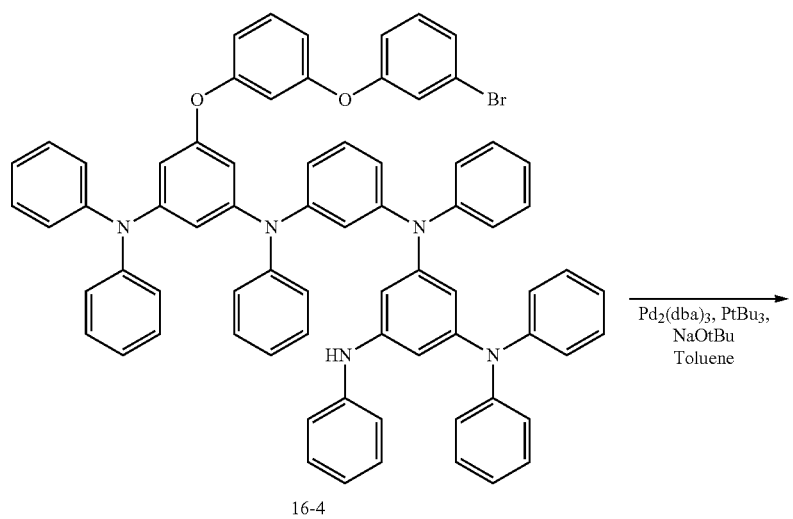
16-4
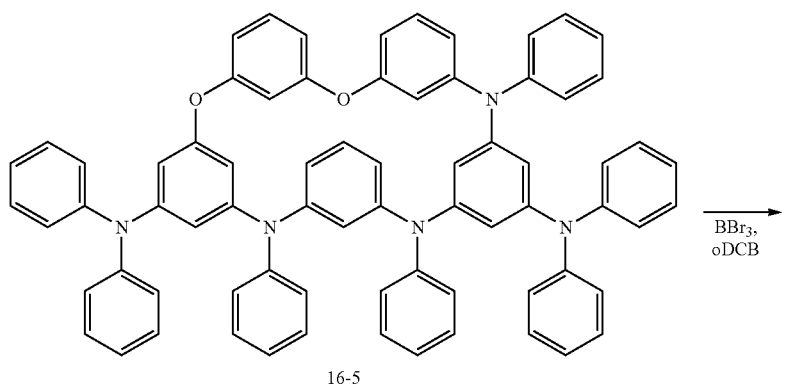
16-5

-continued

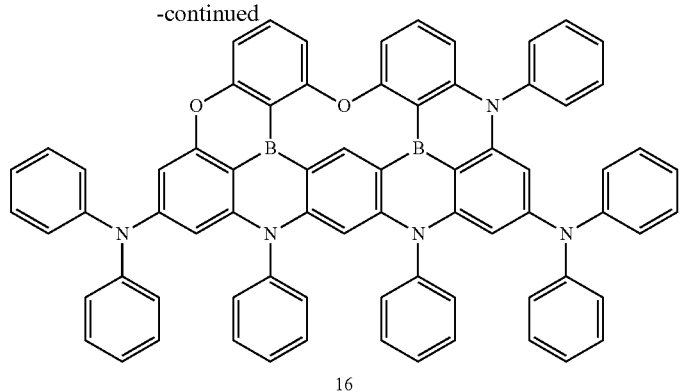

16

Synthesis of Intermediate 16-1

Intermediate 13-1 (1eq), Intermediate 7-3 (1eq), tris(dibenzylideneacetone)dipalladium(0) (0.1eq), tri-tert-butylphosphine (0.2eq), and sodium tert-butoxide (3eq) were dissolved in toluene, and then, were stirred at a temperature of 90° C. for 8 hours in a nitrogen atmosphere. The mixture was cooled, then cleaned three times by using ethyl acetate and water, and then the obtained organic layer was dried by using $MgSO_4$ under reduced pressure. Column chromatography and recrystallization (dichloromethane:n-hexane) were performed thereon to obtain Intermediate 16-1. (Yield: 61%)

Synthesis of Intermediate 16-2

Intermediate 16-1 (1eq), Intermediate 10-1 (1eq), tris(dibenzylideneacetone)dipalladium(0) (0.1eq), tri-tert-butylphosphine (0.2eq), and sodium tert-butoxide (3eq) were dissolved in toluene, and then, were stirred at a temperature of 90° C. for 8 hours in a nitrogen atmosphere. The mixture was cooled, then cleaned three times by using ethyl acetate and water, and then the obtained organic layer was dried by using $MgSO_4$ under reduced pressure. Column chromatography and recrystallization (dichloromethane:n-hexane) were performed thereon to obtain Intermediate 16-2. (Yield: 73%)

Synthesis of Intermediate 16-3

Intermediate 16-4 was obtained in the same manner as Intermediate 10-3. (Yield: 42%)

Synthesis of Intermediate 16-4

Intermediate 16-3 (1eq), aniline (1eq), tris(dibenzylideneacetone)dipalladium(0) (0.1eq), tri-tert-butylphosphine (0.2eq), and sodium tert-butoxide (3eq) were dissolved in toluene, and then, were stirred at a temperature of 100° C. for 6 hours in a nitrogen atmosphere. The mixture was cooled, then cleaned three times by using ethyl acetate and water, and then the obtained organic layer was dried by using $MgSO_4$ under reduced pressure. Column chromatography and recrystallization (dichloromethane:n-hexane) were performed thereon to obtain Intermediate 16-4. (Yield: 55%)

Synthesis of Intermediate 16-5

Intermediate 16-5 was obtained in the same manner as Intermediate 7-6. (Yield: 36%)

Synthesis of Compound 16

Compound 16 was obtained by using Intermediate 16-3 in the same manner as Compound 7. (Yield after sublimation: 4%)

Proton nuclear magnetic resonance ($^1$H NMR) and mass spectroscopy/fast atom bombardment (MS/FAB) of compounds synthesized according to Synthesis Examples are shown in Table 1.

Synthesis methods of compounds other than Compounds shown in Table 1 may also be easily recognized by those of ordinary skill in the art by referring to the synthesis mechanisms and source materials described above.

TABLE 1

| Compound | 1H NMR (CDCl3, 400 MHz) | MS/FAB found | calc. |
|---|---|---|---|
| 7 | 10.52 (1H, s), 9.53 (2H, d), 7.54-7.36 (8H, m), 7.34-7.16 (16H, m), 7.15-7.02 (7H, m), 7.01-6.90 (4H, m), 6.82 (2H, d), 5.81 (2H, d) | 960.71 | 960.70 |
| 10 | 10.47 (1H, s), 9.46 (2H, d), 7.57-7.41 (10H, m), 7.43-7.19 (19H, m), 7.18-6.92 (8H, m), 6.90-6.70 (3H, m), 6.68 (1H, s), 5.87 (1H, s) 5.83 (2H, s) | 1035.82 | 1035.81 |
| 13 | 10.57 (1H, s), 9.65 (2H, d), 7.62-7.47 (14H, m), 7.40-7.12 (14H, m), 7.10-6.87 (13H, m), 6.80-6.72 (5H, m), 5.82 (1H, s), 5.75 (2H, s) | 1110.94 | 1110.94 |
| 15 | 10.43 (1H, s), 9.45 (2H, d), 7.60-7.42 (7H, m), 7.40-7.12 (8H, m), 7.10-6.87 (7H, m), 6.92-6.87 (4H, m), 6.02 (1H, s), 5.83 (2H, s), 1.32 (18H, s) | 888.73 | 888.71 |
| 16 | 10.40 (1H, s), 9.43 (2H, d), 7.59-7.43 (9H, m), 7.36-7.14 (13H, m), 7.10-6.92 (6H, m), 6.90-6.72 (12H, m), 5.92 (1H, s), 5.77 (1H, s), 5.67 (2H, s) | 1035.82 | 1035.80 |

Manufacture of Light-Emitting Device

Example 1

As an anode, a 15 $\Omega/cm^2$ (1,200 Å) indium-tin oxide (ITO) glass substrate obtained from Corning, Inc. of Corning, N.Y. was cut to a size of 50 mm×50 mm×0.7 mm, sonicated with isopropyl alcohol and pure water each for 5 minutes, and then cleaned by exposure to ultraviolet rays and ozone for 30 minutes. Then, the ITO glass substrate was provided to a vacuum deposition apparatus.

A known compound NPD was vacuum-deposited on the ITO glass substrate to form a hole injection layer having a thickness of 300 Å, and a hole transport compound TCTA was vacuum-deposited on the hole injection layer to form a hole transport layer having a thickness of 200 Å. A hole transport compound 9-(4-tert-butylphenyl)-3,6-bis(triphenylsilyl)-9H-carbazole (CzSi) was vacuum-deposited on the hole transport layer to a thickness of 100 Å.

mCP and Compound 7 were co-deposited thereon at a weight ratio of 99:1 to form an emission layer having a thickness of 200 Å.

Subsequently, diphenyl[4-(triphenylsilyl)phenyl]phosphine oxide (TSPO1) as an electron transport layer was formed to a thickness of 200 Å, and then, 1,3,5-tris (1-phenyl-1H-benzimidazol-2-yl) benzene (TPBI) as an electron injection compound was deposited thereon to a thickness of 300 Å.

Alkali metal halide LiF was deposited thereon to form an electron injection layer having a thickness of 10 Å, aluminum was vacuum-deposited to a thickness of 3,000 Å (cathode) to form a LiF/Al electrode, thereby completing the manufacture of a light-emitting device.

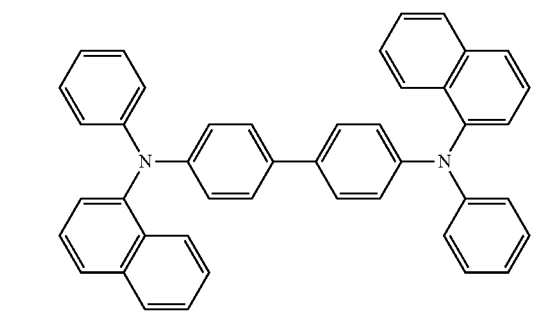

NPD

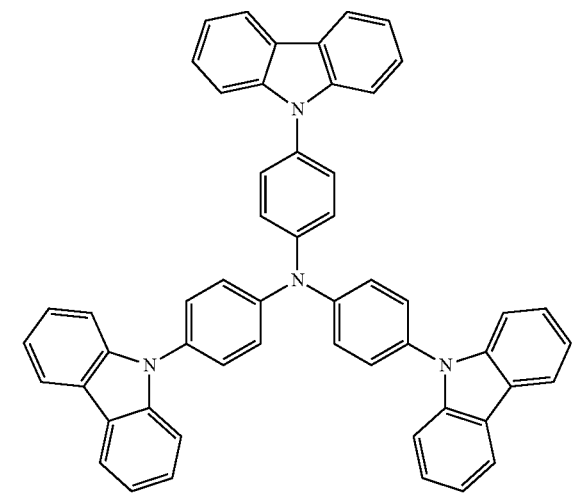

TCTA

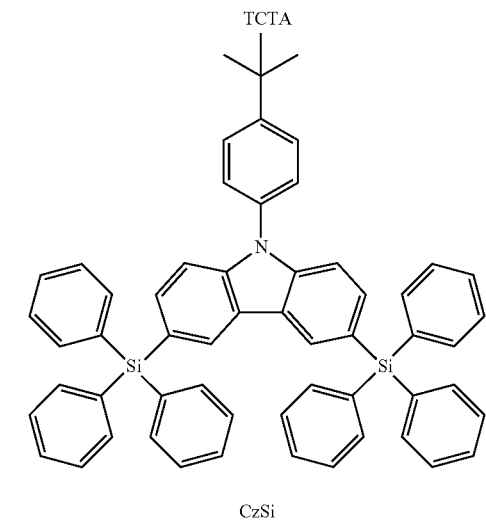

CzSi

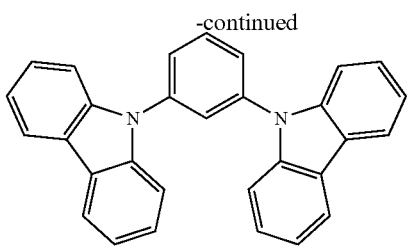

mCP

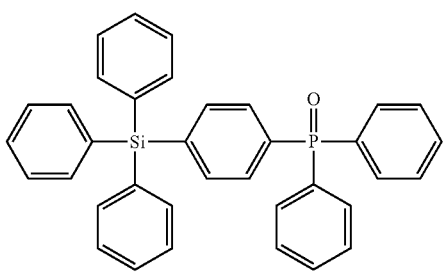

TSPO1

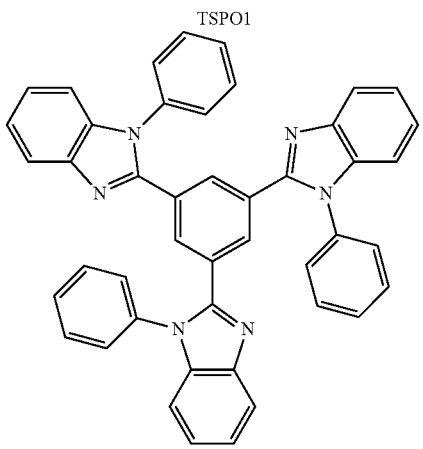

TPBI

Example 2

A light-emitting device was manufactured in the same manner as in Example 1, except that Compound 10 was used instead of Compound 7 in forming an emission layer.

Example 3

A light-emitting device was manufactured in the same manner as in Example 1, except that Compound 13 was used instead of Compound 7 in forming an emission layer.

Example 4

A light-emitting device was manufactured in the same manner as in Example 1, except that Compound 15 was used instead of Compound 7 in forming an emission layer.

Example 5

A light-emitting device was manufactured in the same manner as in Example 1, except that Compound 16 was used instead of Compound 7 in forming an emission layer.

Comparative Example 1

A light-emitting device was manufactured in the same manner as in Example 1, except that a known Compound 3-20 was used instead of Compound 7 in forming an emission layer.

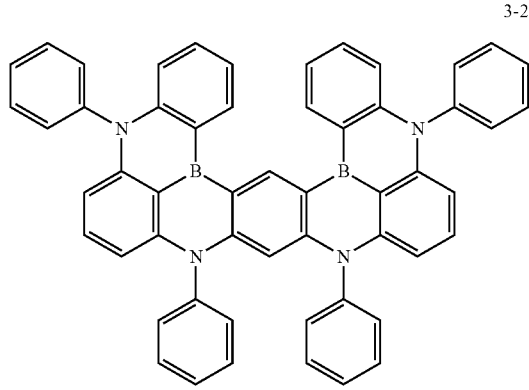

3-20

Driving voltage, efficiency, and maximum quantum efficiency, and the like, at a current density of 10 mA/cm$^2$, were measured in order to evaluate characteristics of each of the light-emitting device manufactured according to Examples 1 to 5 and Comparative Example 1.

The driving voltage and the current density of the light-emitting device were measured by using a source meter (Keithley Instruments, 2400 series by Tektronix, Inc., of Beaverton, Oreg.), and the maximum quantum efficiency was measured by using an external quantum efficiency measurement apparatus sold under the trade designation C9920-2-12 of Hamamatsu Photonics Inc. of Hamamatsu-city, Japan.

In the evaluation of the maximum quantum efficiency, a luminance/current density was measured by using a luminance meter with calibrated wavelength sensitivity, and the maximum quantum efficiency was calculated by assuming angular luminance distribution (Lambertian) with a postulated perfect reflecting diffuser.

TABLE 2

| Example | Emission layer | Driving voltage (V) | Efficiency (Cd/A) | Maximum quantum efficiency (%) | Emission color |
|---|---|---|---|---|---|
| Example 1 | Compound 7 | 5.0 | 24.5 | 22.9 | Blue color |
| Example 2 | Compound 10 | 4.9 | 25.6 | 23.5 | Blue color |
| Example 3 | Compound 13 | 4.8 | 27.2 | 24.2 | Blue color |
| Example 4 | Compound 15 | 5.0 | 21.2 | 20.7 | Blue color |
| Example 5 | Compound 16 | 4.9 | 24.3 | 22.8 | Blue color |
| Comparative Example 1 | Compound 3-20 | 5.5 | 19.9 | 19.5 | Blue color |

From Table 2, it was confirmed that the light-emitting devices of Examples 1 to 5 show excellent results compared to the light-emitting device of Comparative Example 1.

The compound of Formula 1 according to one or more exemplary embodiments is structurally distinct by further activating multiple resonance and has a high f value and a lower $\Delta E_{ST}$. Accordingly, when an emission layer of a light-emitting device includes the compound of Formula 1 according to one or more exemplary embodiments, efficiency is increased. The compound of Formula 1 according to one or more exemplary embodiments functions as a delayed fluorescence dopant.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:
   a first electrode;
   a second electrode facing the first electrode; and
   an intermediate layer disposed between the first electrode and the second electrode and comprising an emission layer,
   wherein the first electrode and the second electrode each independently include at least one selected from the group consisting of lithium (Li), silver (Ag), magnesium (Mg), aluminum (Al), aluminum-lithium (Al—Li), calcium (Ca), magnesium-indium (Mg—In), magnesium-silver (Mg—Ag), indium tin oxide (ITO), zinc oxide (ZnO), tin oxide (SnO2) and indium zinc oxide (IZO), and
   the intermediate layer comprises the compound of Formula 1:

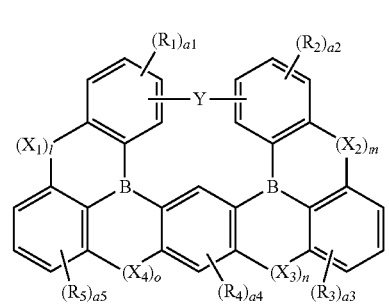

<Formula 1> wherein, in Formula 1:
Y is O, S, or Se;
X1 is NR11, O, or S, X2 is NR12, O, or S, X3 is NR13, O, or S, and X4 is NR14, O, or S;
l, m, n, and o are each, independently from one another, 0 or 1, and at least one of l, m, n, or o is 1;
R1 to R5 and R11 to R14 are each, independently from one another, hydrogen, deuterium, a substituted or unsubstituted C1-C60 alkyl group, a substituted or unsubstituted C2-C60 alkenyl group, a substituted or unsubstituted C2-C60 alkynyl group, a substituted or unsubstituted C1-C60 alkoxy group, a substituted or unsubstituted C3-C10 cycloalkyl group, a substituted or unsubstituted C1-C10 heterocycloalkyl group, a substituted or unsubstituted C3-C10 cycloalkenyl group, a substituted or unsubstituted C1-C10 heterocycloalkenyl group, a substituted or unsubstituted C6-C60 aryl group, a substituted or unsubstituted C6-C60 aryloxy group, a substituted or unsubstituted C6-C60 arylthio group, a substituted or unsubstituted C1-C60 heteroaryl group, a substituted or unsubstituted monovalent non-aromatic fused polycyclic group, a substituted or unsubstituted monovalent non-aromatic fused heteropolycyclic group, —Si(Q1)(Q2)(Q3), —N(Q1)(Q2), —P(Q1)(Q2), —C(=O)(Q1), —S(=O)2(Q1), or —P(=O)(Q1)(Q2);

a1, a2, a3, and a5 are each, independently from one another, 1, 2, or 3;

a4 is 1 or 2;

two neighboring substituents of R1 to R5 and R11 to R14 are optionally linked to each other to form a ring, and at least one substituent of the substituted C1-C60 alkyl group, the substituted C2-C60 alkenyl group, the substituted C2-C60 alkynyl group, the substituted C1-C60 alkoxy group, the substituted C3-C10 cycloalkyl group, the substituted C1-C10 heterocycloalkyl group, the substituted C3-C10 cycloalkenyl group, the substituted C1-C10 heterocycloalkenyl group, the substituted C6-C60 aryl group, the substituted C6-C60 aryloxy group, the substituted C6-C60 arylthio group, the substituted C1-C60 heteroaryl group, the substituted monovalent non-aromatic fused polycyclic group, or the substituted monovalent non-aromatic fused heteropolycyclic group is:

deuterium, —F, —Cl, —Br, —I, a hydroxyl group, a cyano group, a nitro group, an amidino group, a hydrazino group, a hydrazono group, a C1-C60 alkyl group, a C2-C60 alkenyl group, a C2-C60 alkynyl group, or a C1-C60 alkoxy group;

a C1-C60 alkyl group, a C2-C60 alkenyl group, a C2-C60 alkynyl group, or a C1-C60 alkoxy group, each, independently from one another, substituted with at least one of deuterium, —F, —Cl, —Br, —I, a hydroxyl group, a cyano group, a nitro group, an amidino group, a hydrazino group, a hydrazono group, a C3-C10 cycloalkyl group, a C1-C10 heterocycloalkyl group, a C3-C10 cycloalkenyl group, a C1-C10 heterocycloalkenyl group, a C6-C60 aryl group, a C6-C60 aryloxy group, a C6-C60 arylthio group, a C1-C60 heteroaryl group, a monovalent non-aromatic fused polycyclic group, a monovalent non-aromatic fused heteropolycyclic group, —Si(Q11)(Q12)(Q13), —N(Q11)(Q12), —C(=O)(Q11), —S(=O)2(Q11), or —P(=O)(Q11)(Q12); and a C3-C10 cycloalkyl group, a C1-C10 heterocycloalkyl group, a C3-C10 cycloalkenyl group, a C1-C10 heterocycloalkenyl group, a C6-C60 aryl group, a C6-C60 aryloxy group, a C6-C60 arylthio group, a C1-C60 heteroaryl group, a monovalent non-aromatic fused polycyclic group, or a monovalent non-aromatic fused heteropolycyclic group, each, independently from one another, optionally substituted with at least one selected from deuterium, —F, —Cl, —Br, —I, a hydroxyl group, a cyano group, a nitro group, an amidino group, a hydrazino group, a hydrazono group, a C1-C60 alkyl group, a C2-C60 alkenyl group, a C2-C60 alkynyl group, a C1-C60 alkoxy group, a C3-C10 cycloalkyl group, a C1-C10 heterocycloalkyl group, a C3-C10 cycloalkenyl group, a C1-C10 heterocycloalkenyl group, a C6-C60 aryl group, a C6-C60 aryloxy group, a C6-C60 arylthio group, a C1-C60 heteroaryl group, a monovalent non-aromatic fused polycyclic group, a monovalent non-aromatic fused heteropolycyclic group, —Si(Q21)(Q22)(Q23), —N(Q21)(Q22), —C(=O)(Q21), —S(=O)2(Q21), —P(=O)(Q21)(Q22); —Si(Q31)(Q32)(Q33), —N(Q31)(Q32), —C(=O)(Q31), —S(=O)2(Q31), or —P(=O)(Q31)(Q32);

wherein Q1 to Q3, Q11 to Q13, Q21 to Q23, and Q31 to Q33 are each, independently from one another, hydrogen, deuterium, —F, —Cl, —Br, —I, a hydroxyl group, a cyano group, a nitro group, an amidino group, a hydrazino group, a hydrazono group, a C1-C60 alkyl group, a C2-C60 alkenyl group, a C2-C60 alkynyl group, a C1-C60 alkoxy group, a C3-C10 cycloalkyl group, a C1-C10 heterocycloalkyl group, a C3-C10 cycloalkenyl group, a C1-C10 heterocycloalkenyl group, a C6-C60 aryl group, a C1-C60 heteroaryl group, a monovalent non-aromatic fused polycyclic group, a monovalent non-aromatic fused heteropolycyclic group, a biphenyl group, or a terphenyl group.

2. The organic light-emitting device of claim 1, wherein l and m are 1.

3. The organic light-emitting device of claim 1, wherein l, m, and o are 1, and n is 0, or
l, m, and n are 1, and o is 0.

4. The organic light-emitting device of claim 1, wherein l, m, n, and o are 1.

5. The organic light-emitting device of claim 1, wherein Y is O, and
R1 to R5 and R11 to R14 are each, independently from one another, a substituted or unsubstituted C1-C60 alkyl group, a substituted or unsubstituted C6-C60 aryl group, a substituted or unsubstituted C1-C60 heteroaryl group, a substituted or unsubstituted monovalent non-aromatic fused polycyclic, or —N(Q1)(Q2).

6. The organic light-emitting device of claim 1, wherein R11 to R14 are each, independently from one another, a substituted or unsubstituted C6-C60 aryl group, a substituted or unsubstituted C1-C60 heteroaryl group, or a substituted or unsubstituted monovalent non-aromatic fused polycyclic.

7. The organic light-emitting device of claim 1, wherein R11 to R14 are each, independently from one another:
a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, an imidazolyl group, a pyrazolyl group, a thiazolyl group, an isothiazolyl group, an oxazolyl group, an isoxazolyl group, a thiadiazolyl group, an oxadiazolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group, each, independently from one another, optionally substituted with at least one of deuterium, —F, —Cl, —Br, —I, a hydroxyl group, a cyano group, a nitro group, an amidino group, a hydrazino group, a hydrazono group, a C1-C20 alkyl group, a C1-C20 alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, an imidazolyl group, a pyrazolyl group, a thiazolyl group, an isothiazolyl group, an oxazolyl group, an isoxazolyl group, a thiadiazolyl group, an oxadiazolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si(Q31)(Q32)(Q33), —N(Q31)(Q32), —C(=O)(Q31), —S(=O)2(Q31), or ——P(=O)(Q31)(Q32).

8. The organic light-emitting device of claim 1, wherein R1 to R5 and R11 to R14 are each, independently from one another, hydrogen, deuterium, a methyl group, an ethyl group, a propyl group, an isobutyl group, a sec-butyl group, a ter-butyl group, a pentyl group, an iso-amyl group, or a hexyl group, or a group of Formula 2a or 2b:

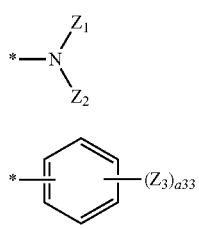

wherein, in Formulae 2a to 2b, Z1 to Z3 are each, independently from one another, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C1-C20 alkyl group, a C1-C20 alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, an imidazolyl group, a pyrazolyl group, a thiazolyl group, an isothiazolyl group, an oxazolyl group, an isoxazolyl group, a thiadiazolyl group, an oxadiazolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group, a33 is 1, 2, 3, 4, or 5, and

* indicates a binding site to neighboring atom.

9. The organic light-emitting device of claim 1, wherein the compound of Formula 1 is a compound of Formula 2 or 3:

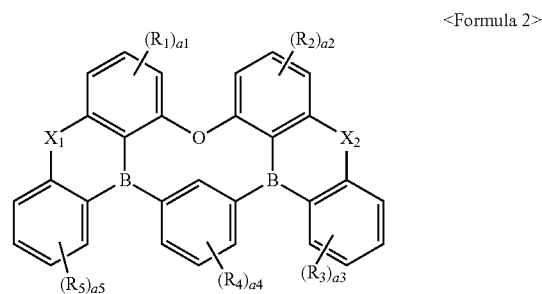

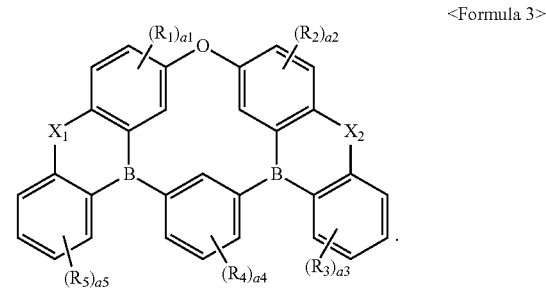

10. The organic light-emitting device of claim 1, wherein the compound of Formula 1 is a compound of Formula 4 or 5:

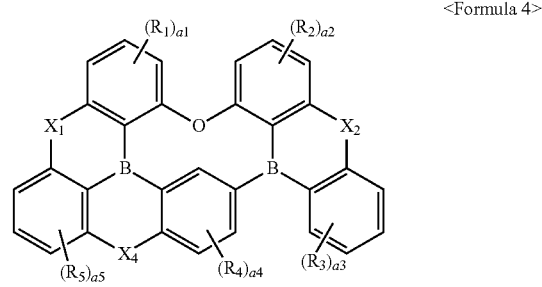

<Formula 5>
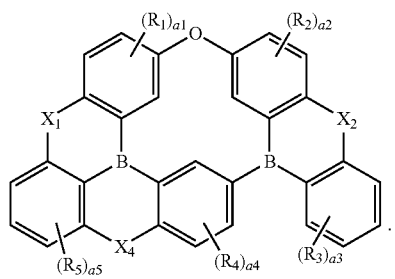
11. The organic light-emitting device of claim 1, the compound of Formula 1 is a compound of Formula 6 or 7:
<Formula 6>
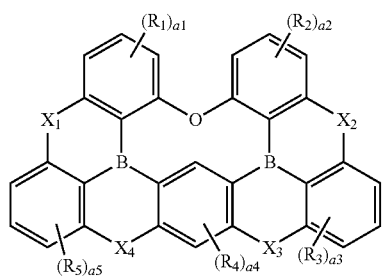
<Formula 7>
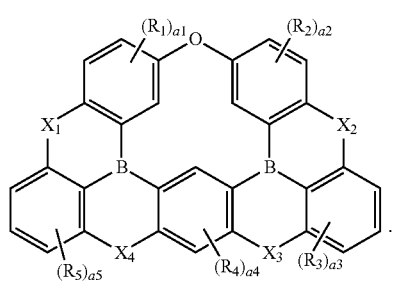
12. The organic light-emitting device of claim 1, wherein the compound of Formula 1 is one of the compounds below:
1
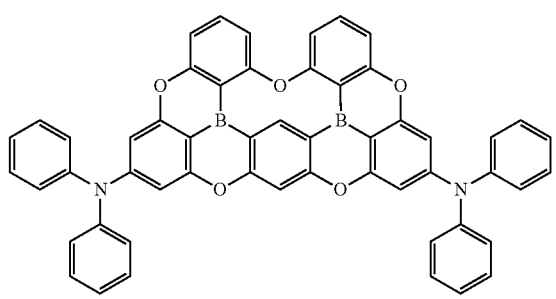
2
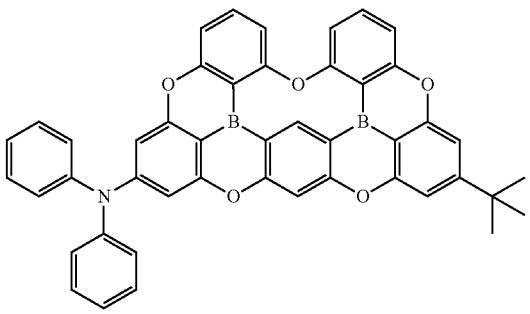
3
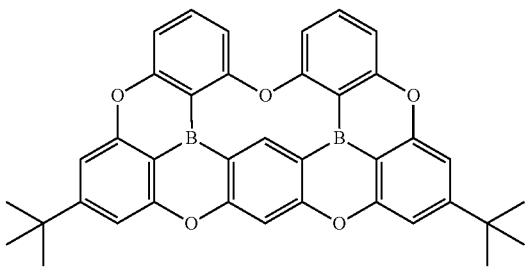
4
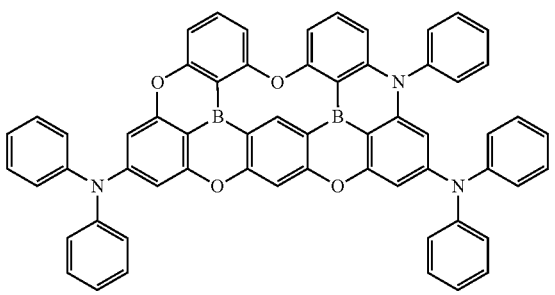
5
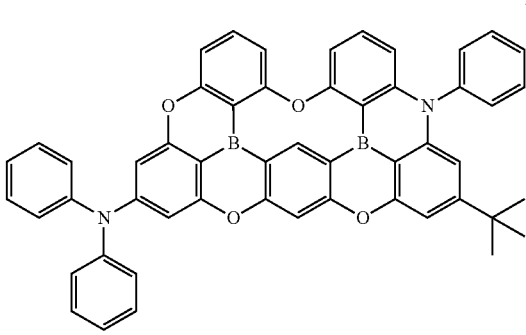
6
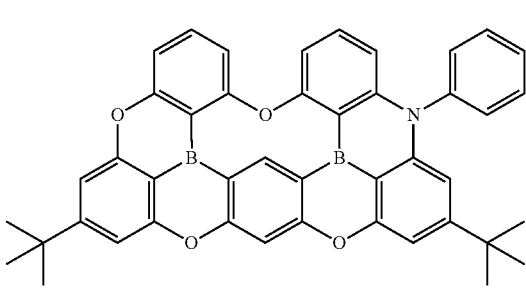

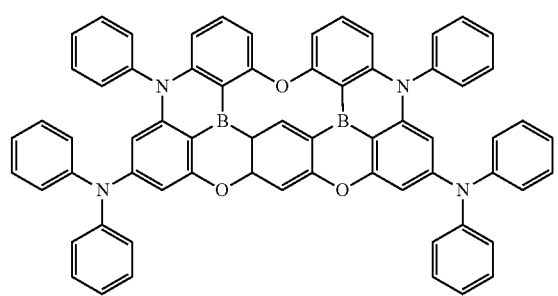
7
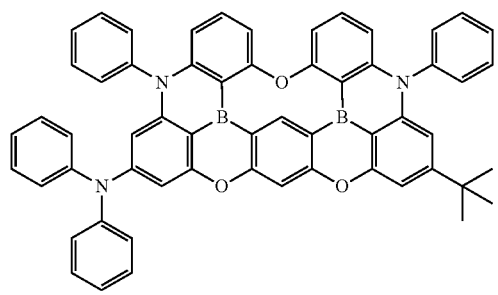
8
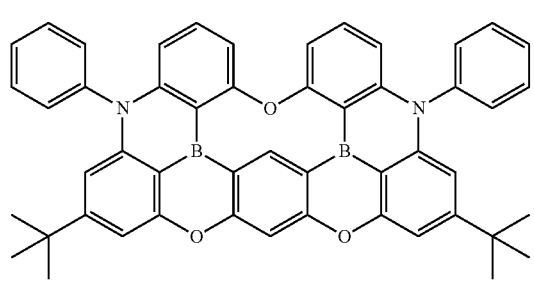
9
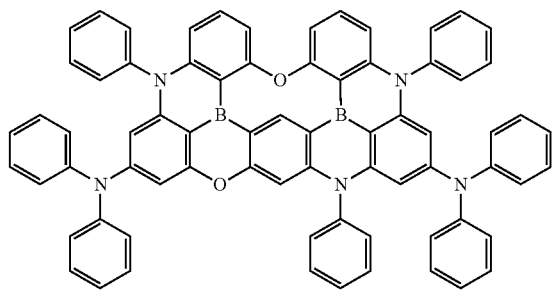
10
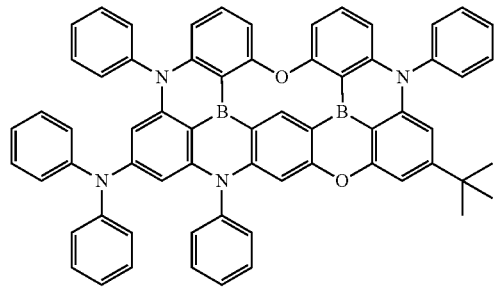
11
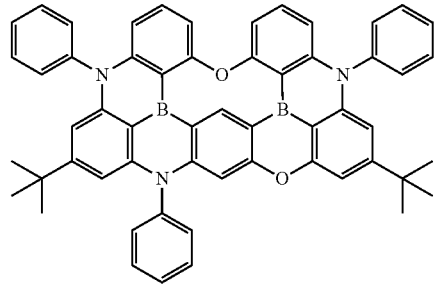
12
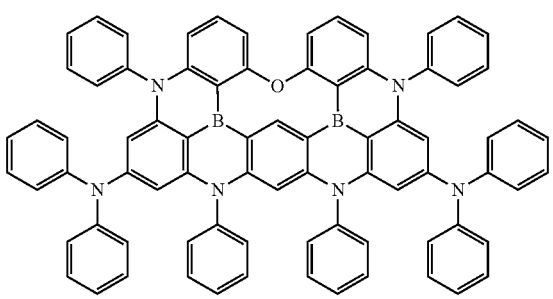
13
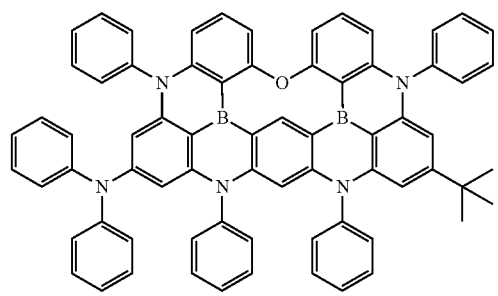
14
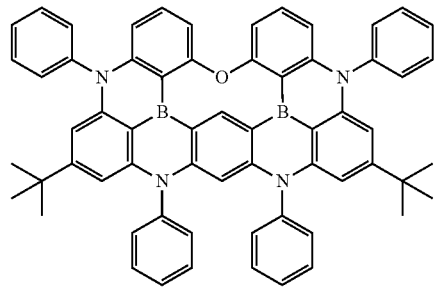
15
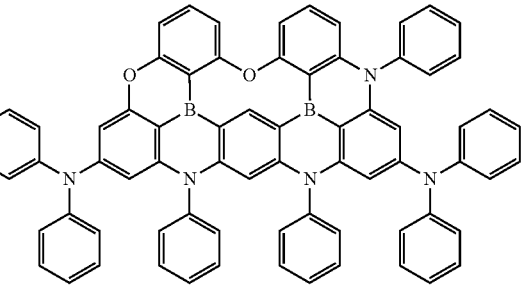
16

17
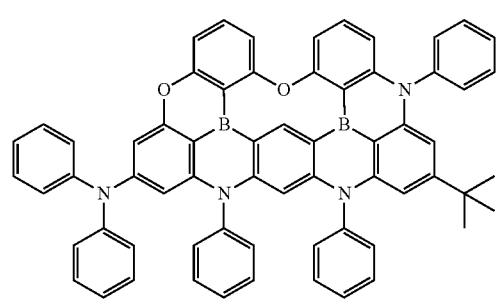
18
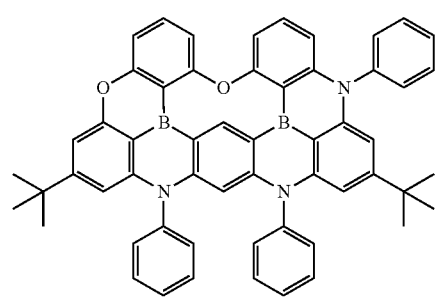
19
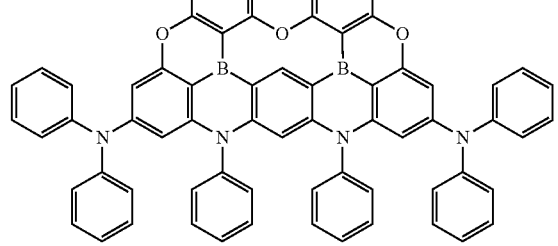
20
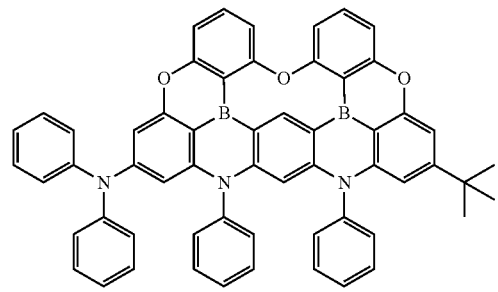
21
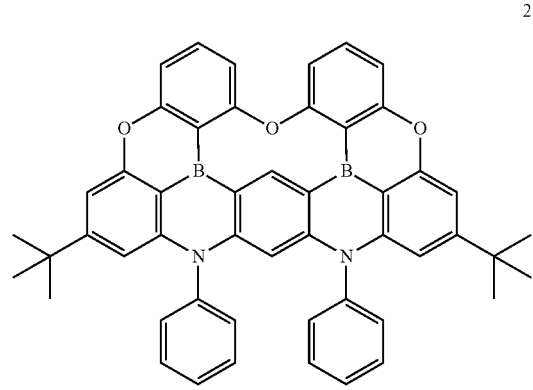
22
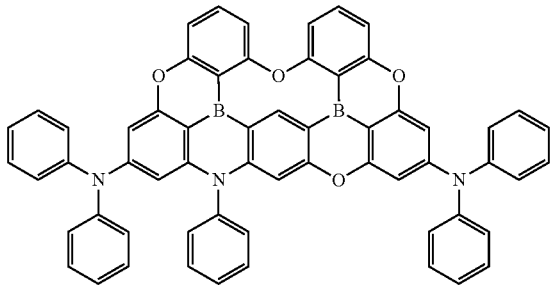
23
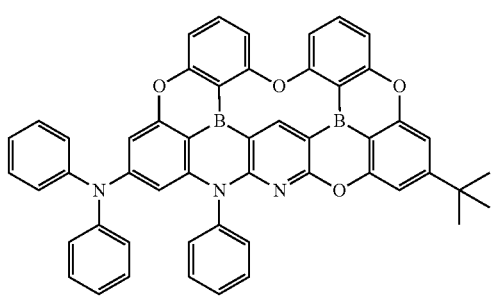

-continued
27
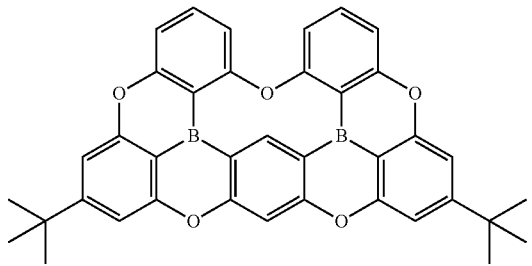
28
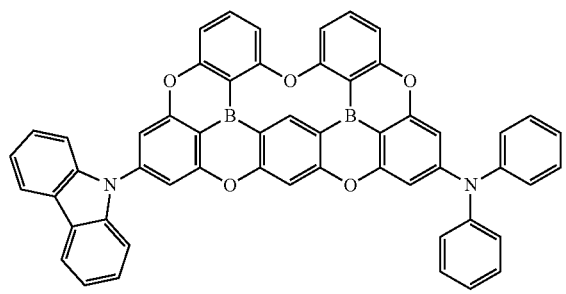
29
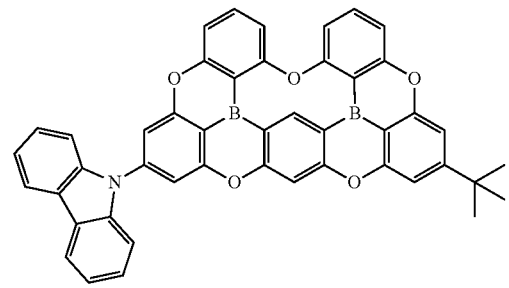
30
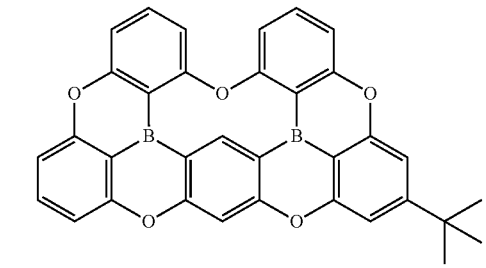
31
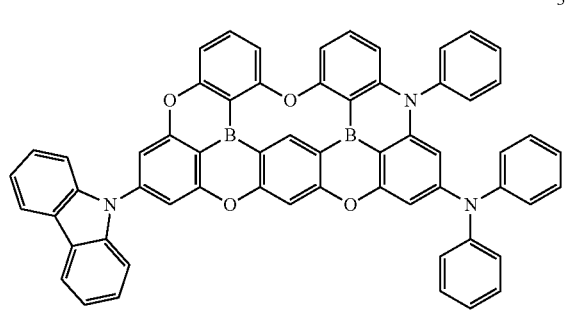
-continued
32
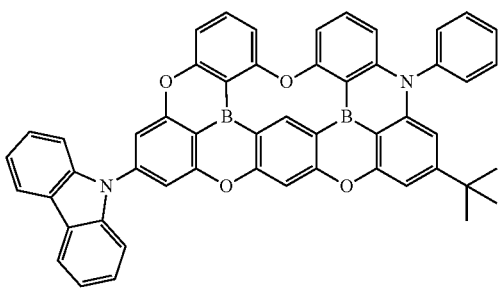
33
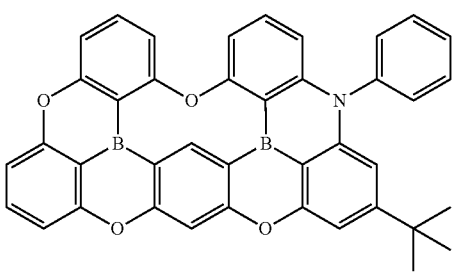
34
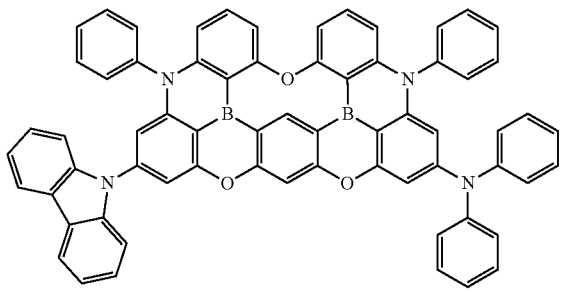
35
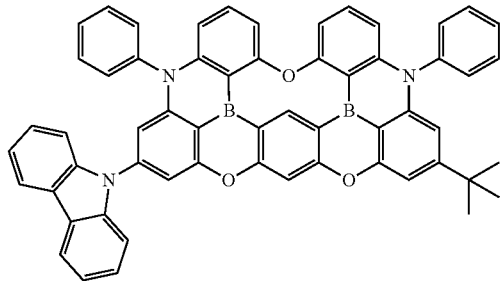
36
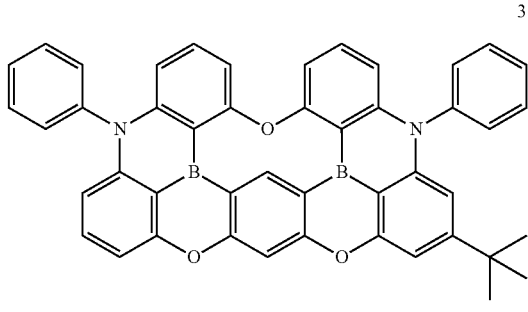

-continued
37
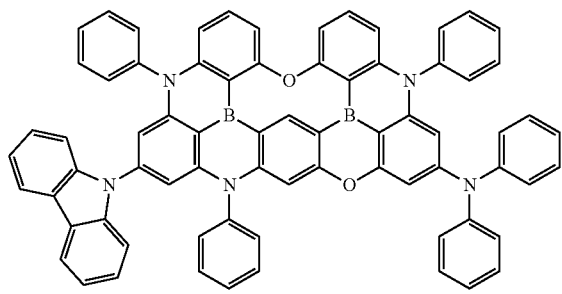
38
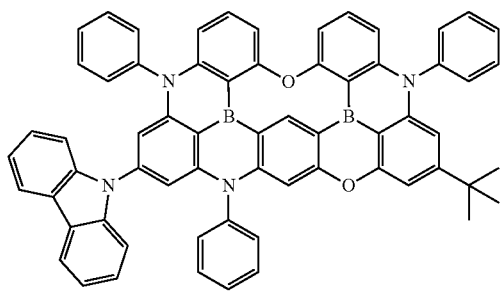
39
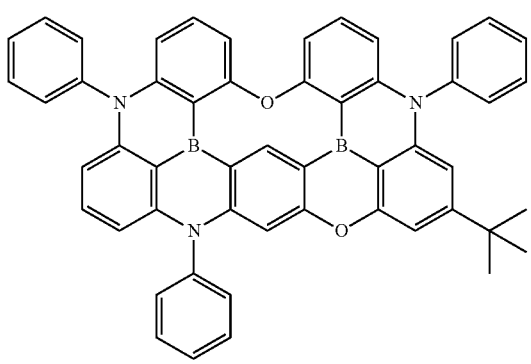
40
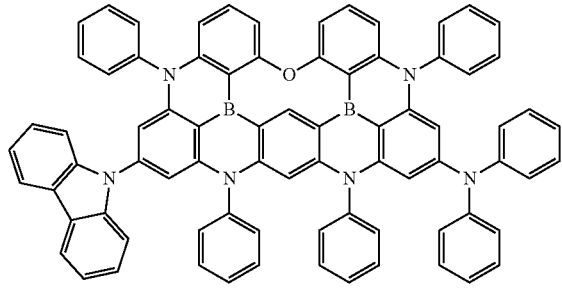
41
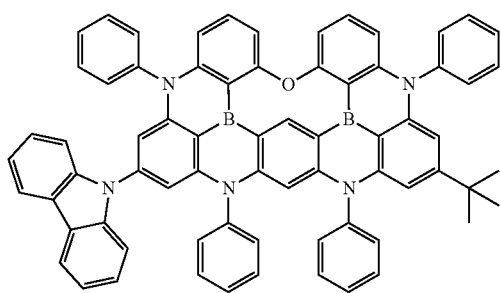
-continued
42
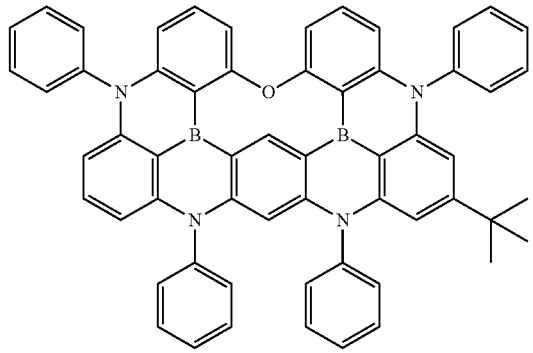
43
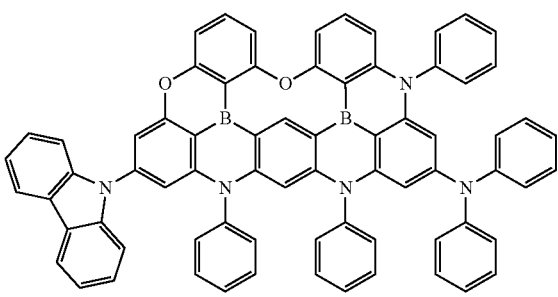
44
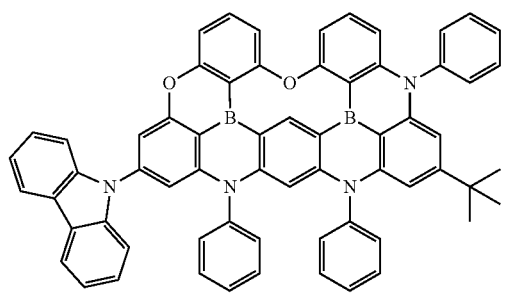
45
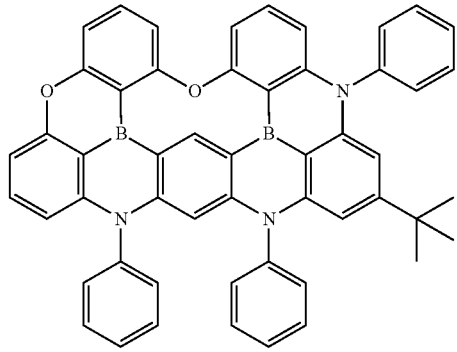

46
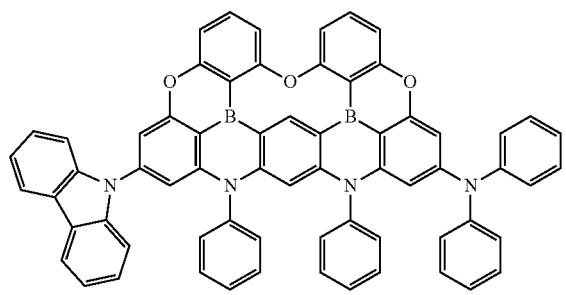
47
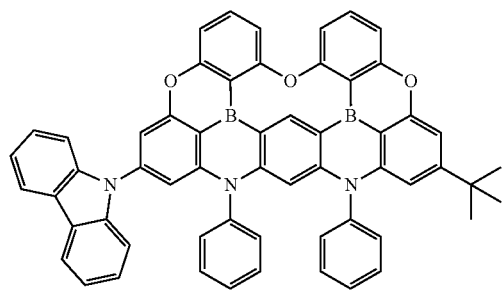
48
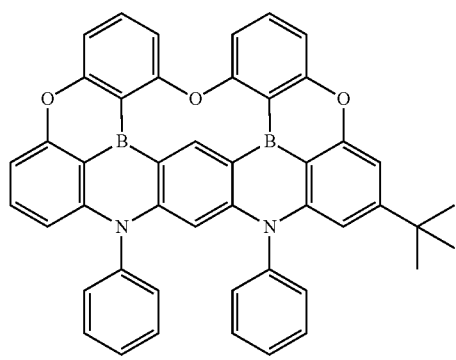
49
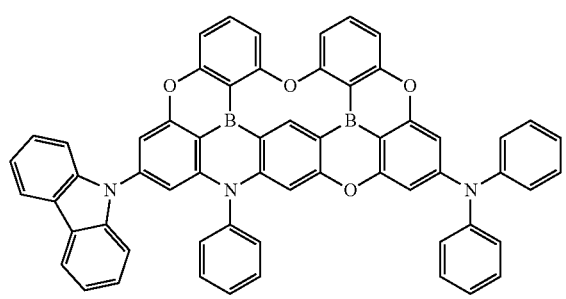
50
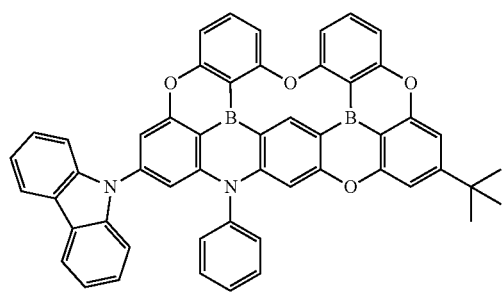
51
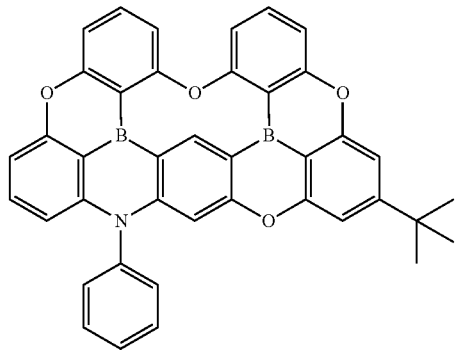
52
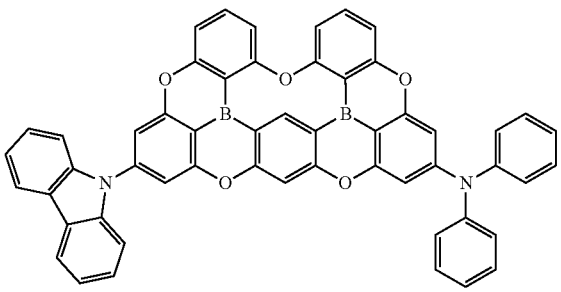
53
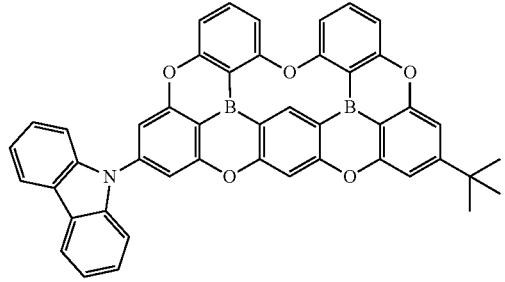
54
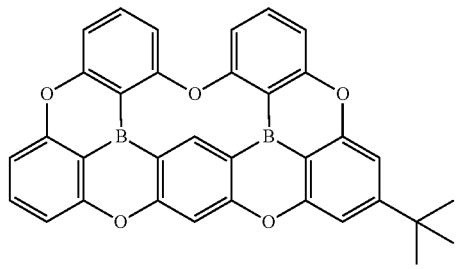

55
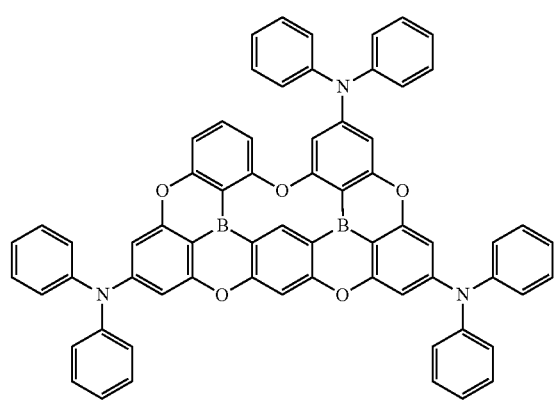
56
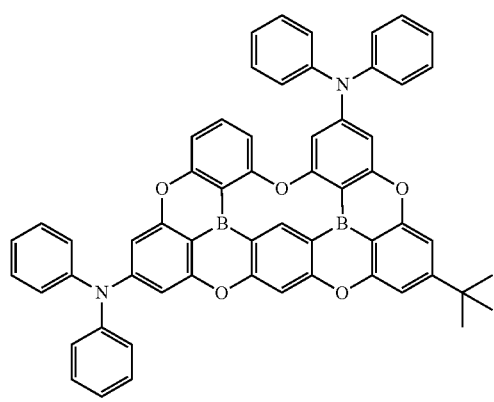
57
58
59
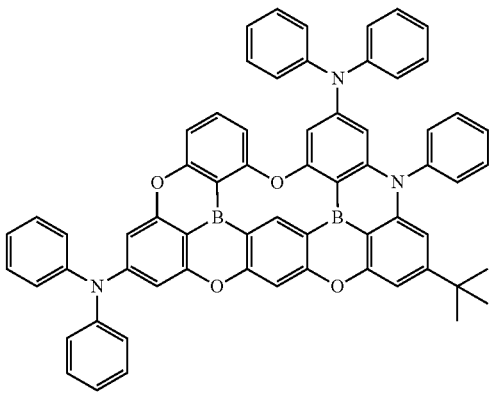
60
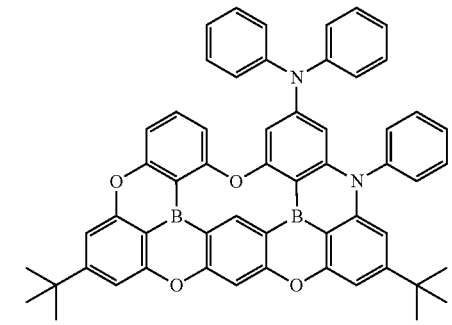
61
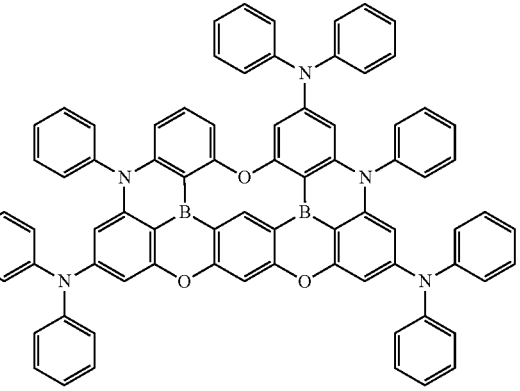
62
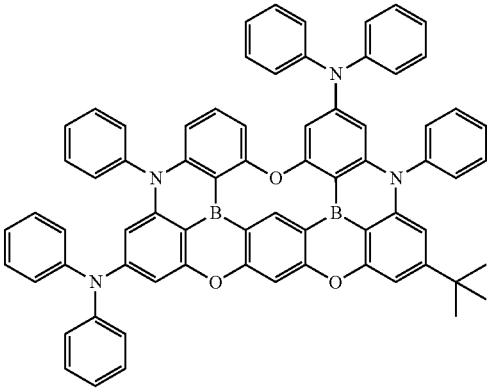

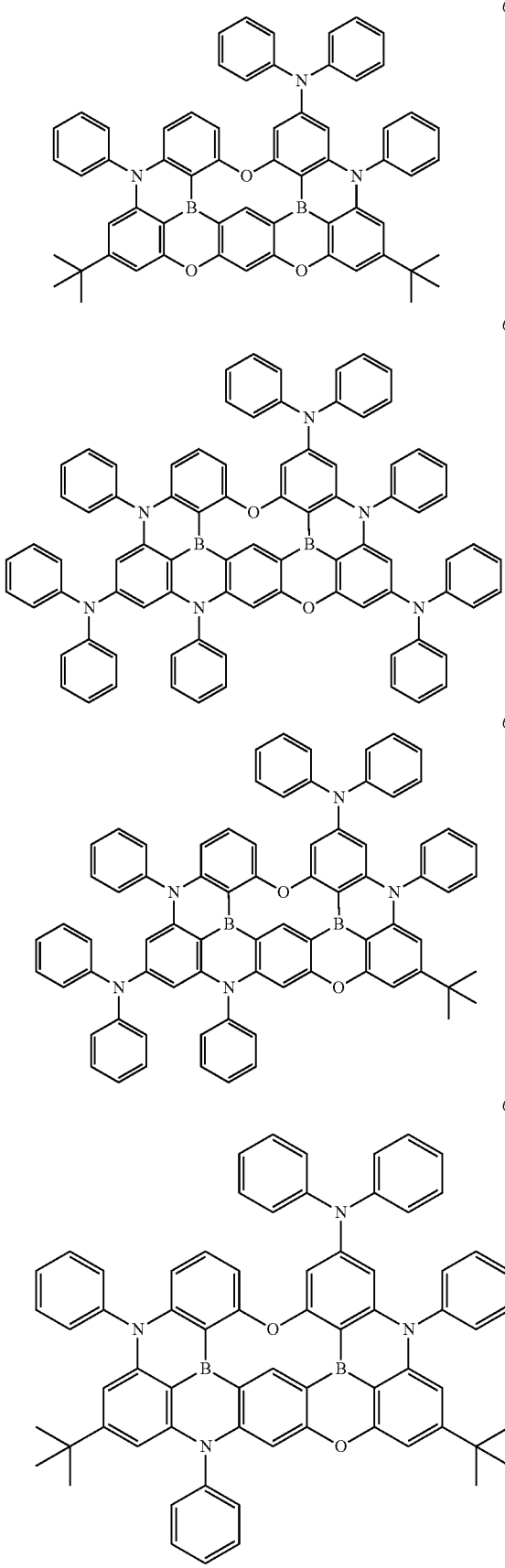
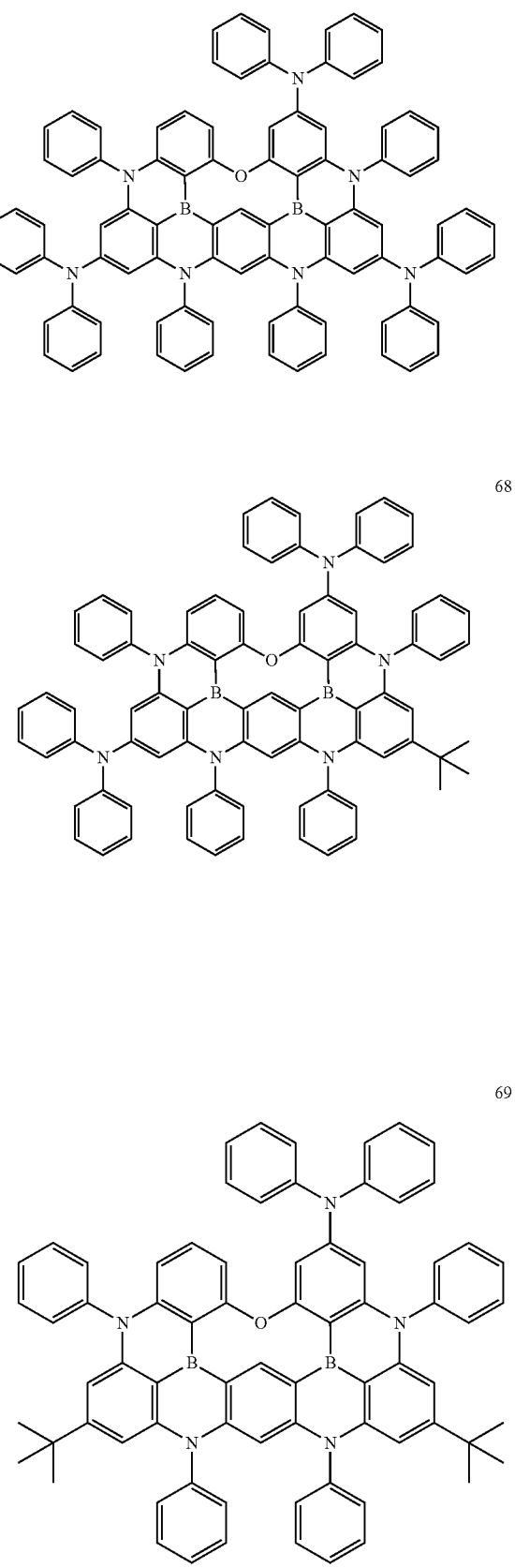

70
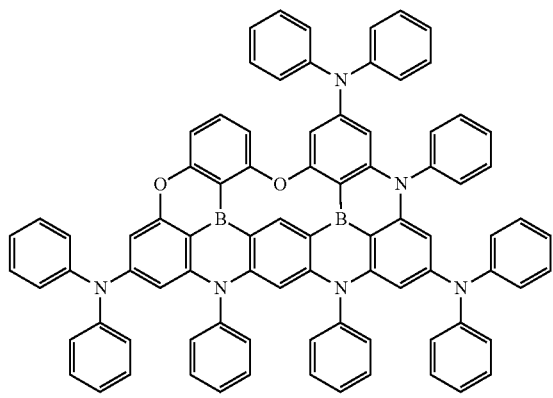
71
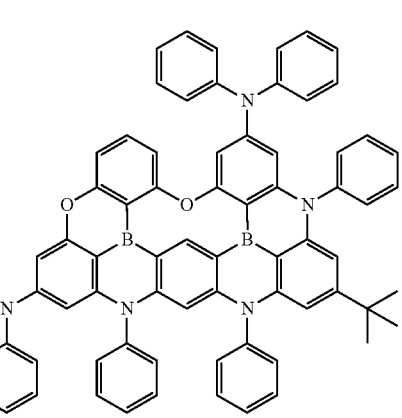
73
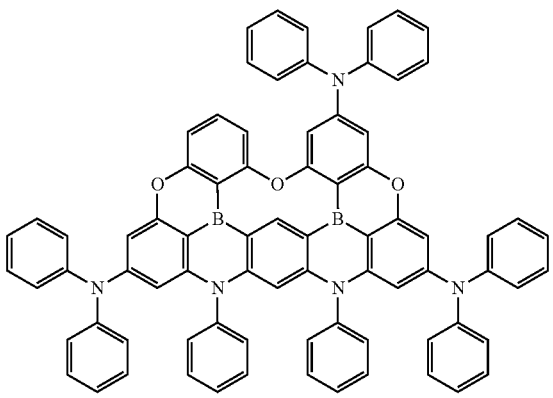
74
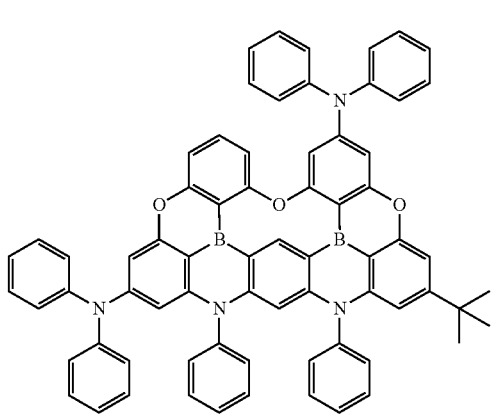
75
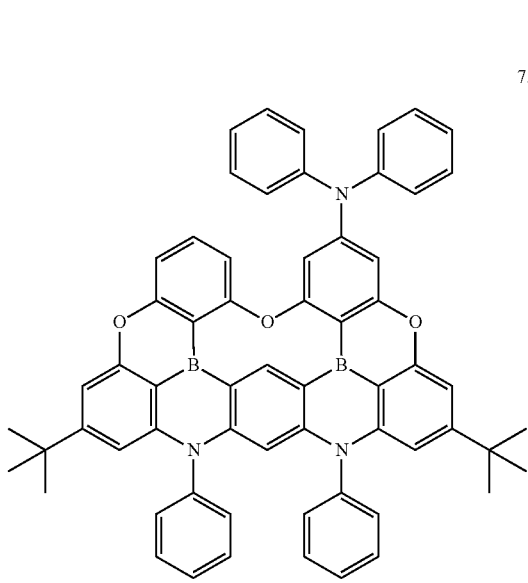

76
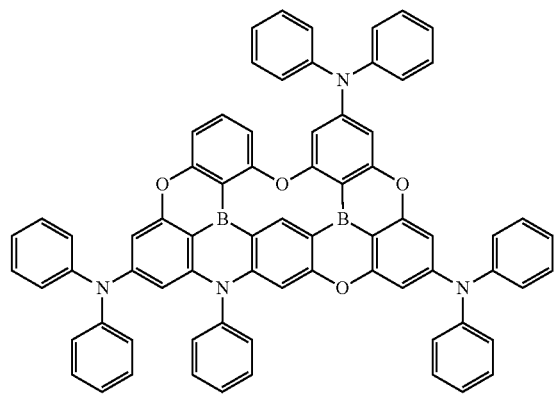
77
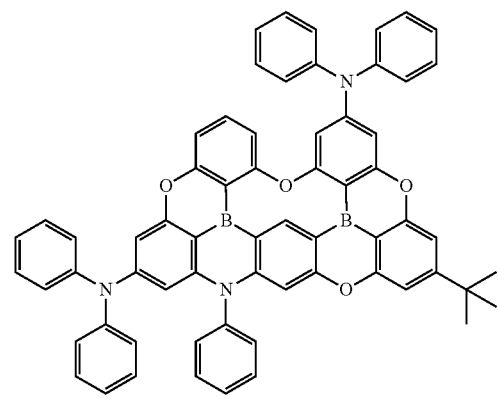
78
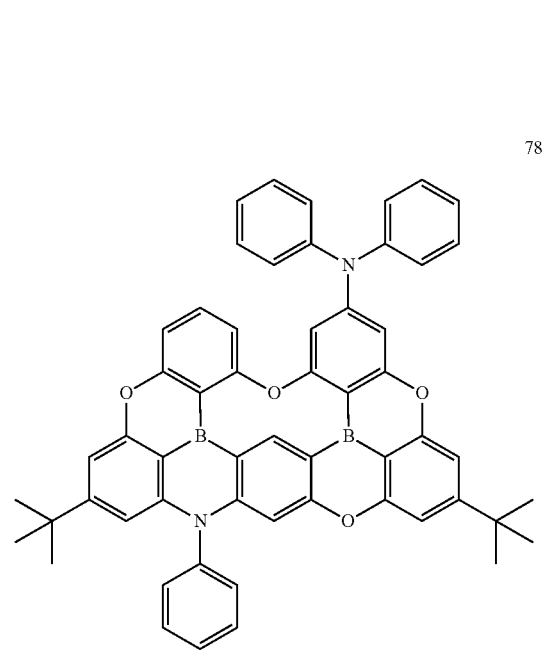
79
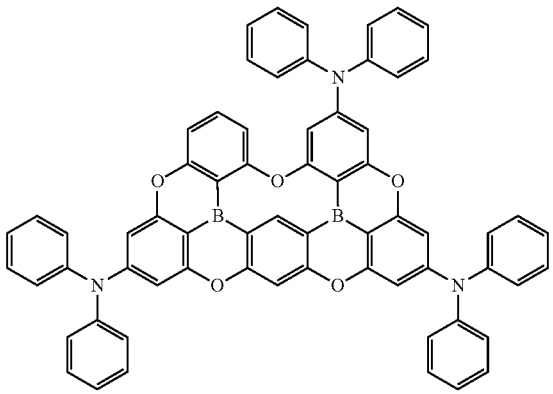
80
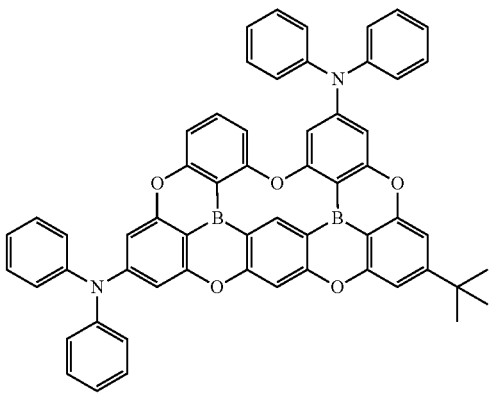
81
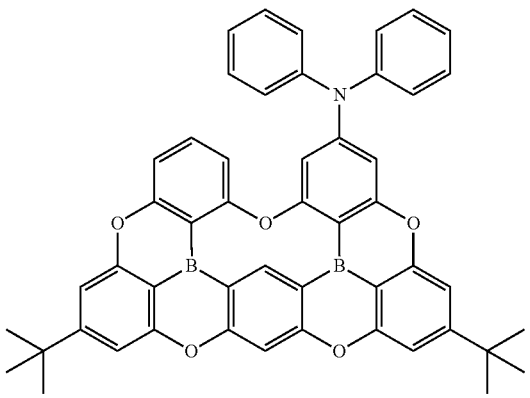
82
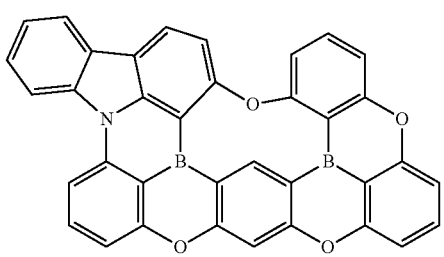

83
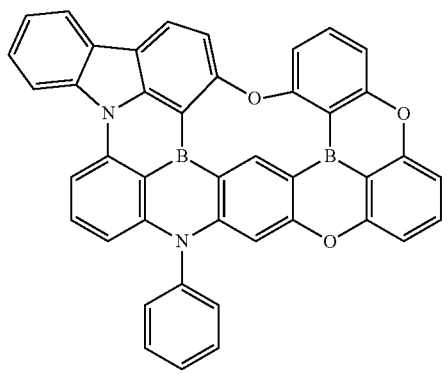
84
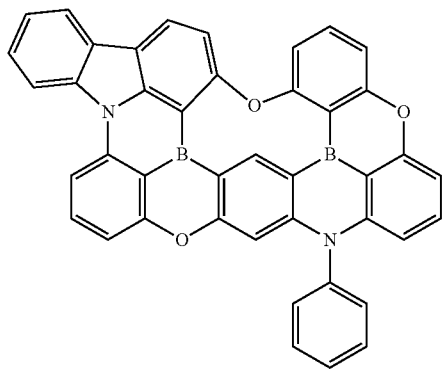
85
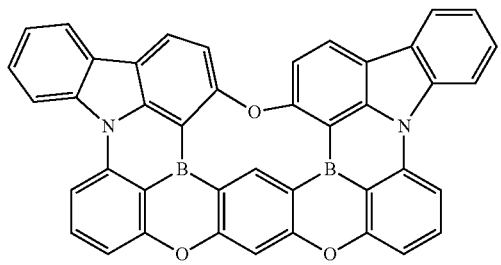
86
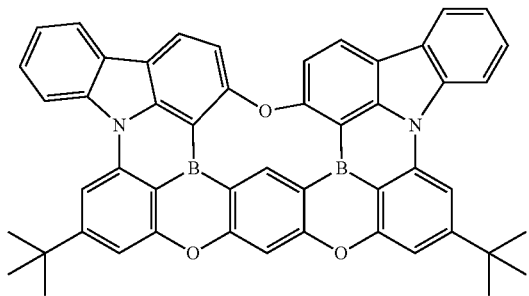
87
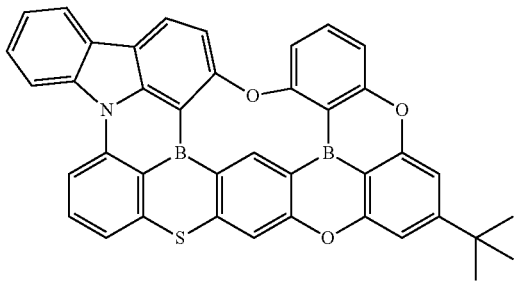
88
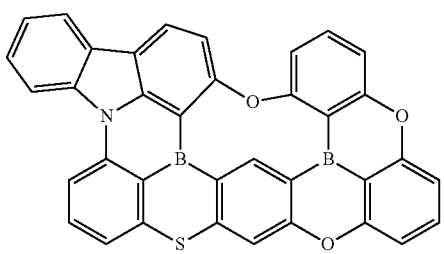
89
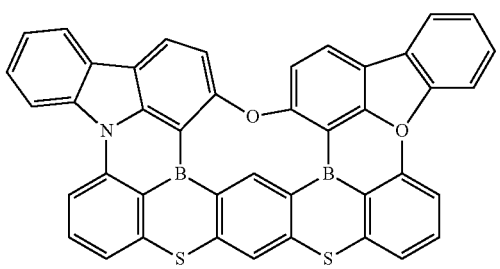
90
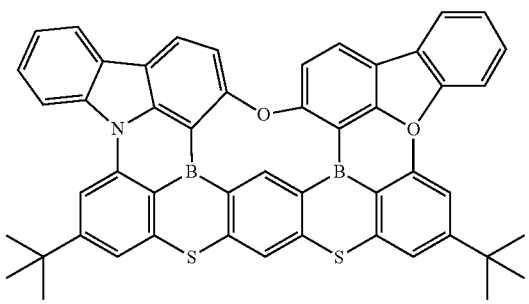
91
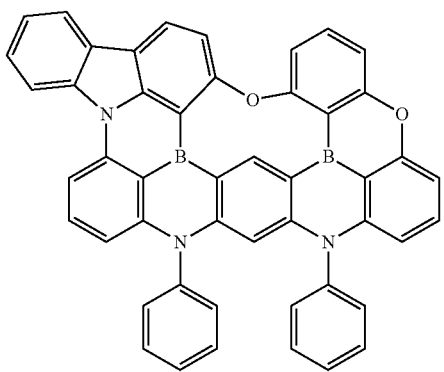

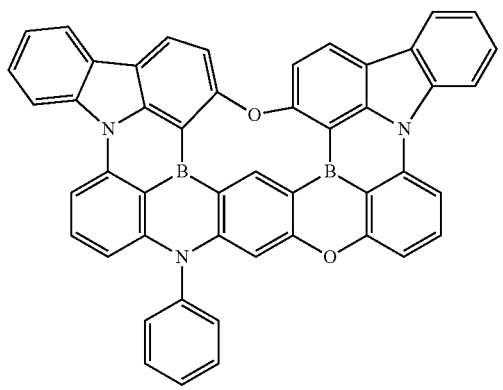

92

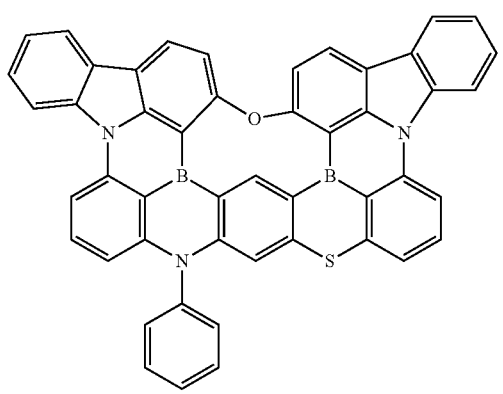

93

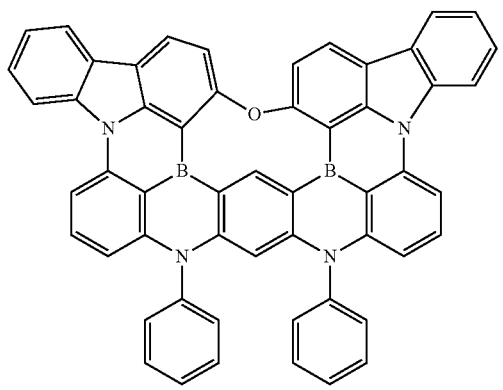

94

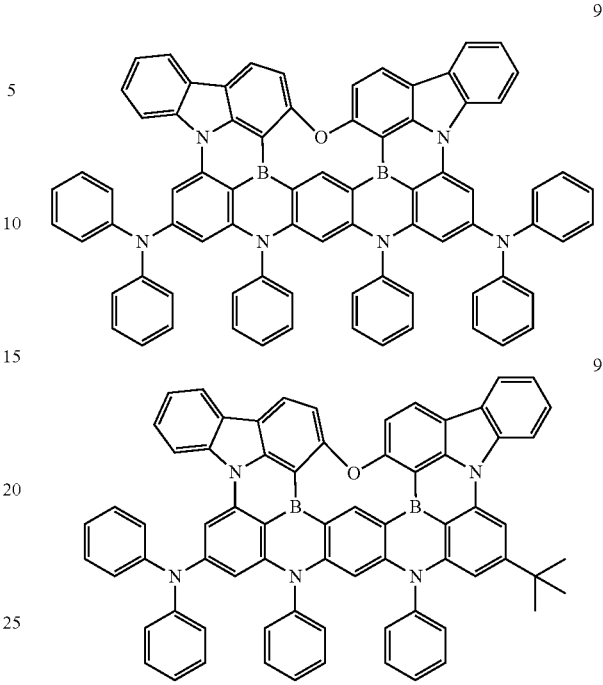

95

96

13. The light-emitting device of claim 1, wherein
the first electrode comprises an anode,
the second electrode comprises a cathode, and
the intermediate layer comprises: i) a hole transport region disposed between the first electrode and the emission layer and comprising a hole injection layer, a hole transport layer, an emission auxiliary layer, an electron blocking layer, or any combination thereof and ii) an electron transport region disposed between the emission layer and the second electrode and comprising a hole blocking layer, an electron transport layer, an electron injection layer, or any combination thereof.

14. The light-emitting device of claim 1, wherein the emission layer comprises the compound.

15. The light-emitting device of claim 1, wherein the emission layer comprises a fluorescent emission layer.

16. The light-emitting device of claim 1, wherein
the emission layer comprises a dopant, and
the dopant comprises the compound.

17. The light-emitting device of claim 16, wherein the compound comprises a delayed fluorescence dopant.

18. The light-emitting device of claim 1, wherein the emission layer comprises a blue emission layer.

19. An electronic apparatus comprising a thin-film transistor and the light-emitting device of claim 1,
wherein the thin-film transistor comprises a source electrode, a drain electrode, an activation layer, and a gate electrode, and
the first electrode of the light-emitting device is electrically connected to one of the source electrode or the drain electrode of the thin-film transistor.

* * * * *